(12) United States Patent
Widjaja

(10) Patent No.: US 10,249,368 B2
(45) Date of Patent: *Apr. 2, 2019

(54) SEMICONDUCTOR MEMORY HAVING BOTH VOLATILE AND NON-VOLATILE FUNCTIONALITY COMPRISING RESISTIVE CHANGE MATERIAL AND METHOD OF OPERATING

(71) Applicant: Zeno Semiconductor, Inc., Sunnyvale, CA (US)

(72) Inventor: Yuniarto Widjaja, Cupertino, CA (US)

(73) Assignee: Zeno Semiconductor, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/893,623

(22) Filed: Feb. 10, 2018

(65) Prior Publication Data

US 2018/0182460 A1   Jun. 28, 2018

Related U.S. Application Data

(63) Continuation of application No. 15/499,519, filed on Apr. 27, 2017, now Pat. No. 9,922,711, which is a
(Continued)

(51) Int. Cl.
*G11C 11/00* (2006.01)
*G11C 14/00* (2006.01)
(Continued)

(52) U.S. Cl.
CPC .......... *G11C 14/0045* (2013.01); *G11C 11/21* (2013.01); *G11C 11/404* (2013.01); *G11C 11/407* (2013.01); *G11C 11/4072* (2013.01); *G11C 13/00* (2013.01); *G11C 13/0004* (2013.01); *G11C 13/0007* (2013.01); *G11C 13/0069* (2013.01); *G11C 14/00* (2013.01); *G11C 14/009* (2013.01); *G11C 14/0027* (2013.01); *G11C 14/0036* (2013.01);
(Continued)

(58) Field of Classification Search
CPC ............ G11C 14/0045; G11C 13/0007; G11C 14/0027; G11C 14/0086
See application file for complete search history.

(56) References Cited

U.S. PATENT DOCUMENTS 4,300,212 A   11/1981   Simko
4,959,812 A   9/1990   Momodomi et al.
(Continued)

OTHER PUBLICATIONS

Ban et al., A Scaled Floating Body Cell (FBC) Memory with High-k+Metal Gate on Thin-Silicon and Thin-BOX for 16-nm Technology Node and Beyond, Symposium on VLSI Technology, 2008, pp. 92-93.
(Continued)

*Primary Examiner* — Pho M Luu
(74) *Attorney, Agent, or Firm* — Law office of Alan W. Cannon

(57) ABSTRACT

A semiconductor memory cell including a capacitorless transistor having a floating body configured to store data as charge therein when power is applied to the cell, and a non-volatile memory comprising a bipolar resistive change element, and methods of operating.

20 Claims, 72 Drawing Sheets

Related U.S. Application Data continuation of application No. 15/191,137, filed on Jun. 23, 2016, now Pat. No. 9,666,275, which is a continuation of application No. 14/680,268, filed on Apr. 7, 2015, now Pat. No. 9,401,206, which is a continuation of application No. 13/652,457, filed on Oct. 15, 2012, now Pat. No. 9,025,358.

(60) Provisional application No. 61/547,734, filed on Oct. 16, 2011, provisional application No. 61/546,571, filed on Oct. 13, 2011.

(51) Int. Cl.
*G11C 11/21* (2006.01)
*G11C 11/404* (2006.01)
*G11C 13/00* (2006.01)
*H01L 29/78* (2006.01)
*H01L 45/00* (2006.01)
*H01L 27/108* (2006.01)
*G11C 11/4072* (2006.01)
*H01L 27/24* (2006.01)
*G11C 11/407* (2006.01)

(52) U.S. Cl.
CPC .. *H01L 27/10802* (2013.01); *H01L 27/10879* (2013.01); *H01L 27/2436* (2013.01); *H01L 29/7841* (2013.01); *H01L 45/00* (2013.01); *H01L 45/06* (2013.01); *H01L 45/1233* (2013.01); *H01L 45/144* (2013.01); *H01L 45/146* (2013.01); *H01L 45/147* (2013.01); *G11C 2013/0073* (2013.01); *H01L 27/1085* (2013.01); *H01L 45/04* (2013.01)

(56) References Cited

U.S. PATENT DOCUMENTS

| | | |
|---|---|---|
| 5,365,477 A | 11/1994 | Cooper, Jr. et al. |
| 5,465,249 A | 11/1995 | Cooper, Jr. et al. |
| 5,519,831 A | 5/1996 | Holzhammer |
| 5,581,504 A | 12/1996 | Chang |
| 5,767,549 A | 6/1998 | Chen et al. |
| 5,999,444 A | 12/1999 | Fujiwara et al. |
| 6,005,818 A | 12/1999 | Ferrant et al. |
| 6,141,248 A | 10/2000 | Forbes et al. |
| 6,163,048 A | 12/2000 | Hirose et al. |
| 6,166,407 A | 12/2000 | Ohta |
| 6,277,689 B1 | 8/2001 | Wong |
| 6,341,087 B1 | 1/2002 | Kunikiyo et al. |
| 6,356,485 B1 | 3/2002 | Proebsting et al. |
| 6,376,876 B1 | 4/2002 | Shin et al. |
| 6,542,411 B2 | 4/2003 | Tanikawa et al. |
| 6,614,684 B1 | 9/2003 | Shukuri et al. |
| 6,661,042 B2 | 12/2003 | Hsu |
| 6,686,624 B2 | 2/2004 | Hsu |
| 6,724,657 B2 | 4/2004 | Shukuri et al. |
| 6,791,882 B2 | 9/2004 | Seki et al. |
| 6,801,452 B2 | 10/2004 | Miwa et al. |
| 6,835,979 B1 | 12/2004 | Liu et al. |
| 6,885,581 B2 | 4/2005 | Nemati et al. |
| 6,913,964 B2 | 7/2005 | Hsu |
| 6,925,006 B2 | 8/2005 | Fazan et al. |
| 6,954,377 B2 | 10/2005 | Choi et al. |
| 6,969,662 B2 | 11/2005 | Fazan et al. |
| 7,030,435 B2 | 4/2006 | Gnadinger |
| 7,085,156 B2 | 8/2006 | Ferrant et al. |
| 7,118,986 B2 | 10/2006 | Steigerwalt et al. |
| 7,170,807 B2 | 1/2007 | Fazan et al. |
| 7,224,019 B2 | 5/2007 | Hieda et al. |
| 7,259,420 B2 | 8/2007 | Anderson et al. |
| 7,259,992 B2 | 8/2007 | Shirota |
| 7,285,820 B2 | 10/2007 | Park et al. |
| 7,301,803 B2 | 11/2007 | Okhonin et al. |
| 7,324,366 B2 | 1/2008 | Bednorz et al. |
| 7,329,580 B2 | 2/2008 | Cho et al. |
| 7,376,006 B2 | 5/2008 | Bednorz et al. |
| 7,411,803 B1 * | 8/2008 | Lienau .............. G11C 11/18 365/100 |
| 7,440,333 B2 | 10/2008 | Hsia et al. |
| 7,447,068 B2 | 11/2008 | Tsai et al. |
| 7,450,423 B2 | 11/2008 | Lai et al. |
| 7,473,611 B2 | 1/2009 | Cho et al. |
| 7,504,302 B2 | 3/2009 | Mathew et al. |
| 7,541,636 B2 | 6/2009 | Ranica et al. |
| 7,542,345 B2 | 6/2009 | Okhonin et al. |
| 7,579,241 B2 | 8/2009 | Hieda et al. |
| 7,609,551 B2 | 10/2009 | Shino et al. |
| 7,622,761 B2 | 11/2009 | Park et al. |
| 7,701,763 B2 | 4/2010 | Roohparvar |
| 7,733,693 B2 | 6/2010 | Ferrant et al. |
| 7,759,715 B2 | 7/2010 | Bhattacharyya |
| 7,760,548 B2 | 7/2010 | Widjaja |
| 7,847,338 B2 | 12/2010 | Widjaja |
| 7,924,630 B2 | 4/2011 | Carman |
| 7,933,140 B2 | 4/2011 | Wang et al. |
| 7,948,790 B2 | 5/2011 | Tsukamoto |
| 7,974,117 B2 | 7/2011 | Tan et al. |
| 8,014,200 B2 | 9/2011 | Widjaja |
| 8,036,033 B2 | 10/2011 | Widjaja |
| 8,059,459 B2 | 11/2011 | Widjaja |
| 8,077,536 B2 | 12/2011 | Widjaja |
| 8,130,547 B2 | 3/2012 | Widjaja et al. |
| 8,130,548 B2 | 3/2012 | Widjaja et al. |
| 8,159,878 B2 | 4/2012 | Widjaja |
| 8,174,886 B2 | 5/2012 | Widjaja et al. |
| 8,194,451 B2 | 6/2012 | Widjaja |
| 8,208,302 B2 | 6/2012 | Widjaja et al. |
| 8,243,499 B2 | 8/2012 | Widjaja |
| 8,289,751 B2 | 10/2012 | Tian et al. |
| 8,294,193 B2 | 10/2012 | Widjaja |
| 8,331,130 B2 | 12/2012 | Yasuda et al. |
| 8,391,066 B2 | 3/2013 | Widjaja |
| 8,472,249 B2 | 6/2013 | Widjaja |
| 8,514,622 B2 | 8/2013 | Widjaja |
| 8,514,623 B2 | 8/2013 | Widjaja et al. |
| 8,531,881 B2 | 9/2013 | Widjaja |
| 8,559,257 B2 | 10/2013 | Widjaja |
| 8,570,803 B2 | 10/2013 | Widjaja |
| 8,582,359 B2 | 11/2013 | Widjaja |
| 8,654,583 B2 | 2/2014 | Widjaja |
| 8,687,403 B1 | 4/2014 | Derhacobian et al. |
| 8,711,622 B2 | 4/2014 | Widjaja |
| 8,767,458 B2 | 7/2014 | Widjaja |
| 8,787,085 B2 | 7/2014 | Widjaja |
| 8,837,247 B2 | 9/2014 | Widjaja |
| 8,923,052 B2 | 12/2014 | Widjaja |
| 8,934,296 B2 | 1/2015 | Widjaja |
| 8,937,834 B2 | 1/2015 | Widjaja et al. |
| 8,957,458 B2 | 2/2015 | Widjaja |
| 8,995,165 B2 | 3/2015 | Cai et al. |
| 8,995,186 B2 | 3/2015 | Widjaja |
| 9,001,581 B2 | 4/2015 | Widjaja |
| 9,019,747 B2 | 4/2015 | Tsuji |
| 9,025,358 B2 * | 5/2015 | Widjaja .............. G11C 11/4072 365/100 |
| 9,030,872 B2 | 5/2015 | Widjaja et al. |
| 9,087,580 B2 | 7/2015 | Widjaja |
| 9,153,309 B2 | 10/2015 | Widjaja et al. |
| 9,153,333 B2 | 10/2015 | Widjaja |
| 9,208,840 B2 | 12/2015 | Widjaja et al. |
| 9,209,188 B2 | 12/2015 | Widjaja |
| 9,230,965 B2 | 1/2016 | Widjaja |
| 9,236,382 B2 | 1/2016 | Widjaja et al. |
| 9,257,179 B2 | 2/2016 | Widjaja |
| 9,391,079 B2 | 7/2016 | Widjaja |
| 9,401,206 B2 * | 7/2016 | Widjaja .............. G11C 11/4072 |
| 9,455,262 B2 | 9/2016 | Widjaja |
| 9,460,790 B2 | 10/2016 | Widjaja |
| 9,484,082 B2 | 11/2016 | Widjaja |
| 9,490,012 B2 | 11/2016 | Widjaja |
| 9,514,803 B2 | 12/2016 | Widjaja et al. |
| 9,524,970 B2 | 12/2016 | Widjaja |

(56) References Cited

U.S. PATENT DOCUMENTS

| | | | |
|---|---|---|---|
| 9,589,963 B2 | 3/2017 | Widjaja | |
| 9,601,493 B2 | 3/2017 | Widjaja | |
| 9,614,080 B2 | 4/2017 | Widjaja | |
| 9,646,693 B2 | 5/2017 | Widjaja | |
| 9,653,467 B2 | 5/2017 | Widjaja et al. | |
| 9,666,275 B2* | 5/2017 | Widjaja | G11C 11/4072 |
| 9,679,648 B2 | 6/2017 | Widjaja | |
| 9,704,870 B2 | 7/2017 | Widjaja | |
| 9,711,718 B1* | 7/2017 | Bedau | H01L 45/1206 |
| 9,715,932 B2 | 7/2017 | Widjaja | |
| 9,747,983 B2 | 8/2017 | Widjaja | |
| 9,761,311 B2 | 9/2017 | Widjaja | |
| 9,761,589 B2 | 9/2017 | Widjaja | |
| 9,793,277 B2 | 10/2017 | Widjaja et al. | |
| 9,812,203 B2 | 11/2017 | Widjaja | |
| 9,812,456 B2 | 11/2017 | Widjaja | |
| 9,847,131 B2 | 12/2017 | Widjaja | |
| 9,922,711 B2* | 3/2018 | Widjaja | G11C 14/0045 |
| 9,922,981 B2 | 3/2018 | Widjaja | |
| 9,928,910 B2 | 3/2018 | Widjaja | |
| 2002/0018366 A1 | 2/2002 | Von Schwerin et al. | |
| 2002/0048193 A1 | 4/2002 | Tanikawa et al. | |
| 2005/0024968 A1 | 2/2005 | Lee et al. | |
| 2005/0032313 A1 | 2/2005 | Forbes | |
| 2005/0124120 A1 | 6/2005 | Du et al. | |
| 2006/0044915 A1 | 3/2006 | Park et al. | |
| 2006/0125010 A1 | 6/2006 | Bhattacharyya | |
| 2006/0157679 A1 | 7/2006 | Scheuerlein | |
| 2006/0227601 A1 | 10/2006 | Bhattacharyya | |
| 2006/0237770 A1 | 10/2006 | Huang et al. | |
| 2006/0278915 A1 | 12/2006 | Lee et al. | |
| 2007/0004149 A1 | 1/2007 | Tews | |
| 2007/0090443 A1 | 4/2007 | Choi et al. | |
| 2007/0164351 A1 | 7/2007 | Hamamoto | |
| 2007/0164352 A1 | 7/2007 | Padilla | |
| 2007/0210338 A1 | 9/2007 | Orlowski | |
| 2007/0215954 A1 | 9/2007 | Mouli | |
| 2007/0274125 A1 | 11/2007 | Bednorz et al. | |
| 2007/0284648 A1 | 12/2007 | Park et al. | |
| 2008/0048239 A1 | 2/2008 | Huo et al. | |
| 2008/0080248 A1 | 4/2008 | Lue et al. | |
| 2008/0123418 A1 | 5/2008 | Widjaja | |
| 2008/0224202 A1 | 9/2008 | Young et al. | |
| 2008/0265305 A1 | 10/2008 | He et al. | |
| 2008/0303079 A1 | 12/2008 | Cho et al. | |
| 2009/0034320 A1 | 2/2009 | Ueda | |
| 2009/0065853 A1 | 3/2009 | Hanafi | |
| 2009/0081835 A1 | 3/2009 | Kim et al. | |
| 2009/0085089 A1 | 4/2009 | Chang et al. | |
| 2009/0108322 A1 | 4/2009 | Widjaja | |
| 2009/0108351 A1 | 4/2009 | Yang et al. | |
| 2009/0109750 A1 | 4/2009 | Widjaja | |
| 2009/0173985 A1 | 7/2009 | Lee et al. | |
| 2009/0190402 A1 | 7/2009 | Hsu et al. | |
| 2009/0251966 A1 | 10/2009 | Widjaja | |
| 2009/0316492 A1 | 12/2009 | Widjaja | |
| 2010/0008139 A1 | 1/2010 | Bae | |
| 2010/0034041 A1 | 2/2010 | Widjaja | |
| 2010/0046287 A1 | 2/2010 | Widjaja | |
| 2010/0246277 A1 | 9/2010 | Widjaja | |
| 2010/0246284 A1 | 9/2010 | Widjaja | |
| 2011/0032756 A1 | 2/2011 | Widjaja | |
| 2011/0042736 A1 | 2/2011 | Widjaja | |
| 2011/0044110 A1 | 2/2011 | Widjaja | |
| 2011/0228591 A1 | 9/2011 | Widjaja | |
| 2011/0305085 A1 | 12/2011 | Widjaja | |
| 2012/0012915 A1 | 1/2012 | Widjaja et al. | |
| 2012/0014180 A1 | 1/2012 | Widjaja | |
| 2012/0014188 A1 | 1/2012 | Widjaja et al. | |
| 2012/0069652 A1 | 3/2012 | Widjaja | |
| 2012/0106234 A1 | 5/2012 | Widjaja | |
| 2012/0113712 A1 | 5/2012 | Widjaja | |
| 2012/0120752 A1 | 5/2012 | Widjaja | |
| 2012/0217549 A1 | 8/2012 | Widjaja | |
| 2012/0230123 A1 | 9/2012 | Widjaja et al. | |
| 2013/0015517 A1 | 1/2013 | Widjaja et al. | |
| 2013/0148422 A1 | 6/2013 | Widjaja | |
| 2013/0250685 A1 | 9/2013 | Widjaja | |
| 2013/0292635 A1 | 11/2013 | Widjaja | |
| 2013/0301349 A1 | 11/2013 | Widjaja | |
| 2014/0021549 A1 | 1/2014 | Widjaja | |
| 2014/0159156 A1 | 6/2014 | Widjaja | |
| 2014/0160868 A1 | 6/2014 | Widjaja et al. | |
| 2014/0332899 A1 | 11/2014 | Widjaja | |
| 2014/0340972 A1 | 11/2014 | Widjaja et al. | |
| 2014/0355343 A1 | 12/2014 | Widjaja | |
| 2015/0092486 A1 | 4/2015 | Widjaja | |
| 2015/0109860 A1 | 4/2015 | Widjaja | |
| 2015/0155284 A1 | 6/2015 | Widjaja | |
| 2015/0170743 A1 | 6/2015 | Widjaja | |
| 2015/0187776 A1 | 7/2015 | Widjaja | |
| 2015/0213892 A1 | 7/2015 | Widjaja | |
| 2015/0221650 A1 | 8/2015 | Widjaja et al. | |
| 2015/0310917 A1 | 10/2015 | Widjaja | |
| 2015/0371707 A1 | 12/2015 | Widjaja | |
| 2016/0005741 A1 | 1/2016 | Widjaja | |
| 2016/0005750 A1 | 1/2016 | Widjaja | |
| 2016/0078921 A1 | 3/2016 | Widjaja et al. | |
| 2016/0086655 A1 | 3/2016 | Widjaja | |
| 2016/0111158 A1 | 4/2016 | Widjaja | |
| 2016/0300613 A1 | 10/2016 | Widjaja | |
| 2016/0300841 A1 | 10/2016 | Widjaja | |
| 2016/0365444 A1 | 12/2016 | Widjaja | |
| 2017/0025534 A1 | 1/2017 | Widjaja | |
| 2017/0032842 A1 | 2/2017 | Widjaja | |
| 2017/0040326 A1 | 2/2017 | Widjaja | |
| 2017/0053919 A1 | 2/2017 | Widjaja et al. | |
| 2017/0092648 A1 | 3/2017 | Widjaja | |
| 2017/0133091 A1 | 5/2017 | Widjaja | |
| 2017/0133382 A1 | 5/2017 | Widjaja | |
| 2017/0154888 A1 | 6/2017 | Widjaja | |
| 2017/0169887 A1 | 6/2017 | Widjaja | |
| 2017/0213593 A1 | 7/2017 | Widjaja | |
| 2017/0221900 A1 | 8/2017 | Widjaja et al. | |
| 2017/0229178 A1 | 8/2017 | Widjaja | |
| 2017/0271339 A1 | 9/2017 | Widjaja | |
| 2017/0294230 A1 | 10/2017 | Widjaja | |
| 2017/0365340 A1 | 12/2017 | Widjaja | |
| 2017/0365607 A1 | 12/2017 | Widjaja | |
| 2018/0012893 A1 | 1/2018 | Widjaja et al. | |
| 2018/0025780 A1 | 1/2018 | Widjaja | |
| 2018/0047731 A1 | 2/2018 | Widjaja | |
| 2018/0075907 A1 | 3/2018 | Widjaja | |

OTHER PUBLICATIONS

Campardo G. et al., VLSI Design of Non-Volatile Memories, 2005.
Han et al. Programming/Erasing Characteristics of 45 nm NOR-Type Flash Memory Based on SOI FinFET Structure. vol. 47, Nov. 2005, pp. S564-S567.
Headland. Hot electron injection, Feb. 19, 2004.
Lanyon, et al., "Bandgap Narrowing in Moderately to Heavily Doped Silicon", pp. 1014-1018, No. 7, vol. ED-26, 1979.
Lin, et al., A new 1T DRAM Cell with enhanced Floating Body Effect, pp. 1-5, 2006.
Oh, et al., a 4-Bit Double SONOS memory (DSM) with 4 Storage Nodes Per Cell for Ultimate Multi-Bit Operation, pp. 1-2, 2006.
Ohsawa et al., An 18.5ns 128Mb SOI DRAM with a Floating body Cell, IEEE International Solid-State Circuits Conference, 2005, pp. 458-459, 609.
Ohsawa, et al. Autonomous refresh of floating body cell (FBC), 2008, pp. 801-804.
Ohsawa, et al. Autonomous refresh of floating-body cell due to current Anomaly of Impact Ionization, 2009, pp. 2302-2311.
Ohsawa et al., Memory Design Using One-Transistor Gain Cell on SOI, Tech. Digest, IEEE International Solid-State Circuits, vol. 37, No. 11, 2002, pp. 1510-1522.
Ohsawa, et al, "A Novel Capacitor-less DRAM Cell: Floating Body Cell", CRC Press, Taylor & Francis Group, 2012, pp. 1-7.
Okhonin, et al. A Capicitor-Less It-DRAM Cell, vol. 23, No. 2, Feb. 2002, pp. 85-87.

(56) References Cited

OTHER PUBLICATIONS

Okhonin et al. A SOI Capacitor-less 1T-DRAM Concept. 2001, pp. 153-154.
Okhonin, et al., Principles of Transient Charge Pumping on Partially Depleted SOI MOSFETs, IEEE Electron Device Letters, vol. 23, No. 5, May 2002, pp. 279-281.
Rodriguez, et al. "A-RAM: Novel capacitor-less DRAM memory." In SOI Conference, 2009 IEEE International, pp. 1-2. IEEE, 2009.
Rodriguez, et al. "Novel capacitorless 1T-DRAM cell for 22-nm node compatible with bulk and SOI substrates." Electron Devices, IEEE Transactions on, vol. 58, No. 8 (2011), pp. 2371-2377.
Rodriguez, et al. "A-RAM memory cell: concept and operation." Electron Device Letters, IEEE, vol. 31, No. 9 (2010), pp. 972-974.
Robert F. Pierret. Semiconductor Device Fundamentals, ISBN: 0-201-54393-1, 1996, by Addison-Wesley Publishing Company, Inc. PNPN Devices 463-476.
Romanjek, et al., "Compact (Wg/Lg=80/85nm) FDSOI 1T-DRAM programmed by Meta Stable Dip", Ultimate Integration on Silicon (ULIS), 2012 13th International Conference on, Mar. 6, 2012, pp. 199-202.
Rothemund, et al., The importance of being modular, vol. 485, May 2012 pp. 584-585.
Sakui, Koji, et al. "A new static memory cell based on reverse base current (RBC) effect of bipolar transistor." Electron Devices Meeting, 1988. IEDM'88. Technical Digest., International. IEEE, 1988, pp. 44-47.
Sakui, K., et al. "A new static memory cell based on the reverse base current effect of bipolar transistors." Electron Devices, IEEE Transactions on 36.6 (1989): 1215-1217.
Shim, Kyung-Suk, In-Young Chung, and Young June Park. "A BJT-Based Heterostructure 1T-DRAM for Low-Voltage Operation." Electron Device Letters, vol. 33, No. 1, 2012, pp. 14-16.
Shin, et al. "Vertical-Gate Si/SiGe Double-HBT-Based Capacitorless 1T DRAM Cell for Extended Retention Time at Low Latch Voltage." Electron Device Letters, vol. 33, No. 2, 2012, pp. 134-136.
Shin, et al. "A novel double HBT-based capacitorless 1T DRAM cell with Si/SiGe heterojunctions." Electron Device Letters, vol. 32, No. 7, 2011, pp. 850-852.
Sze, et al. Physics of Semiconductor Devices, 2007, pp. 1-4.
Tack, et al. "The multistable charge-controlled memory effect in SOI MOS transistors at low temperatures." Electron Devices, IEEE Transactions on 37.5 (1990): 1373-1382.
Terada, et al. "A new VLSI memory cell using capacitance coupling (CC cell)." Electron Devices, IEEE Transactions on 31.9 (1984): pp. 319-1324.
Ventrice, et al. "Analytical model of deeply-scaled thyristors for memory applications." Microelectronics and Electron Devices (WMED), 2012 IEEE Workshop on. IEEE, 2012, pp. 1-4.
Villaret, et al. "Further insight into the physics and modeling of floating-body capacitorless DRAMs." Electron Devices, IEEE Transactions on 52.11 (2005): pp. 2447-2454.
Waser, Rainer, Resistive non-volatile memory devices (Invited Paper), 2009, pp. 1925-1928.
Wu, et al. "Experimental Demonstration of the High-Performance Floating-Body/Gate DRAM Cell for Embedded Memories", IEEE Elec. Dev. Letter, vol. 33, No. 6, Jun. 2012, pp. 743-745.
Yoshida et al., A Design of a Capacitorless 1T-DRAM Cell Using Gate-Induced Drain Leakage (GIDL) Current for Low-power and High-speed Embedded Memory , International Electron Devices Meeting, 2003, pp. 1-4.
Zhang, et al. "Total Ionizing Dose Effects on FinFET-Based Capacitor-Less 1T-DRAMs." Nuclear Science, IEEE Transactions on, vol. 57, No. 6, 2010, pp. 3298-3304.
Villaret et al., "Mechanisms of charge modulation in the floating body of triple-well nMOSFET capacitor-less DRAMs", Microelectronic Engineering 72 (2004) 434-439.
Almeida, et al., "Comparison between low and high read bias in FB-RAM on UTBOX FDSOI devices", Ultimate Integration on Silicon (ULIS), 2012 13th International Conference on, Mar. 6, 2012, pp. 61-64.
Andrade, et al., "The Impact of Back Bias on the Floating Body Effect in UTBOX SOI Devices for 1T-FBRAM Memory Applications", Devices, Circuits and Systems (ICCDCS), 2012 8th International Caribbean Conference on. IEEE, 2012, pp. 1-4.
Aoulaiche, et al. "Junction Field Effect on the Retention Time for One-Transistor Floating-Body RAM." Electron Devices, IEEE Transactions on, vol. 59, No. 8, 2012, pp. 2167-2172.
Aoulaiche, et al. "Hot hole induced damage in 1T-FBRAM on bulk FinFET." Reliability Physics Symposium (IRPS), 2011 IEEE International. IEEE, 2011, pp. 99-104.
Avci, et al. "Floating-Body Diode—A Novel DRAM Device." Electron Device Letters, IEEE, vol. 33, No. 2, 2012, pp. 161-163.
Bawedin, et al., "Floating-Body SOI Memory: Concepts, Physics, and Challenges", ECS Transactions 19.4 (2009), pp. 243-256.
Ban, et al. "Integration of Back-Gate doping for 15-nm node floating body cell (FBC) memory." VLSI Technology (VLSIT), 2010 Symposium on. IEEE, 2010, pp. 159-160.
Cho, et al. "Variation-aware study of BJT-based capacitorless DRAM cell scaling limit." Silicon Nanoelectronics Workshop (SNW), 2012 IEEE. IEEE, 2012, pp. 1-2.
Cho, et al. "Variation Study and Implications for BJT-Based Thin-Body Capacitorless DRAM." Electron Device Letters, IEEE, vol. 33, No. 3, 2012, pp. 312-314.
Chiu, et al. "Characteristics of a new trench-oxide thin-film transistor and its 1T-DRAM applications." Solid-State and Integrated Circuit Technology (ICSICT), 2010 10th IEEE International Conference on. IEEE, 2010, pp. 1106-1108.
Chiu, et al. "A simple process of thin-film transistor using the trench-oxide layer for improving 1T-DRAM performance." Next-Generation Electronics (ISNE), 2010 International Symposium on. IEEE, 2010, pp. 254-257.
Chun, et al. "A 1.1 V, 667MHz random cycle, asymmetric 2T gain cell embedded DRAM with a 99.9 percentile retention time of 110μsec." VLSI Circuits (VLSIC), 2010 IEEE Symposium on. IEEE, 2010, pp. 191-192.
Chun, et al. "A 667 MHz Logic-Compatible Embedded DRAM Featuring an Asymmetric 2T Gain Cell for High Speed On-Die Caches." Solid-State Circuits, IEEE Journal of, vol. 47, No. 2, 2012, pp. 547-559.
Cao, et al. "A Novel 1T-1D DRAM Cell for Embedded Application." Electron Devices, IEEE Transactions on, vol. 59, No. 5, 2012, pp. 1304-1310.
Collaert, et al. "Substrate bias dependency of sense margin and retention in bulk FinFET 1T-DRAM cells." Solid-State Electronics 65 (2011, pp. 205-210.
Collaert, et al. "A low-voltage biasing scheme for aggressively scaled bulk FinFET 1T-DRAM featuring 10s retention at 85 C." VLSI Technology (VLSIT), 2010 Symposium on. IEEE, 2010, pp. 161-162.
Chatterjee, et al. "Taper isolated dynamic gain RAM cell." Electron Devices Meeting, 1978 International. vol. 24. IEEE, 1978, pp. 698-699.
Chatterjee, et al. Circuit Optimization of the Paper Isolated Dynamic Gain RAM Cell for VLSI Memories, pp. 22-23, 1979.
Chatterjee, et al. "A survey of high-density dynamic RAM cell concepts." Electron Devices, IEEE Transactions on 26.6 (1979): 827-839.
Erb, D. "Stratified charge memory." Solid-State Circuits Conference. Digest of Technical Papers. 1978 IEEE International. vol. 21. IEEE, 1978, pp. 24-25.
Galeti, M., et al. "BJT effect analysis in p-and n-SOI MuGFETs with high-k gate dielectrics and TiN metal gate electrode for a 1T-DRAM application." SOI Conference (SOI), 2011 IEEE International. IEEE, 2011, pp. 1-2.
Gamiz, et al. "3D Trigate 1T-DRAM Memory Cell for 2x nm Nodes." Memory Workshop (IMW), 2012 4th IEEE International. IEEE, 2012, pp. 1-4.

(56) References Cited

OTHER PUBLICATIONS

Gamiz, et al. "A 20nm low-power triple-gate multibody 1T-DRAM cell." VLSI Technology, Systems, and Applications (VLSI-TSA), 2012 International Symposium on. IEEE, 2012, pp. 1-2.

Giusi, et al. "Bipolar mode operation and scalability of double-gate capacitorless 1T-DRAM cells." Electron Devices, IEEE Transactions on, vol. 57, No. 8 (2010), pp. 1743-1750.

Gupta, et al. "32nm high-density high-speed T-RAM embedded memory technology." Electron Devices Meeting (IEDM), 2010 IEEE International. IEEE, 2010, pp. 12-1.

Han, et al. "Bistable resistor (biristor)-gateless silicon nanowire memory." VLSI Technology (VLSIT), 2010 Symposium on. IEEE, 2010, pp. 171-172.

Han, et al. "Biristor—Bistable resistor based on a silicon nanowire." Electron Device Letters, IEEE 31.8 (2010): 797-799.

Hubert, et al., "Experimental comparison of programming mechanisms in 1T-DRAM cells with variable channel length", Solid-State Device Research Conference (ESSDERC), 2010 Proceedings of the European, pp. 150-153, Sep. 14-16, 2010.

Hwang, et al. "Offset buried metal gate vertical floating body memory technology with excellent retention time for DRAM application." VLSI Technology (VLSIT), 2011 Symposium on. IEEE, 2011, pp. 172-173.

Kim, et al. "Vertical double gate Z-RAM technology with remarkable low voltage operation for DRAM application." VLSI Technology (VLSIT), 2010 Symposium on, 2010, pp. 163-164.

Kim, et al. "Silicon on replacement insulator (SRI) floating body cell (FBC) memory." VLSI Technology (VLSIT), 2010 Symposium on. IEEE, 2010, pp. 165-166.

Kim, et al. "Optical charge-pumping: A universal trap characterization technique for nanoscale floating body devices." VLSI Technology (VLSIT), 2011 Symposium on. IEEE, 2011, pp. 190-191.

Kim, et al. "Investigation of 1T DRAM cell with non-overlap structure and recessed channel." Silicon Nanoelectronics Workshop (SNW), 2010. IEEE, 2010, pp. 1-2.

Kim, et al. Resistive-Memory Embedded Unified RAM (R-URAM, 2009, pp. 2670-2674.

Lu, et al., "A Floating-Body/Gate DRAM Cell Upgraded for Long Retention Time", IEEE Elec. Dev. Letters, vol. 32, No. 3, pp. 731-733, Jun. 2011.

Lu, et al., "A Simplified Superior Floating-Body/Gate DRAM Cell", IEEE Elec. Dev. Letters, vol. 30, No. 3, Mar. 2009, pp. 282-284.

Lee, et al. "A Novel Capacitorless 1T DRAM Cell for Data Retention Time Improvement." Nanotechnology, IEEE Transactions on, vol. 10, No. 3, 2011, pp. 462-466.

Leiss et al, "dRAM Design Using the Taper-Isolated Dynamic RAM Cell." Solid-State Circuits, IEEE Journal of 17.2 (1982): 337-344.

Liu, Xuelian, et al. "A three-dimensional DRAM using floating body cell in FDSOI devices." Design and Diagnostics of Electronic Circuits & Systems (DDECS), 2012 IEEE 15th International Symposium on. IEEE, 2012, pp. 159-162.

Mahatme, et al. "Total ionizing dose effects on ultra thin buried oxide floating body memories." Reliability Physics Symposium (IRPS), 2012 IEEE International, 2012, pp. 1-5.

Moon, et al. "An optically assisted program method for capacitorless 1T-DRAM." Electron Devices, IEEE Transactions on, vol. 57, No. 7, 2010, pp. 1714-1718.

Moon, et al. "Multi-functional universal device using a band-engineered vertical structure." Electron Devices Meeting (IEDM), 2011 IEEE International. IEEE, 2011, pp. 24-26.

Moon, et al. "Fin-width dependence of BJT-based 1T-DRAM implemented on FinFET." Electron Device Letters, vol. 31, No. 9 (2010): 909-911.

Moon, et al. "Ultimately scaled 20nm unified-RAM." Electron Devices Meeting (IEDM), 2010 IEEE International. IEEE, 2010, pp. 12-2.

Nicoletti, et al. "The Dependence of Retention Time on Gate Length in UTBOX FBRAM With Different Source/Drain Junction Engineering." Electron Device Letters, vol. 33, No. 7, 2012, pp. 940-942.

Pulicani, R., et al. "Simulation of intrinsic bipolar transistor mechanisms for future capacitor-less eDRAM on bulk substrate." Electronics, Circuits, and Systems (ICECS), 2010 17th IEEE International Conference on. IEEE, 2010, pp. 966-969.

Pellizzer et al., A 90nm Phase Change Memory Technology for Stand-Alone Non-Volatile Memory Applications, pp. 1-1, 2006.

Ranica, et al. "A one transistor cell on bulk substrate (1T-Bulk) for low-cost and high density eDRAM." VLSI Technology, 2004. Digest of Technical Papers. 2004 Symposium on. IEEE, 2004, pp. 128-129.

Ranica et al. Scaled 1T-Bulk devices built with CMOS 90nm technology for low-cost eDRAM applications. Pascale. mazoyer©st. com, 2005, 38-39.

Reisch, "On bistable behavior and open-base breakdown of bipolar transistors in the avalanche regime-modeling and applications." Electron Devices, IEEE Transactions on 39.6 (1992): 1398-1409.

\* cited by examiner

Floating Body 24 is positively charged and V(BL 18) = 0.0V

FB is neutrally charged: and V(BL 18) = V(FB 24) = 0V

SEMICONDUCTOR MEMORY HAVING BOTH VOLATILE AND NON-VOLATILE FUNCTIONALITY COMPRISING RESISTIVE CHANGE MATERIAL AND METHOD OF OPERATING

CROSS-REFERENCE

This application is a continuation of application Ser. No. 15/499,519 filed Apr. 27, 2017, now U.S. Pat. No. 9,922,711, issued on Mar. 20, 2018, which is a continuation of application Ser. No. 15/191,137 filed Jun. 23, 2016, now U.S. Pat. No. 9,666,275, issued on May 30, 2017, which is a continuation of application Ser. No. 14/680,268 filed Apr. 7, 2015, now U.S. Pat. No. 9,401,206, issued on Jul. 26, 2016, which is a continuation of application Ser. No. 13/652,457 filed Oct. 15, 2012, now U.S. Pat. No. 9,025,358, issued on May 5, 2015. Application Ser. No. 13/652,457 claims the benefit of U.S. Provisional Application No. 61/546,571, filed Oct. 13, 2011 and titled "A Semiconductor Memory Having Both Volatile and Non-Volatile Functionality Comprising Resistive Change Material and Method of Operating". Application Ser. Nos. 15/499,519; 15/191,137; 14/680,268 and 13/652,457; U.S. Pat. Nos. 9,401,206 and 9,025,358; and Provisional Application No. 61/546,571 are hereby incorporated herein, in their entireties, by reference thereto, and to which applications and patents we claim priority.

Application Ser. No. 13/652,457 claims the benefit of U.S. Provisional Application No. 61/547,734, filed Oct. 16, 2011 and titled "A Semiconductor Memory Having An Electrically Floating Body and Method of Operating", which application is hereby incorporated herein, in its entirety, by reference thereto, and to which application we claim priority.

FIELD OF THE INVENTION

The present invention relates to semiconductor memory technology. More specifically, the present invention relates to semiconductor memory having both volatile and non-volatile functionality.

BACKGROUND OF THE INVENTION

Semiconductor memory devices are used extensively to store data. Memory devices can be characterized according to two general types: volatile and non-volatile. Volatile memory devices such as static random access memory (SRAM) and dynamic random access memory (DRAM) lose data that is stored therein when power is not continuously supplied thereto.

Non-volatile memory devices, such as flash erasable programmable read only memory (Flash EPROM) devices, retain stored data even in the absence of power supplied thereto. Unfortunately, non-volatile memory devices typically operate more slowly than volatile memory devices. For example, a Flash EPROM device write access time is in the range of microseconds to milliseconds, while the SRAM or DRAM write access time is in the range of picoseconds to nanoseconds.

Accordingly, it would be desirable to provide a universal type memory device that includes the advantages of both volatile and non-volatile memory devices, i.e., fast operation on par with volatile memories, while having the ability to retain stored data when power is discontinued to the memory device.

It would further be desirable to provide such a universal type memory device having a size that is not prohibitively larger than comparable volatile or non-volatile devices.

SUMMARY OF THE INVENTION

A purpose of the invention is to provide a semiconductor memory having both volatile and non-volatile functionality, which comprises resistive change material. Examples of resistive change material includes bipolar resistive memory element, such as transition metal oxides, ferroelectric, and ferromagnetic materials.

In at least one embodiment, the memory cell device comprises: a substrate of first conductivity type; a buried layer at a bottom portion of the substrate, having a second conductivity type; a first region embedded in the substrate at a first location of the substrate and having a second conductivity type; a second region embedded in the substrate at a second location the substrate and have the second conductivity type; a gate positioned in between the first and second locations and above a surface of the substrate and insulated from the surface by an insulating layer; and a resistive change material deposited above the region having a second conductivity type.

In one aspect of the present invention, a method of operating a memory cell according to the present invention is provided. In addition, applications of the memory cell, for example as a means to save power in memory device, are described.

In one aspect of the present invention, a semiconductor memory cell is provided that includes: a capacitorless transistor having a floating body configured to store data as charge therein when power is applied to the cell; and a non-volatile memory comprising a bipolar resistive change element.

In at least one embodiment, the bipolar resistive change element is configured to store the data stored in the floating body upon transfer thereto.

In at least one embodiment, the bipolar resistive change element comprises a material selected from at least one of: transition metal oxide materials, ferroelectric materials and ferromagnetic materials.

In at least one embodiment, the bipolar resistive change element is electrically connected to the capacitorless transistor and a distance between the bipolar resistive change element and the capacitorless transistor, when electrically connected, is in the range from about 90 nm to 1 μm.

In at least one embodiment, the floating body has a first conductivity type selected from n-type conductivity type and p-type conductivity type; the memory cell further comprising first and second regions at first and second locations of the cell, the first and second regions each having a second conductivity type selected from n-type conductivity type and p-type conductivity type and being different from the first conductivity type; wherein the bipolar resistive change element comprises an electrode and a bipolar resistive change material electrically connected to one of the first and second regions.

In at least one embodiment, the bipolar resistive change element is electrically connected to one of the first and second regions via a conductive element.

In at least one embodiment, the cell further includes an addressable line electrically connected to the bipolar resistive change element.

In at least one embodiment, the bipolar resistive change element further comprises a conductive material element interconnecting the addressable line and the bipolar resistive change material.

In at least one embodiment, the semiconductor memory cell further includes a substrate being made of a material having a second conductivity type selected from p-type conductivity type and n-type conductivity type; a first region having a second conductivity type selected from p-type and n-type conductivity types, the second conductivity type being different from the first conductivity type; a second region having the second conductivity type, the second region being spaced apart from the first region; and a buried layer in the substrate below the first and second regions, spaced apart from the first and second regions and having the second conductivity type; wherein the floating body is formed between the first and second regions and the buried layer, the floating body region having the first conductivity type; and wherein the non-volatile memory is electrically connected to one of the first and second regions.

In at least one embodiment, the floating body has a first conductivity type selected from p-type conductivity type and n-type conductivity type, the memory cell further comprising: a substrate being made of a material having a second conductivity type selected from p-type conductivity type and n-type conductivity type, the second conductivity type being different from the first conductivity type; a well in the substrate, the well having the first conductivity type; a first region having the second conductivity type; a second region having the second conductivity type, the second region being spaced apart from the first region; and a buried layer located between the well and the first and second regions, spaced apart from the first and second regions and having the second conductivity type; wherein the floating body is formed between the first and second regions and the buried layer; and wherein the non-volatile memory is electrically connected to one of the first and second regions.

In at least one embodiment, the substrate is a well formed in a second substrate.

In at least one embodiment, the cell has a three-dimensional structure comprising a fin structure extending substantially perpendicular to, and above a top surface of a substrate.

In at least one embodiment, a semiconductor memory array is provided comprising a plurality of semiconductor memory cell as described above, arranged in a matrix of at least one row and at least one column.

In at least one embodiment, an integrated circuit device is provided that comprises the semiconductor memory array, as described above, and circuitry configured to determine whether the semiconductor memory array, or a portion of the semiconductor memory array, has been idle for a time period equal to or greater than a predetermined time period.

In at least one embodiment, the floating body comprises a bipolar memory device.

In another aspect of the present invention, a semiconductor memory cell is provided that comprises: a silicon controlled rectifier device configured to store data when power is applied to the cell; and a non-volatile memory comprising a bipolar resistance change element.

In another aspect of the present invention, a method of operating semiconductor memory to function as volatile memory, while having the ability to retain stored data when power is discontinued to the semiconductor memory, as provided, the method including: storing data in a capacitorless transistor having a floating body configured to store data as charge therein when power is applied to the memory, wherein the floating body operates as a capacitorless DRAM cell or a bi-stable SRAM cell; and storing data in a bipolar resistance change element by configuring the bipolar resistance change element in one of a low resistivity state or a high resistivity state, wherein each of the resistivity states corresponds to a different data value, respectively.

In at least one embodiment, the method further includes restoring the data from the bipolar non-volatile memory to the floating body as volatile memory.

In at least one embodiment, the restoring comprises evacuating holes from the volatile memory when the bipolar non-volatile memory is in a low resistance state, but maintaining a presently existing charge in the volatile memory when the bipolar non-volatile memory is in a high resistance state.

In at least one embodiment, the restoring and maintaining are performed non-algorithmically.

In at least one embodiment, the method further includes, after restoring or maintaining data stored in the floating body, resetting the bipolar non-volatile memory to a predetermined resistivity state.

In at least one embodiment, the bipolar non-volatile memory comprises a bipolar resistive change element.

In another aspect of the present invention, a reference cell for comparing a potential stored in the reference cell to a reference potential value is provided, the reference cell comprising: a floating body having a first conductivity type selected from n-type conductivity type and p-type conductivity type; a first region having a second conductivity type selected from the n-type conductivity type and the p-type conductivity type and being different from the first conductivity type; a second region having the first conductivity type and being relatively more heavily doped than the floating body; and a sense line terminal electrically connected to the second region and configured to be electrically connected to a structure providing the reference value.

In another aspect of the present invention, a reference cell is provided that comprises: a memory cell region comprising: a floating body having a first conductivity type selected from n-type conductivity type and p-type conductivity type; a first region having a second conductivity type selected from the n-type conductivity type and the p-type conductivity type and being different from the first conductivity type; and a second region having the second conductivity and being separated from the first region by the floating body; and a reference cell region comprising: the floating body; a third region having the first conductivity type and being separated from the first and second regions by the floating body; a fourth region having the first conductivity type and being separated from the first, second and third regions by the floating body; and being relatively more heavily doped than the floating body; and a sense line terminal electrically connected to one or both of the third and fourth regions, the sense line terminal being configured to be electrically connected to a reference value for comparison of the reference value with a potential of the floating body.

In at least one embodiment, the reference cell further comprising a second sense line terminal connected to the other of the third and fourth regions.

These and other features of the invention will become apparent to those persons skilled in the art upon reading the details of the memory cells, arrays, integrated circuits and methods as more fully described below.

DETAILED DESCRIPTION OF THE INVENTION

Figure 1:
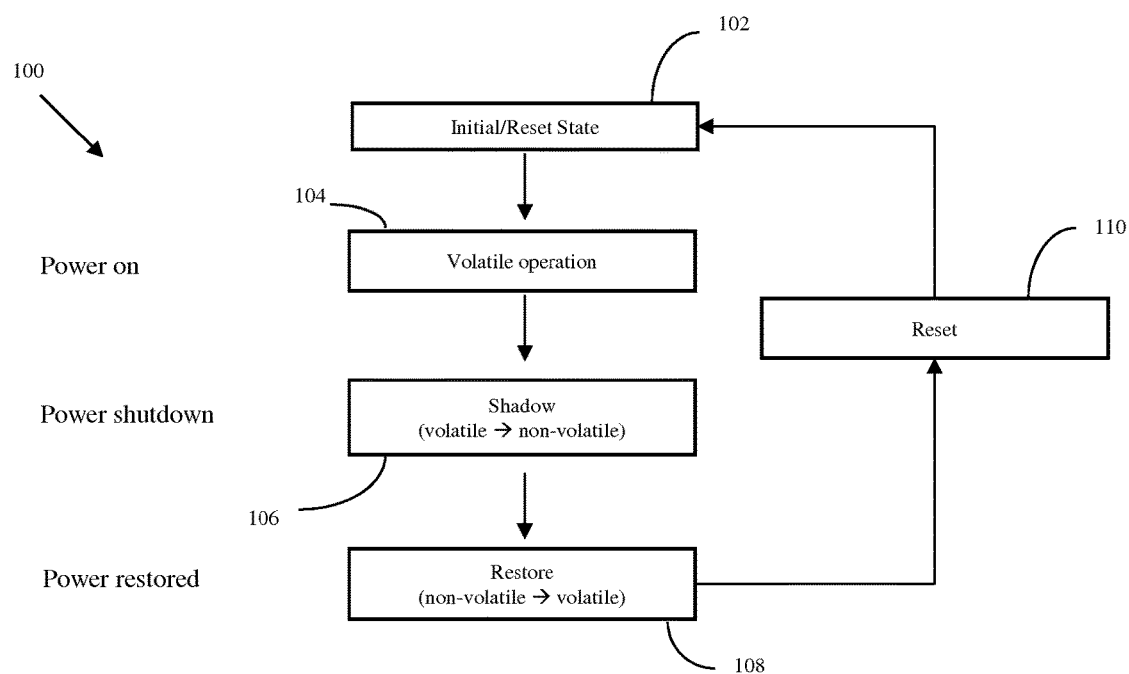
FIG. 1 is a flowchart illustrating operation of a memory device according to an embodiment of the present invention.

Before the present cells, arrays and methods are described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "an", and "the" include plural referents unless the context clearly dictates otherwise. Thus, for example, reference to "a cell" includes a plurality of such cells and reference to "the array" includes reference to one or more arrays and equivalents thereof known to those skilled in the art, and so forth.

The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed.

Definitions

The terms "shadowing" "shadowing operation" and "shadowing process" refer to a process of copying the contents of volatile memory to non-volatile memory.

"Restore", "restore operation", or "restore process", as used herein, refers to a process of copying the contents of non-volatile memory to volatile memory.

"Reset", "reset operation", or "reset process", as used herein, refers to a process of setting non-volatile memory to a predetermined state.

DESCRIPTION

FIG. 1 is a flowchart 100 illustrating operation of a memory device according to the present invention. At event 102, when power is first applied to the memory device, the memory device is placed in an initial state, in a volatile operational mode and the nonvolatile memory is set to a predetermined state. At event 104 the memory device of the present invention operates in the same manner as a volatile memory, for example as an SRAM or DRAM memory cell. However, during power shutdown, or when power is inadvertently lost, or any other event that discontinues or upsets power to the memory device of the present invention, the content of the volatile memory is loaded into non-volatile memory at event 106, during a process which is referred to here as "shadowing" (event 106), and the data previously held in volatile memory is lost. Shadowing can also be performed during backup operations, which may be performed at regular intervals during volatile operation 104 periods, and/or at any time that a user manually instructs a backup.

During a backup operation, the content of the volatile memory is copied to the non-volatile memory while power is maintained to the volatile memory so that the content of the volatile memory also remains in volatile memory. Alternatively, because the volatile memory operation consumes more power than the non-volatile storage of the contents of the volatile memory, the device can be configured to perform the shadowing process anytime the device has been idle for at least a predetermined period of time, thereby transferring the contents of the volatile memory into non-volatile memory and conserving power. As one example, the predetermined time period can be about thirty seconds, but of course, the invention is not limited to this time period, as the device could be programmed with virtually any predetermined time period.

After the content of the volatile memory has been moved during a shadowing operation to nonvolatile memory, the shutdown of the memory device occurs, as power is no longer supplied to the volatile memory. At this time, the memory device retains the stored data in the nonvolatile memory. Upon restoring power at event 108, the content of the nonvolatile memory is restored by transferring the content of the non-volatile memory to the volatile memory in a process referred to herein as the "restore" process, after which, upon resetting the memory device at event 110, the memory device may be reset to the initial state (event 102), where the nonvolatile memory is placed in a predetermined state, and again operates in a volatile mode, like an SRAM or DRAM memory device, event 104.

Figure 2:
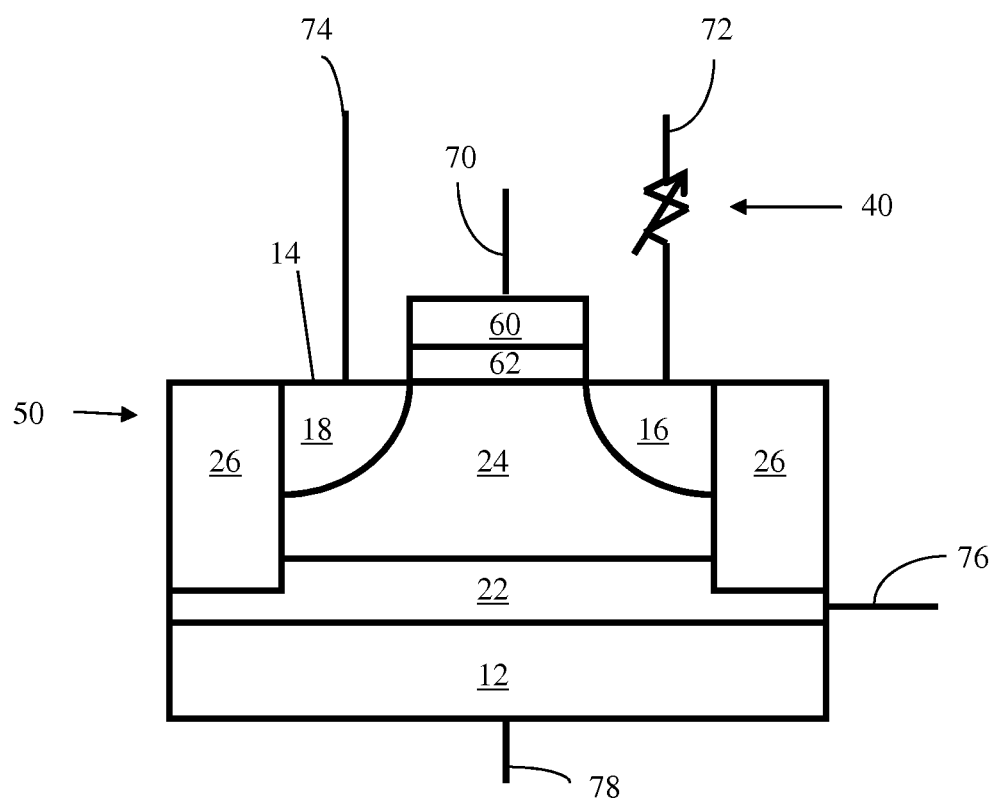
FIG. 2 is a cross-sectional view of a memory cell according to an embodiment of the present invention.

FIG. 2 shows an illustrative, non-exclusive example of an embodiment of memory cell 50. Cell 50 is formed in and/or on a substrate 12 of a first conductivity type, such as a p-type conductivity type, for example. Substrate 12 may include any suitable substrate, illustrative, non-exclusive examples of which include silicon, germanium, silicon germanium, gallium arsenide, carbon nanotubes, and/or other semiconductor materials.

Substrate 12 has a surface 14 and includes a buried layer 22 of a second conductivity type, such as n-type conductivity type. Buried layer region 22 may be formed using any suitable process and/or method performed on the material of substrate 12, illustrative, non-exclusive examples of which include ion implantation process and/or epitaxial growth.

Memory cell 50 includes a first region 16 having a second conductivity type, such as n-type conductivity type, that is formed in substrate 12, and a second region 18 having a second conductivity type, that is formed in substrate 12 and spaced apart from the first region 16. First and second regions 16 and 18, respectively, are exposed at surface 14 and may be formed using any suitable method and/or process, illustrative, non-exclusive examples of which include ion implantation, solid state diffusion, and/or epitaxial growth.

Figure 5A:
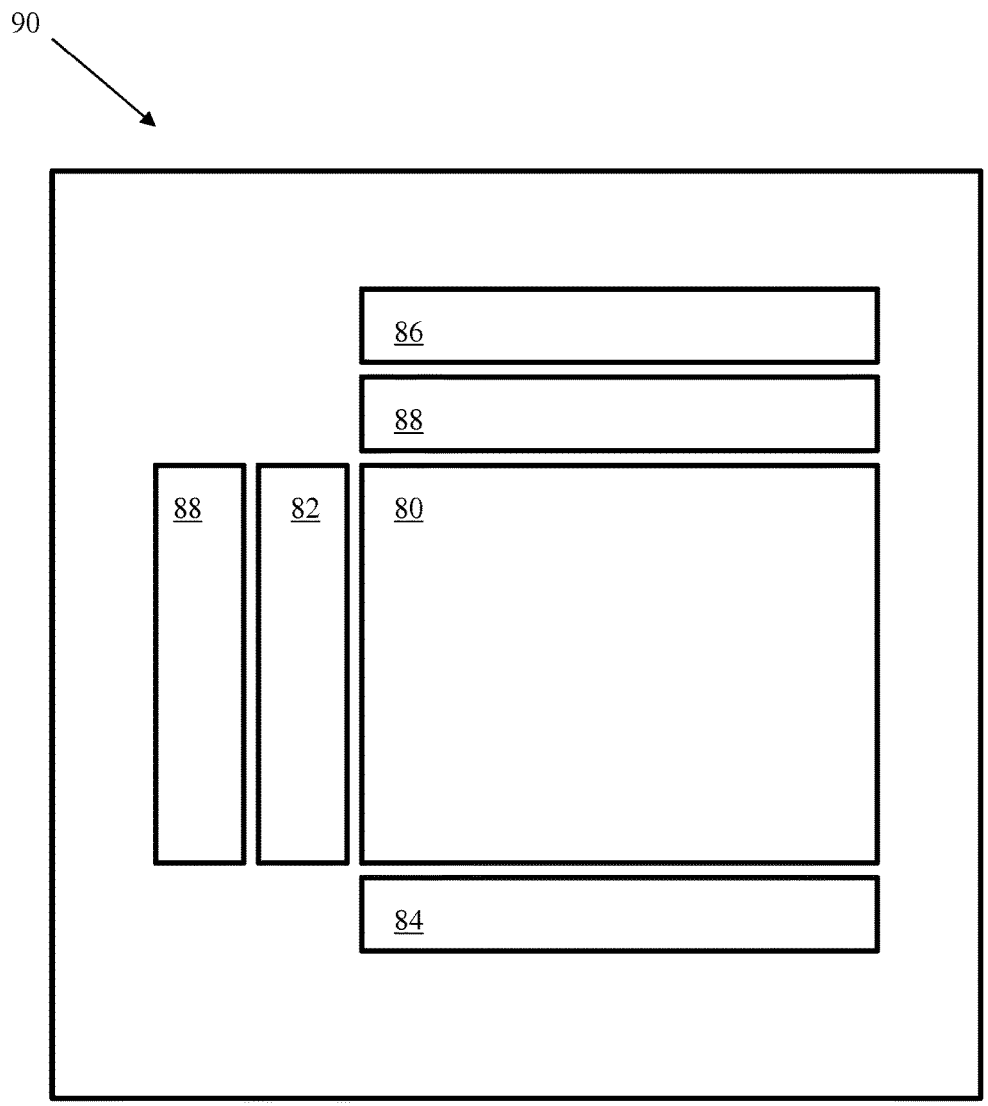
FIG. 5A illustrates an integrated circuit device comprising a memory array comprising of a plurality of memory cells shown in FIG. 2.
Figure 5B:
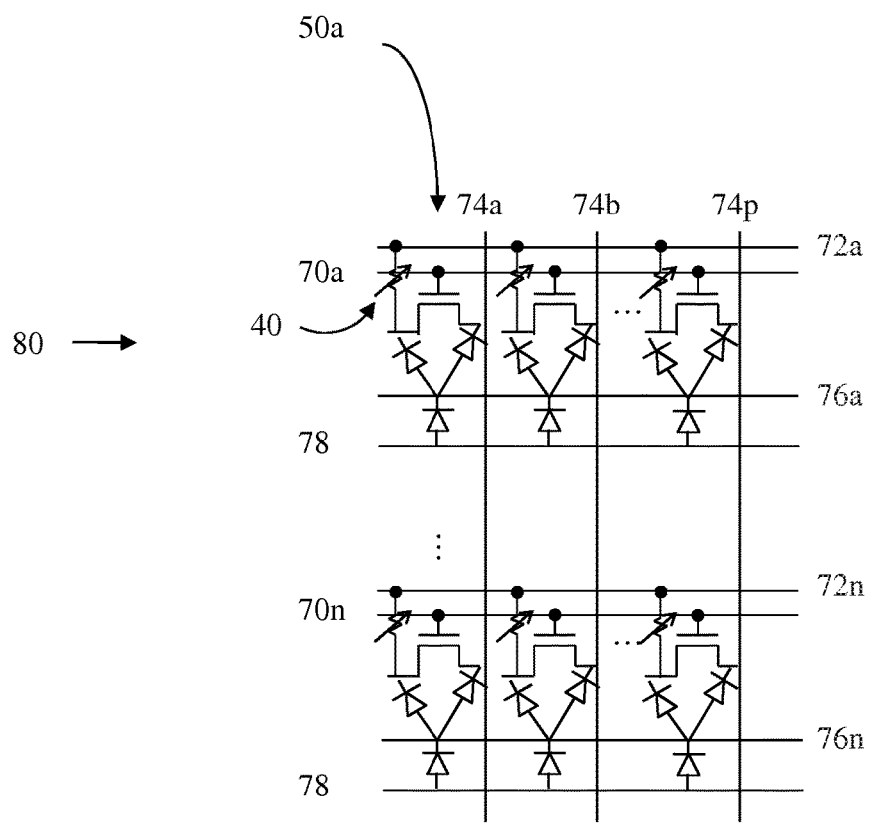
FIGS. 5B and 5C schematically illustrate multiple cells of the type shown in FIG. 2 joined to make a memory array.
Figure 5C:
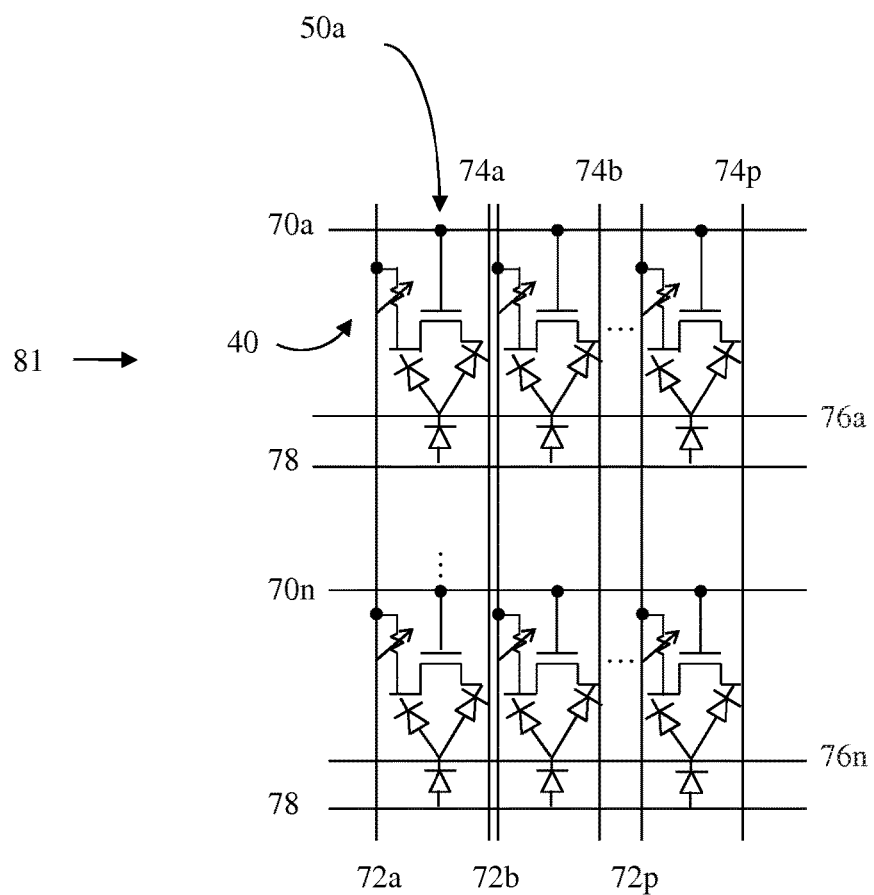

A floating body region 24 of the substrate 12 having a first conductivity type, such as p-type conductivity type, is bounded by surface 14, first and second regions 16 and 18, buried layer 22, and insulating layer 26. The floating body region 24 may be formed using any suitable method and/or process such as ion implantation, solid state diffusion, and/or epitaxial growth. Insulating layer 26 may be formed from any suitable insulating and/or dielectric materials, illustrative, one non-exclusive example of which includes silicon dioxide. Insulating layers 26 may insulate cell 50 from neighboring cells 50 when multiple cells 50 are joined in an array 80 to form a memory device 90, an example of which is illustrated in FIGS. 5A-5C.

A gate 60 may be positioned in between regions 16 and 18, and above the surface 14. Gate 60 is insulated from surface 14 by an insulating layer 62. Insulating layer 62 may be formed from any suitable dielectric material, illustrative, non-exclusive examples of which include silicon oxide, high-K dielectric materials, tantalum peroxide, titanium oxide, zirconium oxide, hafnium oxide, and/or aluminum oxide. Gate 60 may be made from any suitable conductive material, illustrative, non-exclusive examples of which include a polysilicon material, a metal gate electrode, tungsten, tantalum, titanium and/or their nitrides.

A resistive change memory element 40 is positioned above one of the regions having second conductivity type. The resistive change memory element is shown as a variable resistor in FIG. 2, and may be formed by bipolar resistive memory element, such as transition metal oxides, ferroelectric, and/or ferromagnetic materials. The resistivity state of a bipolar resistive memory element depends on the polarity of the potential difference or current flow across the bipolar resistive memory element. The resistive change memory element 40 is shown to be electrically connected to the source line region 16 in FIG. 2. Alternatively, resistive change memory element 40 may be connected to the bit line region 18. The resistive change memory element 40 is electrically connected to the floating body transistor 20—which comprises of the first region 16, the floating body region 24, the second region 18, and the gate electrode 60—(see also the schematic view of the memory cell 50 in FIG. 4A), and the separation distance between the volatile memory (i.e. the floating body transistor 20) and the non-volatile memory (i.e. the resistive change memory element 40) can be small, for example from about 90 nm to about 1 µm, preferably from about 90 nm to about 500 nm, more preferably from about 90 nm to about 100 nm if the resistive change element 40 is located between the surface 14 and the bottom-most (or first) metal layer for a 28-nm technology, or less than 1 um if the resistive change element 40 is located below the fourth metal layer for a 28-nm technology process, or less than 10 um, depending on for example which metal layer the addressable line (e.g. source line 72) is implemented at as well as the process technology node. Cell 50 further includes a word line (WL) terminal 70 electrically connected to gate 60, a source line (SL) terminal 72 electrically connected to region 16, a bit line (BL) terminal 74 electrically connected to region 18, a buried well (BW) terminal 76 electrically connected to buried layer region 22, and a substrate terminal 78 electrically connected to substrate 12. Alternatively, the SL terminal 72 may be electrically connected to region 18 and BL terminal 74 may be electrically connected to region 16.

As discussed in more detail herein, the conductivity types described above are exemplary conductivity types and other conductivity types and/or relative conductivity types are also within the scope of the present disclosure. As an illustrative, non-exclusive example, memory cell 50 may have and/or include a p-type conductivity type as the first conductivity type and n-type conductivity type as the second conductivity type.

Substrate 12 is present at all locations under array 80 (see FIG. 5A). Persons of ordinary skill in the art will appreciate that one or more substrate terminals 78 will be present in one or more locations as a matter of design choice. Such skilled persons will also appreciate that while exemplary array 80 is shown as a single continuous array in FIGS. 5A-5C, that many other organizations and layouts are possible like, for example, word lines may be segmented or buffered, bit lines may be segmented or buffered, source lines may be segmented or buffered, the array 80 may be broken into two or more sub-arrays, control circuits such as word decoders, column decoders, segmentation devices, sense amplifiers, write amplifiers may be arrayed around exemplary array 80 or inserted between sub-arrays of array 80. Thus the exemplary embodiments, features, design options, etc., described are not limiting in any way.

Figure 3A:
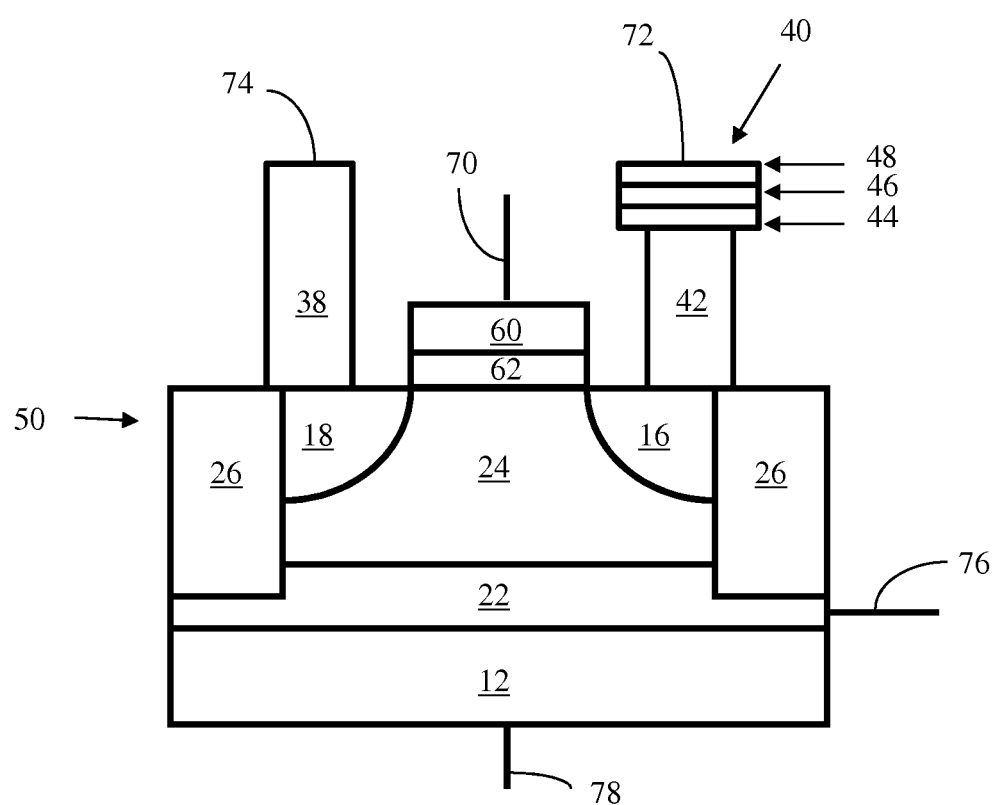
FIG. 3A is a cross-sectional view of a memory cell according to an embodiment of the present invention, showing an embodiment of a non-volatile memory element.

A non-limiting embodiment of a memory cell is shown in FIG. 3A. The resistive change memory element 40 may comprise of an electrode 44 and a bipolar resistive change material 46, which is connected to the second conductivity region 16 through a conductive element 42, for example in the form of a conductive plug. The resistive change memory element may be connected to an addressable line through a conductive material 48. The conductive element 42 may be composed of conductive materials, illustrative, non-exclusive examples of which include tungsten, silicided silicon materials, aluminum or copper. Electrode 44 may be formed of conductive materials, illustrative, non-exclusive examples of which include titanium nitride, titanium aluminum nitride, titanium silicon nitride, and/or platinum. Bipolar resistive change material 46 is a material that may exhibit multiple resistivity values, and may switch the resistivity state based on the polarity of the potential or current flow across the bipolar resistive element 46, illustrative, non-exclusive examples of which include transition metal oxides such as titanium oxide, nickel oxide, zirconium oxide, hafnium oxide, aluminum oxide, copper oxide ($Cu_xO$), copper manganese oxide ($CuMnO_x$), copper molybdenum oxide ($CuMoO_x$), indium zinc oxide (InZnO), and/or perovskites materials such as strontium titanium oxide ($SrTiO_3$), chromium-strontium zirconium oxide ($Cr-SrZrO_3$), praseodymium calcium manganese oxide ($PrCaMnO_3$), strontium lanthanum titanium oxide ($SrLaTiO_3$), lanthanum strontium iron oxide ($LaSrFeO_3$), lanthanum strontium cobalt oxide ($LaSrCrO_3$). Alternatively the resistive change memory element 40 may comprise of a ferroelectric and/or ferromagnetic materials. Electrode 48 may be formed by conductive materials, illustrative, non-exclusive examples of which include titanium nitride, titanium aluminum nitride, titanium silicon nitride, platinum, aluminum or copper, or layers of thereof.

Figure 3B:
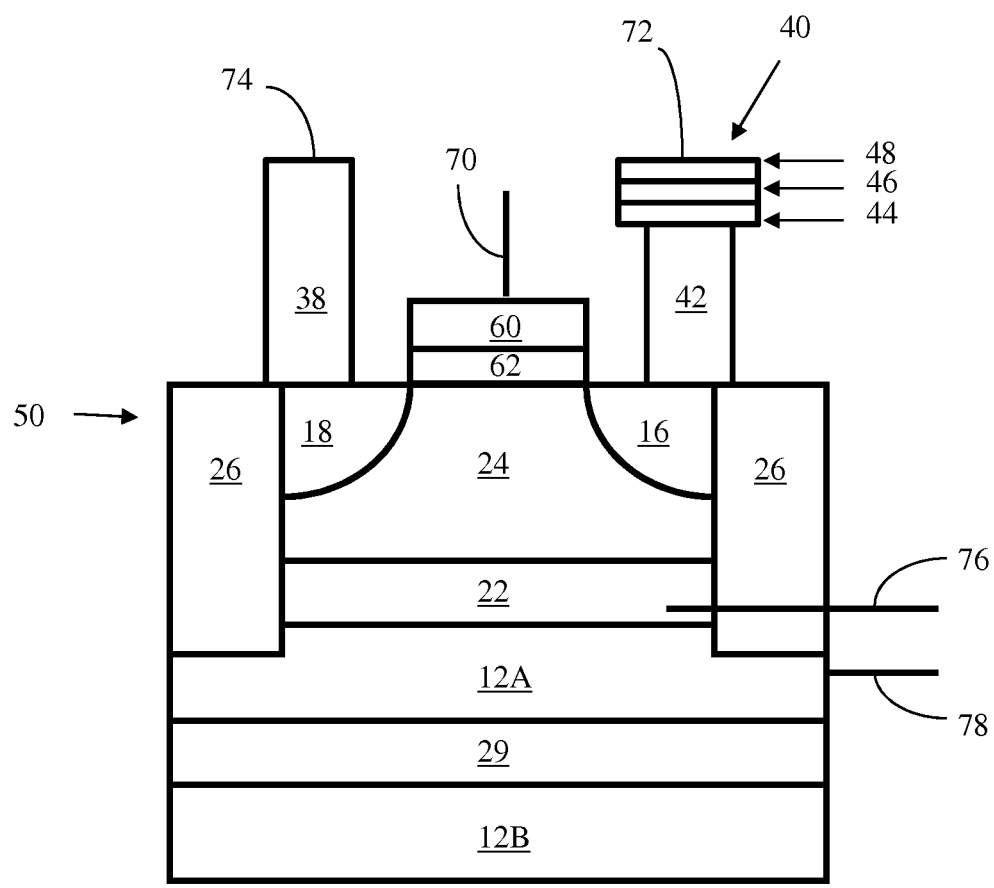
FIG. 3B is a cross-sectional view of a memory cell according to another embodiment of the present invention.

In FIG. 3B, an alternative embodiment of memory cell 50 is shown where substrate 12 is replaced by region 12A of the first conductivity type (for example, p-type) which is a well inside substrate 29 of the second conductivity type (for example, n-type). The well 29 in turn could be another well inside substrate 12B of the first conductivity type (for example, p-type) as shown in FIG. 3B. This arrangement allows for segmentation of the substrate terminal, which is connected to the region 12A. The alternative embodiment of memory cell 50 shown in FIG. 3B also shows insulating layers 26 insulating both floating body region 24 and the buried layer 22.

Figure 3C:
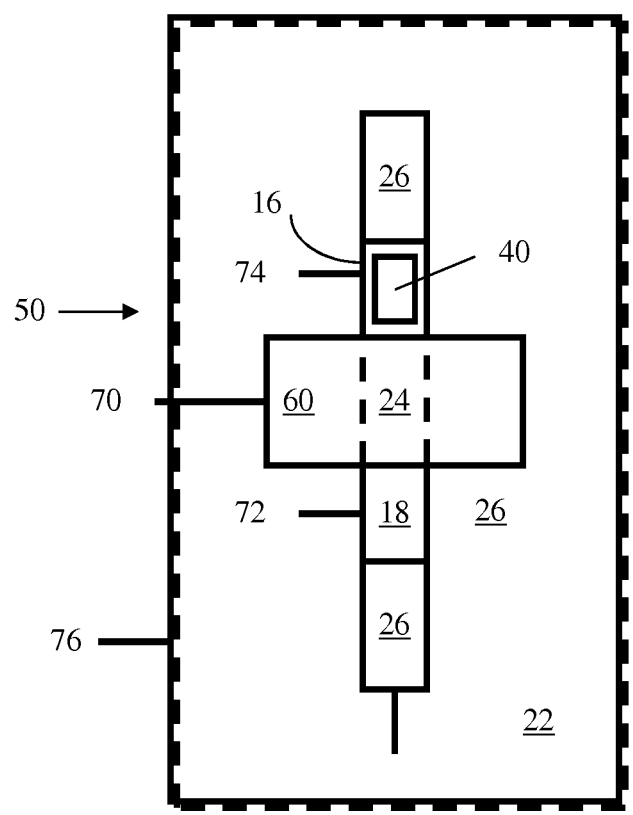
FIG. 3C is a top view of a memory cell according to an embodiment of the present invention.

FIG. 3C illustrates an exemplary top view of memory cell 50. From a top view perspective, the memory cell 50 looks similar to a single transistor. This is because each memory cell 50 includes a respective volatile memory portion and a respective non-volatile memory portion within a "single transistor" memory cell 50.

Figure 4A:
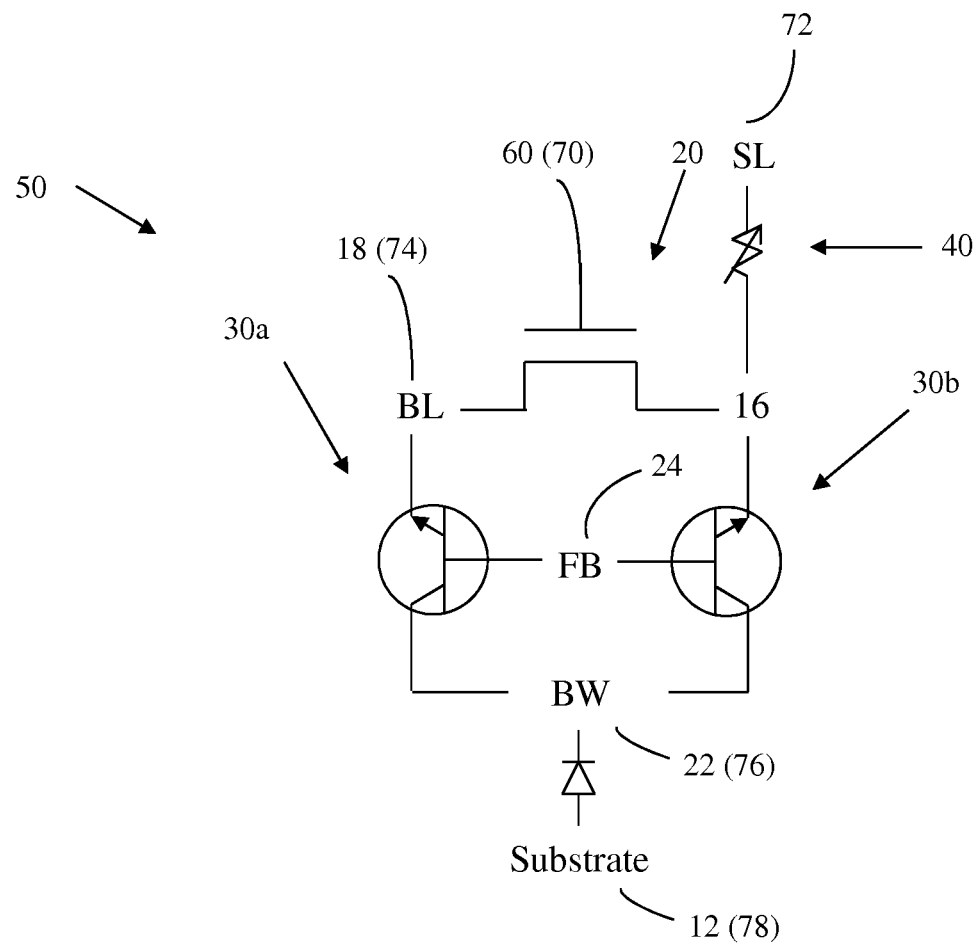
FIGS. 4A and 4B schematically illustrate an equivalent circuit representation of the memory cell shown in FIG. 2.

FIG. 4A illustrates an equivalent circuit representation of memory cell 50. Inherent in memory cell 50 are metal-oxide-semiconductor (MOS) transistor 20, formed by source line region 16, gate 60, bit line region 18, and floating body region 24; and bipolar devices 30a and 30b, formed by buried well region 22, floating body region 24, and bit line region 18 or source line region 16, respectively.

Figure 4B:
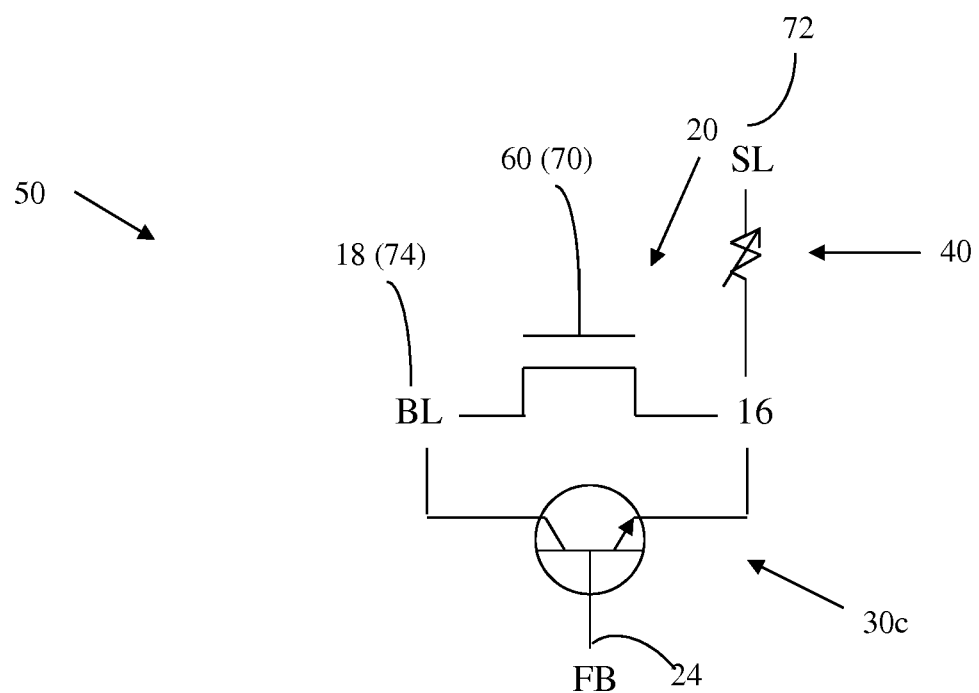

Also inherent in memory device 50 is bipolar device 30c, formed by source line region 16, floating body 24, and bit line region 18. For drawings clarity, bipolar device 30c is shown separately in FIG. 4B.

In memory cell 50, the current may flow in either direction, from the bit line region 18 (connected to the BL terminal 74) to the source line region 16 (connected to the SL terminal 72), or vice versa. The MOS transistor 20 may also be asymmetric, as described for example in U.S. application Ser. No. 13/244,899 "Asymmetric Semiconductor Memory Device Having Electrically Floating Body Transistor" ("Widjaja-3"), which is hereby incorporated herein, in its entirety, by reference thereto. An asymmetric cell may conduct different amounts of current, depending on the direction of the current flow.

FIG. 5A illustrates an integrated circuit device 90, which may comprise of memory array 80 formed by plurality of memory cells 50 arranged in rows and columns, and periphery circuitry, illustrative, non-exclusive examples of which include counter 82, read circuitry 84, write circuitry 86, and address decoder 88. The memory array 80 may include at least 16 memory cells 50, or up to and including 1 terabit of memory cells 50. The integrated circuit device 90 may be a memory device or an integrated circuit device comprising of embedded memory, illustrative, non-exclusive examples of which include microprocessors, networking, communication, and field-programmable logic devices. The integrated circuit device 90 may also comprise of circuitry to determine if memory array 80 (or a segment of memory array 80, for example when the segment includes at least 0.1% of the memory cells) has been idle for a period of time, which may trigger a shadowing operation to conserve power consumption of the memory array 80 and subsequently the integrated circuit device 90. The integrated circuit device 90 may also comprise of a timer circuitry to ascertain that the elapsed idle time is greater than an elapsed time threshold, for example thirty seconds.

FIGS. 5B and 5C illustrate examples of memory arrays 80 and 81 formed by a plurality of memory cells 50. The memory array 81 shown in FIG. 5C comprises of links of a plurality memory cells 50 connected in parallel, for example as described in U.S. application Ser. No. 12/897,528 "Compact Semiconductor Memory Device Having Reduced Number of Contacts, Methods of Operating and Methods of Making" ("Widjaja-6"), which is hereby incorporated herein, in its entirety, by reference thereto. For simplicity, only memory array 80 will be shown from hereon.

When power is applied to memory cell 50, memory cell 50 stores its states in floating body region 24 and may operate like a capacitorless DRAM cell, with only one stable floating body state in a memory cell (for example as described in "A Capacitor-less 1T-DRAM Cell", S. Okhonin et al., pp. 85-87, IEEE Electron Device Letters, vol. 23, no. 2, February 2002 ("Okhonin-1"), "Memory Design Using One-Transistor Gain Cell on SOI", T. Ohsawa et al., pp. 152-153, Tech. Digest, 2002 IEEE International Solid-State Circuits Conference, February 2002 ("Ohsawa-1"), "Further Insight Into the Physics and Modeling of Floating-Body Capacitorless DRAMs", A. Villaret et al., pp. 2447-2454, IEEE Transactions on Electron Devices, vol. 52, no. 11, November 2005 ("Villaret"), "Scaled 1T-Bulk Devices Built with CMOS 90 nm Technology for Low-cost eDRAM Applications", R. Ranica, et al., pp. 38-41, Tech. Digest, Symposium on VLSI Technology, 2005 ("Ranica"), and "Simulation of Intrinsic Bipolar Transistor Mechanisms for future capacitor-less eDRAM on bulk substrate", R. Pulicani et al., pp. 966-969, 2010 $17^{th}$ IEEE International Conference on Electronics, Circuits, and Systems, December 2010 ("Pulicani"), which are hereby incorporated herein, in their entireties, by reference thereto), or a bi-stable SRAM cell, where more than one stable state exists for each memory cell (for example as described in U.S. Patent Application Publication No. 2010/00246284 to Widjaja et al., titled "Semiconductor Memory Having Floating Body Transistor and Method of Operating" ("Widjaja-1") and U.S. Patent Application Publication No. 2010/0034041, "Method of Operating Semiconductor Memory Device with Floating Body Transistor Using Silicon Controlled Rectifier Principle" ("Widjaja-2"), which are both hereby incorporated herein, in their entireties, by reference thereto). In at least one embodiment, the non-volatile memory element is initialized to have a low resistivity state.

Several operations may be performed on memory cell 50 during the volatile operation, such as holding, read, write logic-1, and write logic-0 operations.

Figure 6:
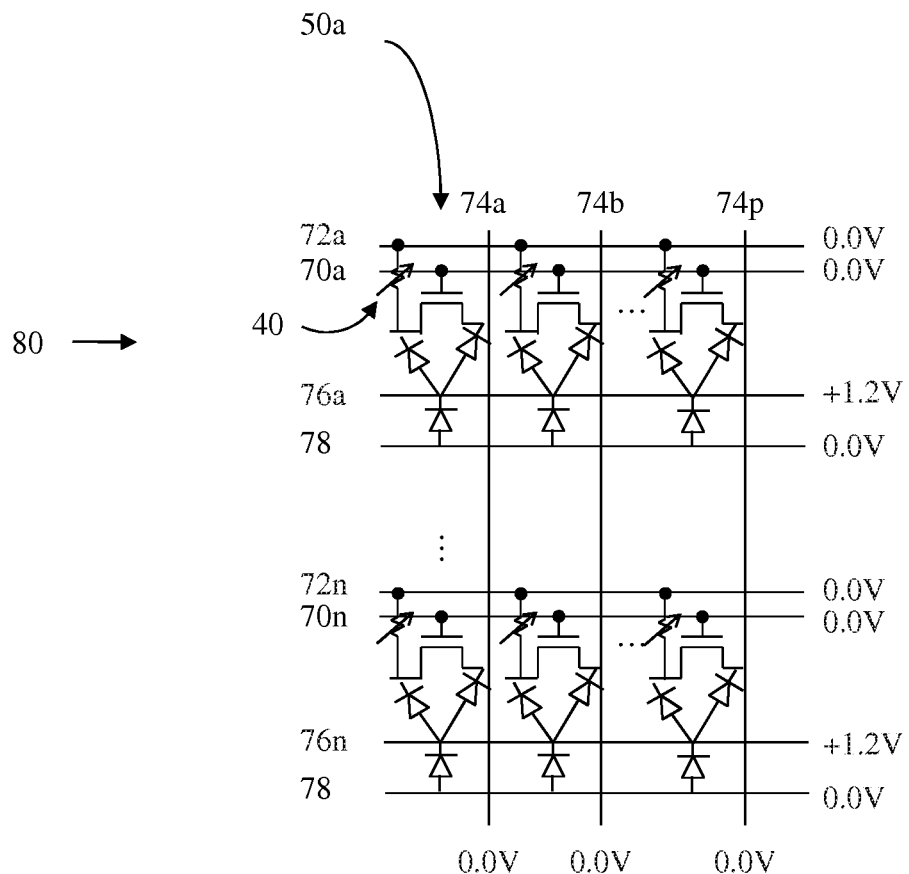
FIG. 6 schematically illustrates performance of a holding operation on a memory array according to an embodiment of the present invention.
Figure 7:
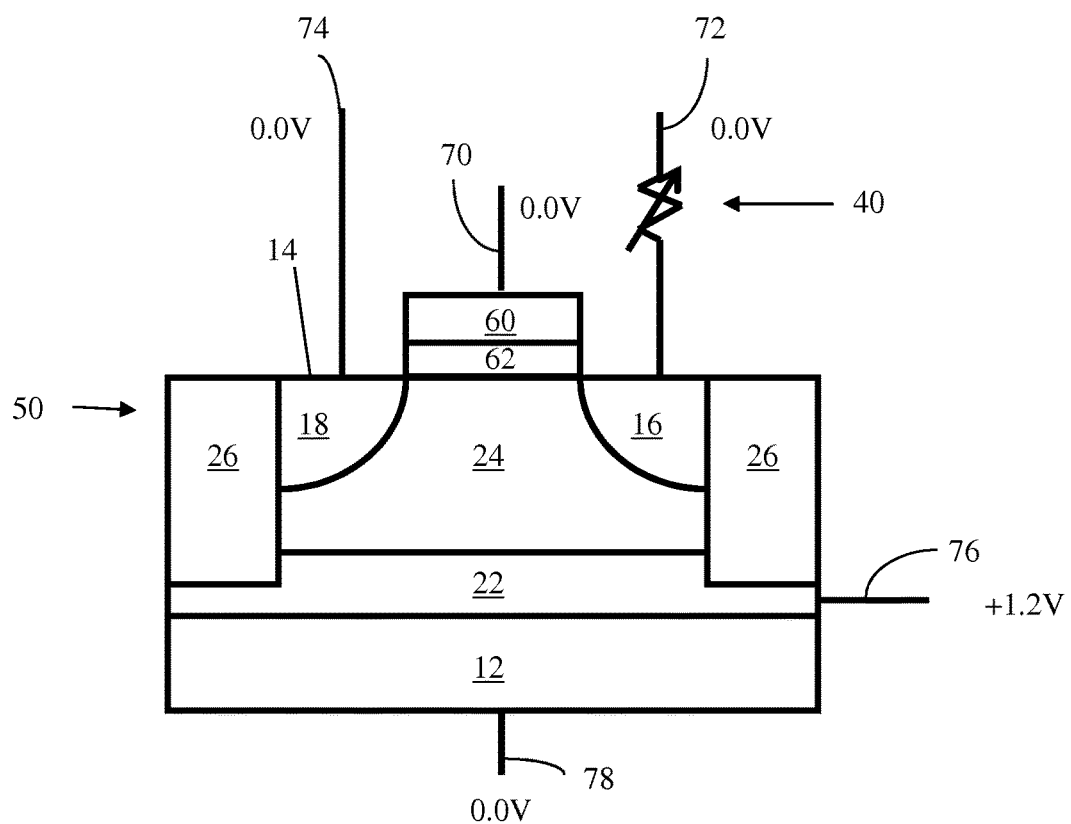
FIG. 7 illustrates exemplary bias conditions applied on the terminals of a memory cell of the array of FIG. 6.

FIG. 6 schematically illustrates performance of a holding operation on memory array 80, while FIG. 7 shows the bias applied on the terminals of a memory cell 50 during the holding operation, according to an exemplary, non-limiting embodiment. The holding operation is performed by applying a positive back bias to the BW terminal 76, zero or negative bias on the WL terminal 70, zero voltage to BL terminal 74, SL terminal 72, and substrate terminal 78. The positive back bias applied to the buried layer region 22 connected to the BW terminal 76 will maintain the state of the memory cell 50 that it is connected to. The positive bias applied to the BW terminal 76 needs to generate an electric field sufficient to trigger an impact ionization mechanism when the floating body region 24 is positively charged, as will be described through the band diagram shown in FIGS. 8A and 8B. The impact ionization rate as a function of the electric field is for example described in "Physics of Semiconductor Devices", Sze S. M. and Ng K. K., which is hereby incorporated herein, in its entirety, by reference thereto.

In one embodiment the bias conditions for the holding operation on memory cell 50 are: 0 volts is applied to WL terminal 70, 0 volts is applied to BL terminal 74, 0 volts is applied to SL terminal 72, a positive voltage, for example, +1.2 volts is applied to BW terminal 76, and 0 volts is applied to the substrate terminal 78. In other embodiments, different voltages may be applied to the various terminals of memory cell 50 and the exemplary voltages described are not limiting.

Figure 8A:
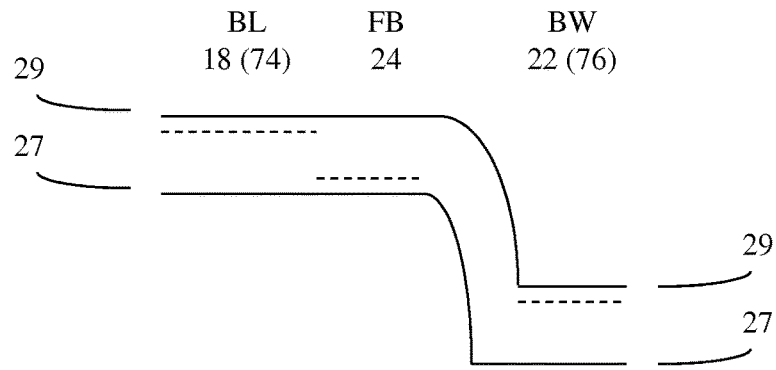
FIG. 8A shows an energy band diagram characterizing an intrinsic n-p-n bipolar device when a floating body region is positively charged and a positive bias voltage is applied to a buried well region of a memory cell according to an embodiment of the present invention.

FIG. 8A shows an energy band diagram characterizing the intrinsic n-p-n bipolar device 30b when the floating body region 24 is positively charged and a positive bias voltage is applied to the buried well region 22. The energy band diagram of the intrinsic n-p-n bipolar device 30a can be constructed in a similar manner, with the source line region 16 (connected to the SL terminal 72) in place of the bit line region 18 (connected to the BL terminal 74). The dashed lines indicate the Fermi levels in the various regions of the n-p-n transistor 30b. The Fermi level is located in the band gap between the solid line 27 indicating the top of the valence band (the bottom of the band gap) and the solid line 29 indicating the bottom of the conduction band (the top of the band gap) as is well known in the art. If floating body 24 is positively charged, a state corresponding to logic-1, the bipolar transistors 30a and 30b will be turned on as the positive charge in the floating body region lowers the energy barrier of electron flow into the base region. Once injected into the floating body region 24, the electrons will be swept into the buried well region 22 (connected to BW terminal 76) due to the positive bias applied to the buried well region 22. As a result of the positive bias, the electrons are accelerated and create additional hot carriers (hot hole and hot electron pairs) through an impact ionization mechanism. The resulting hot electrons flow into the BW terminal 76 while the resulting hot holes will subsequently flow into the floating body region 24. This process restores the charge on floating body 24 and will maintain the charge stored in the floating body region 24 which will keep the n-p-n bipolar transistors 30a and 30b on for as long as a positive bias is applied to the buried well region 22 through BW terminal 76.

If floating body 24 is neutrally charged (the voltage on floating body 24 being equal to the voltage on grounded bit line region 18), a state corresponding to logic-0, no (or low) current will flow through the n-p-n bipolar devices 30a and 30b. The bipolar devices 30a and 30b will remain off and no impact ionization occurs. Consequently memory cells in the logic-0 state will remain in the logic-0 state.

Figure 8B:
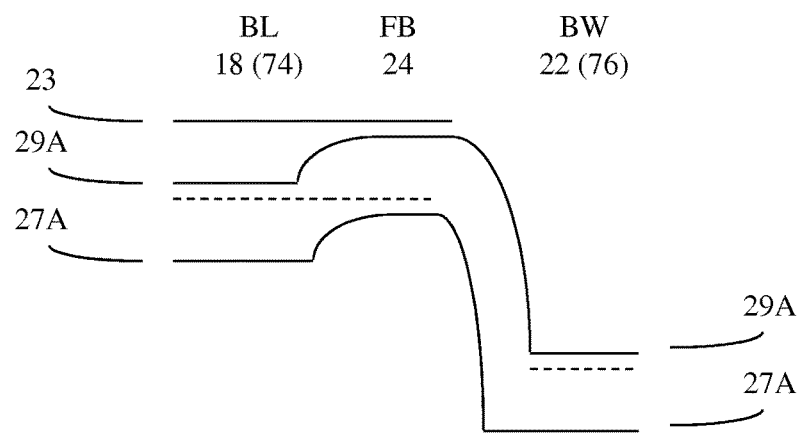
FIG. 8B shows an energy band diagram of an intrinsic n-p-n bipolar device when a floating body region is neutrally charged and a bias voltage is applied to a buried well region of a memory cell according to an embodiment of the present invention.

FIG. 8B shows an energy band diagram of the intrinsic bipolar device 30a when the floating body region 24 is neutrally charged and a bias voltage is applied to the buried well region 22. In this state the energy level of the band gap bounded by solid lines 27A and 29A is different in the various regions of n-p-n bipolar device 30a. Because the potential of the floating body region 24 and the bit line region 18 is equal, the Fermi levels are constant, resulting in an energy barrier between the bit line region 18 and the floating body region 24. Solid line 23 indicates, for reference purposes, the energy barrier between the bit line region 18 and the floating body region 24. The energy barrier prevents electron flow from the bit line region 18 (connected to BL terminal 74) to the floating body region 24. Thus the n-p-n bipolar device 30a and 30b will remain off.

In the holding operation described with regard to FIG. 6, there is no individually selected memory cell. Rather the holding operation will be performed at all cells connected to the same buried well terminal 76.

An alternative holding operation employing the intrinsic silicon controlled rectifier (SCR) device of memory cell, as described for example in Widjaja-2, may also be performed on memory array 80.

The amount of charge stored in the floating body 24 can be sensed by monitoring the cell current of the memory cell 50. If the memory cell is in a logic-1 state having holes in the floating body region 24, then the memory cell will have a lower threshold voltage (gate voltage where the transistor is turned on), and consequently a higher cell current, compared to when the floating body memory cell 50 is in a logic-0 state having no holes in the floating body region 24.

Figure 9A:
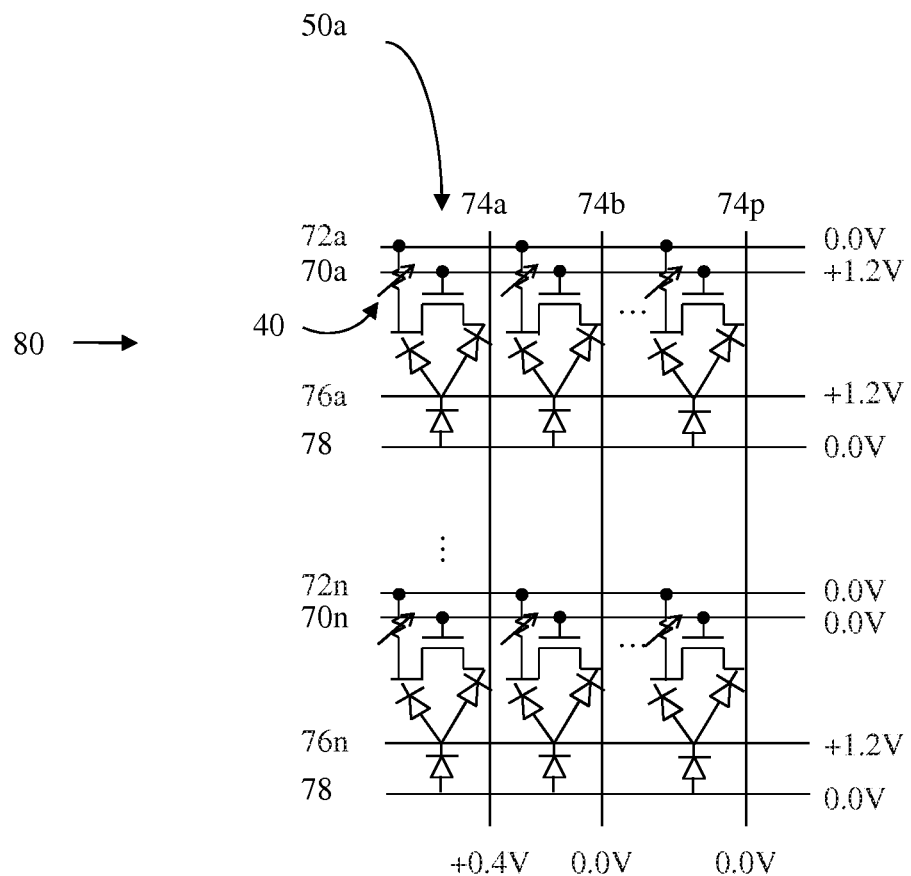
FIG. 9A is a schematic view of a memory array showing exemplary bias conditions for performing a read operation on the memory array, according to an embodiment of the present invention.
Figure 9B:
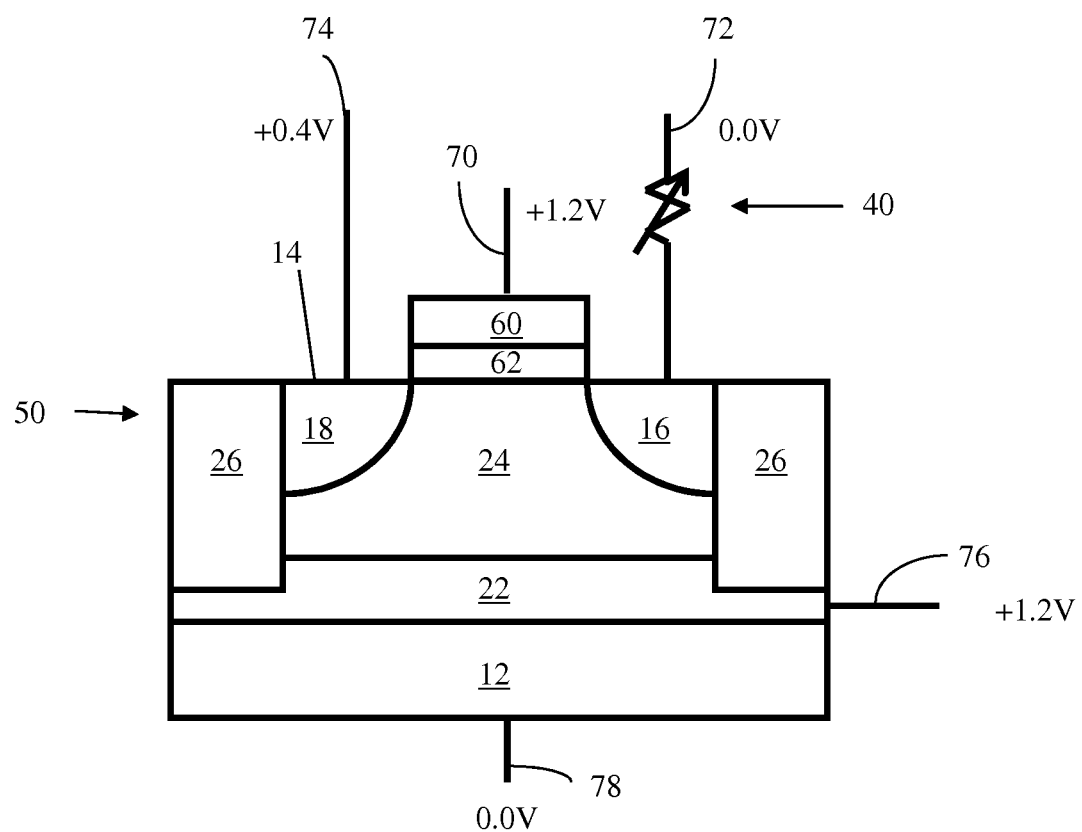
FIG. 9B shows exemplary bias conditions applied to a selected memory cell during the read operation noted with regard to the array in FIG. 9A.

FIG. 9A is a schematic view of a memory array 80 showing exemplary bias conditions for performing a read operation on the memory array 80, according to an embodiment of the present invention. FIG. 9B shows exemplary bias conditions applied to a selected memory cell 50a during the read operation noted with regard to array 80 in FIG. 9A. The read operation is performed by applying the following bias conditions: a positive bias to the WL terminal 70a, a positive bias to the BL terminal 74a, zero bias to the SL terminal 72a, zero or positive bias to the BW terminal 76a, and zero bias to the substrate terminal 78. All unselected WL terminals 70b (not shown) to 70n have zero volts applied, all unselected BL terminals 74b through 74p have zero volts applied, all unselected SL terminals 72b (not shown) through 72n have zero volts applied.

In one embodiment the bias conditions for the read operation for memory cell 50 are: +1.2 volts is applied to WL terminal 70, +0.4 volts is applied to BL terminal 74, 0.0 volts is applied to SL terminal 72, +1.2 volts is applied to BW terminal 76, and 0.0 volts is applied to the substrate terminal 78. In other embodiments, different voltages may be applied to the various terminals of memory cell 50 and the exemplary voltages described are not limiting. The positive voltage applied to BL terminal 74 may be less than the positive voltage applied to WL terminal 70, in which the difference in the threshold voltage of the memory cell 50 is employed to represent the state of the memory cell 50. The positive voltage applied to BL terminal 74 may also be greater than or equal to the positive voltage applied to WL terminal 70 and may generate an electric field sufficiently high to trigger the bipolar read mechanism.

A sensing circuit typically connected to BL terminal 74 can be used to determine the data state of the memory cell 50. Any sensing scheme known in the art can be used in conjunction with memory cell 50. For example, the sensing schemes disclosed in Ohsawa-1, Ohsawa-2, and/or Widjaja-3 are incorporated by reference herein in their entireties.

Figure 10A:
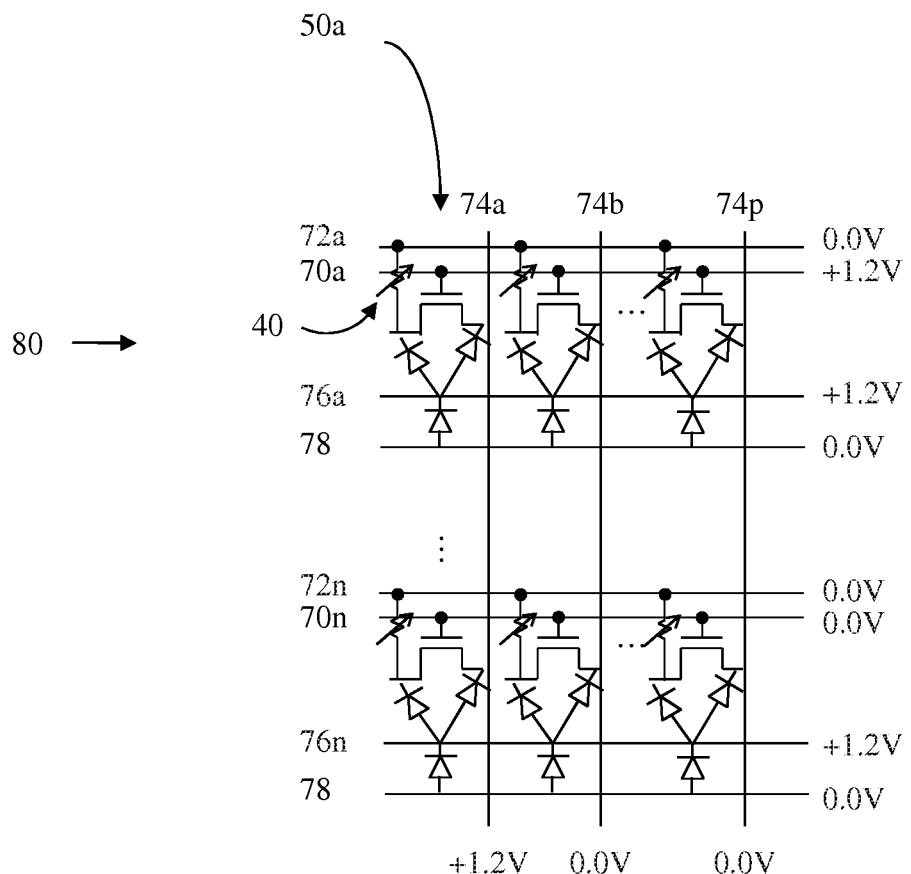
FIG. 10A is a schematic illustration of a memory cell array showing exemplary bias conditions for a write logic-1 operation on the memory array through an impact ionization mechanism, according to an embodiment of the present invention.
Figure 10B:
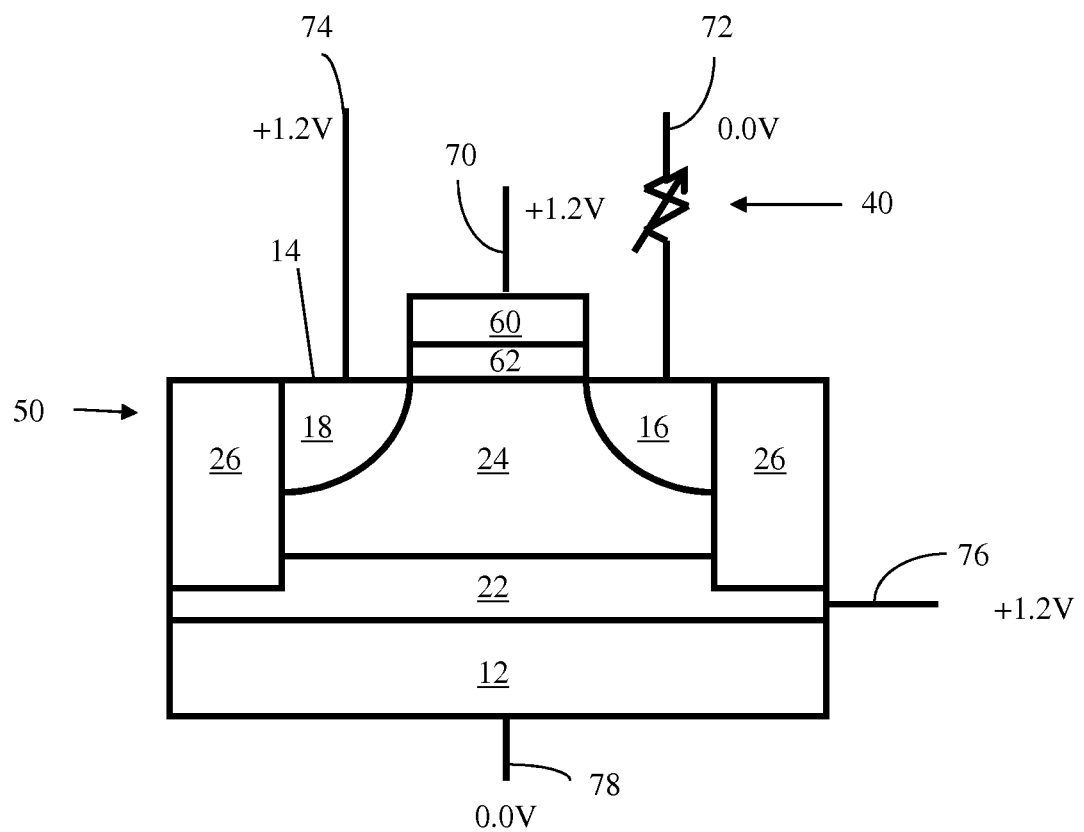
FIG. 10B illustrates exemplary bias conditions on an exemplary selected memory cell from the array of FIG. 10A.

FIG. 10A is a schematic illustration of a memory cell array showing exemplary bias conditions for a write logic-1 operation on the memory array 80 through an impact ionization mechanism, according to an embodiment of the present invention. FIG. 10B illustrates the bias conditions on an exemplary selected memory cell 50a, according to the embodiment of FIG. 10A, where the following bias conditions are applied: a positive voltage is applied to the selected WL terminal 70, a positive voltage is applied to the selected BL terminal 74, zero voltage is applied to the selected SL terminal 72, zero or positive voltage is applied to the selected BW terminal 76, and zero voltage is applied to the substrate terminal 78. This positive voltage applied to the selected BL terminal 74a is greater than or equal to the positive voltage applied to the selected WL terminal 70a and may generate sufficiently high enough electric field to trigger impact ionization mechanism.

In one particular non-limiting embodiment, about +1.2 volts is applied to the selected WL terminal 70, about +1.2 volts is applied to the selected BL terminal 74, about 0.0 volts is applied to SL terminal 72, about 0.0 volts or +1.2 volts is applied to BW terminal 76, and about 0.0 volts is applied to substrate terminal 78; while about 0.0 volts is applied to the unselected WL terminals 70, unselected BL terminals 74, unselected SL terminals, and substrate terminal 78, and 0.0 volts or +1.2 volts is applied to BW terminal 76. These voltage levels are exemplary only and may vary from embodiment to embodiment. Thus the exemplary embodiments, features, bias levels, etc., described are not limiting.

The positive bias applied to the selected BL terminal 74 will result in a depletion region around the bit line region 18. This effect is sometimes referred to as drain induced barrier lowering (DIBL). As a result, carriers (e.g. electrons) will flow through the selected memory cell 50a from the SL terminal 72a to the BL terminal 74a. Electrons will be accelerated in the pinch-off region (defined as the region near the surface 14 where the channel concentration is equal to the bulk doping concentration) of the MOS device 20, creating hot carriers (electron and hole pairs) in the vicinity of the bit line region 18. The generated holes will then flow into the floating body 24, putting the cell 50a to the logic-1 state.

Figure 11A:
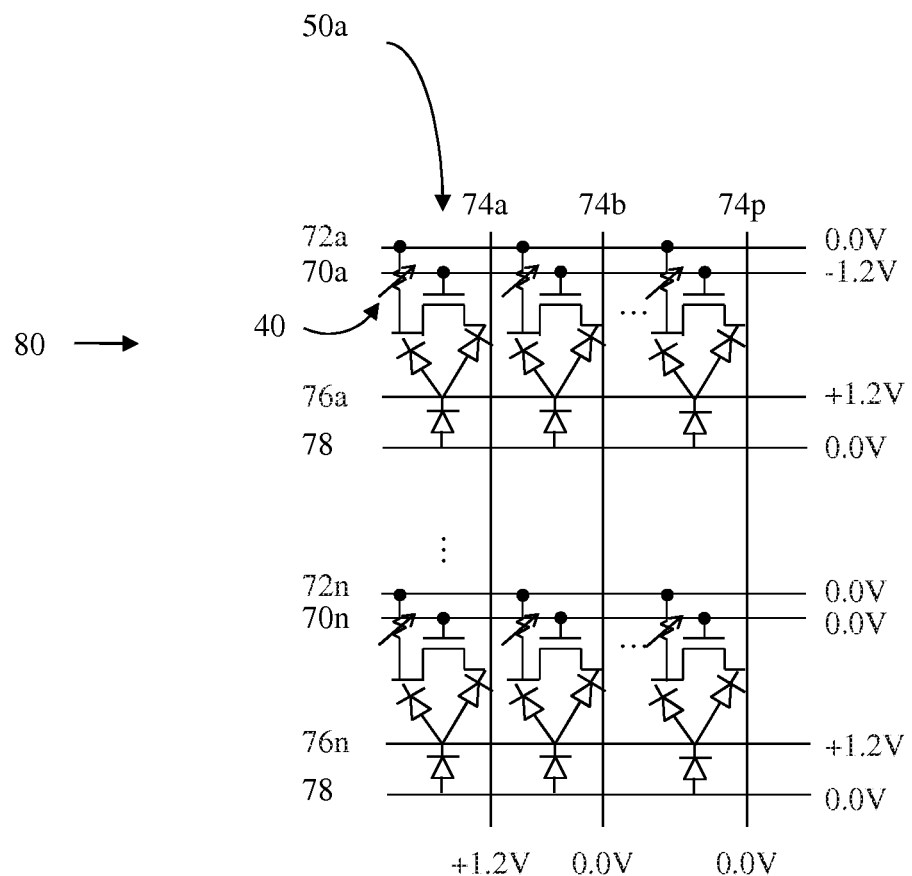
FIG. 11A is a schematic illustration of a memory cell array showing exemplary bias conditions for a write logic-1 operation on the memory array through a band-to-band tunneling mechanism, according to an embodiment of the present invention.
Figure 11B:
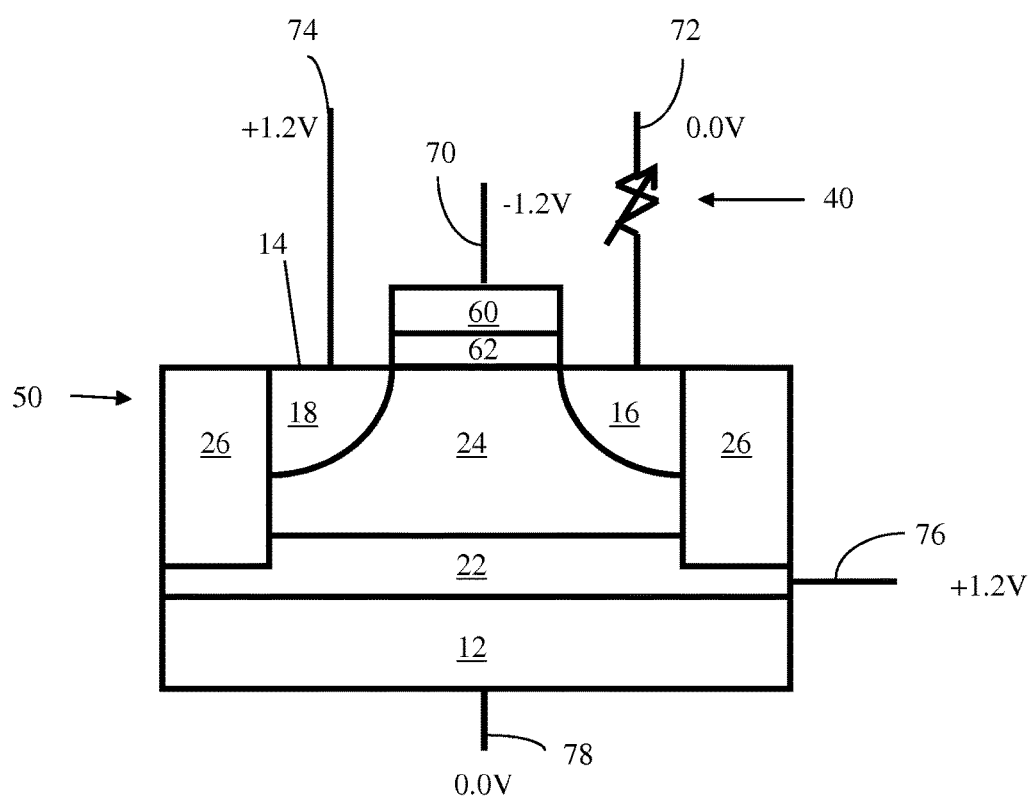
FIG. 11B illustrates exemplary bias conditions on an exemplary selected memory cell from the array of FIG. 11A.

FIG. 11A is a schematic illustration showing bias conditions for a write logic-1 operation using band-to-band tunneling mechanism performed on memory array 80 according to an embodiment of the present invention. FIG. 11B is a schematic cross-sectional view showing the bias condition on an exemplary selected memory cell 50a in the embodiment of array 80 shown in FIG. 11A. A write logic-1 operation using band-to-band tunneling mechanism can be performed by applying the following bias conditions: a negative voltage is applied to the selected WL terminal 70a, a positive voltage is applied to the selected BL terminal 74a, zero voltage is applied to the selected SL terminal 72a, zero or positive voltage is applied to the selected BW terminal 76a, and zero voltage is applied to the substrate terminal 78.

In one particular non-limiting embodiment, about −1.2 volts is applied to the selected WL terminal 70a, about +1.2 volts is applied to the selected BL terminal 74a, about 0.0 volts is applied to SL terminal 72a, about 0.0 volts or +1.2 volts is applied to BW terminal 76a, and about 0.0 volts is applied to substrate terminal 78; while about 0.0 volts is applied to the unselected WL terminals 70, unselected BL terminals 74, unselected SL terminals, and substrate terminal 78, and 0.0 volts or +1.2 volts is applied to BW terminal 76. These voltage levels are exemplary only may vary from embodiment to embodiment. Thus the exemplary embodiments, features, bias levels, etc., described are not limiting.

The negative charge on the gate 60 (connected to WL terminal 70) and the positive voltage on bit line region 18 (connected to BL terminal 74) create a strong electric field (for example, about $10^6$ V/cm in silicon, as described in "Physics of Semiconductor Devices", Sze S. M. and Ng K. K. ("Sze"), p. 104, hereby incorporated herein, by reference thereto) between the bit line region 18 and the floating body region 24 in the proximity of gate 60. This bends the energy band sharply upward near the gate and bit line junction overlap region, causing electrons to tunnel from the valence band to the conduction band, leaving holes in the valence band. The electrons which tunnel across the energy band become the drain leakage current, while the holes are injected into floating body region 24 and become the hole charge that creates the logic-1 state.

Figure 12A:
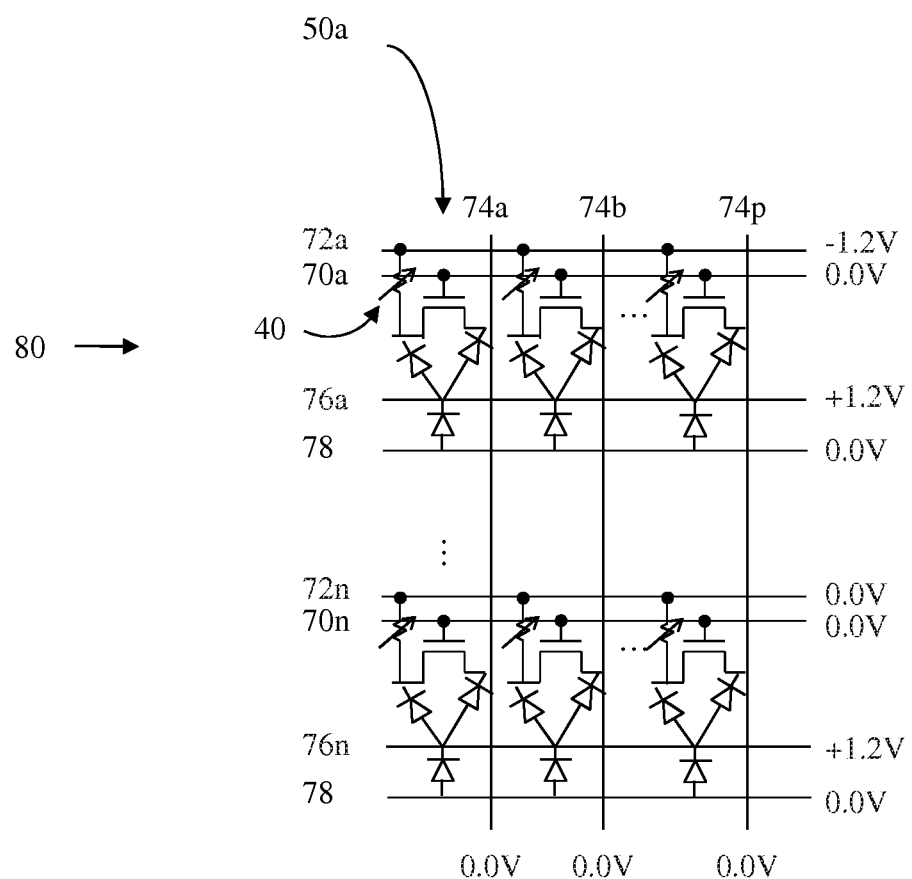
FIG. 12A is a schematic illustration showing exemplary bias conditions for a write logic-0 operation performed on a memory array according to an embodiment of the present invention.
Figure 12B:
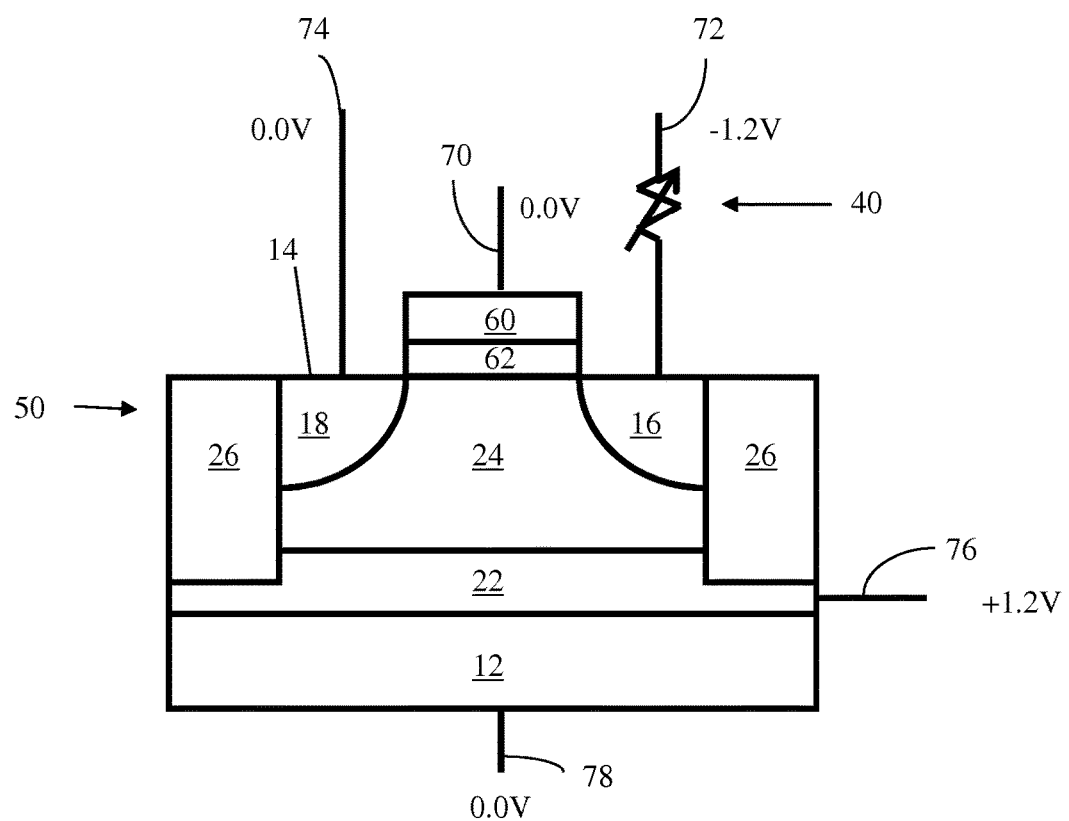
FIG. 12B is a schematic illustration of exemplary bias conditions applied to an exemplary selected memory cell from the memory array of FIG. 12A.

FIG. 12A is a schematic illustration showing bias conditions for a write logic-0 operation performed on memory array 80 according to an embodiment of the present invention. FIG. 12B is a schematic cross-sectional illustration of bias conditions applied to an exemplary selected memory cell 50a from the memory array 80 of FIG. 12A. A write logic-0 operation can be performed by applying a negative voltage bias to the selected SL terminal 72a, a zero voltage bias to the WL terminal 70a, zero voltage bias to the BL terminal 74a, zero or positive voltage bias to the BW terminal 76a, and zero voltage bias to the substrate terminal 78a; while zero voltage is applied to the unselected SL terminals 72, zero voltage bias is applied to the unselected WL terminals 70, zero or positive bias is applied to the BW terminal 76, and zero voltage bias is applied to the substrate 78. Under these conditions, the p-n junction between floating body 24 and source line region 16 of the selected cell 50 is forward-biased, evacuating holes from the floating body 24. All memory cells 50 sharing the same selected SL terminal 72a will be written to simultaneously. To write arbitrary binary data to different memory cells 50, a write logic-0 operation is first performed on all the memory cells to be written, followed by one or more write logic-1 operations on the memory cells that must be written to logic-1.

In one particular non-limiting embodiment, about −1.2 volts is applied to selected SL terminal 72a, about 0.0 volts is applied to WL terminal 70a, about 0.0 volts is applied to BL terminal 74a, about 0.0 volts or +1.2 volts is applied to BW terminal 76a, and about 0.0 volts is applied to substrate terminal 78, while zero voltage is applied to the unselected SL terminals 72, zero voltage bias is applied to the unselected WL terminals 70, zero or positive bias is applied to the BW terminal 76, and zero voltage bias is applied to the substrate 78. These voltage levels are exemplary only and may vary from embodiment to embodiment. Thus the exemplary embodiments, features, bias levels, etc., described are not limiting.

Figure 13A:
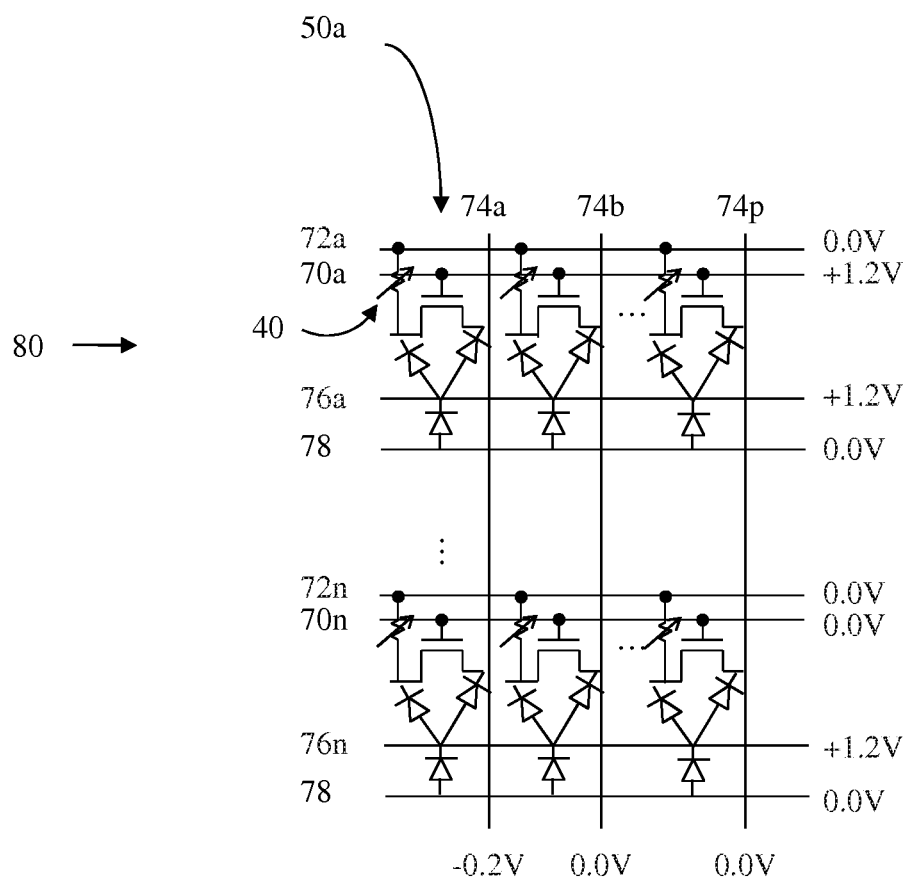
FIG. 13A is a schematic illustration showing exemplary bias conditions applied for a bit-selective write logic-0 operation performed on a memory array according to an embodiment of the present invention.
Figure 13B:
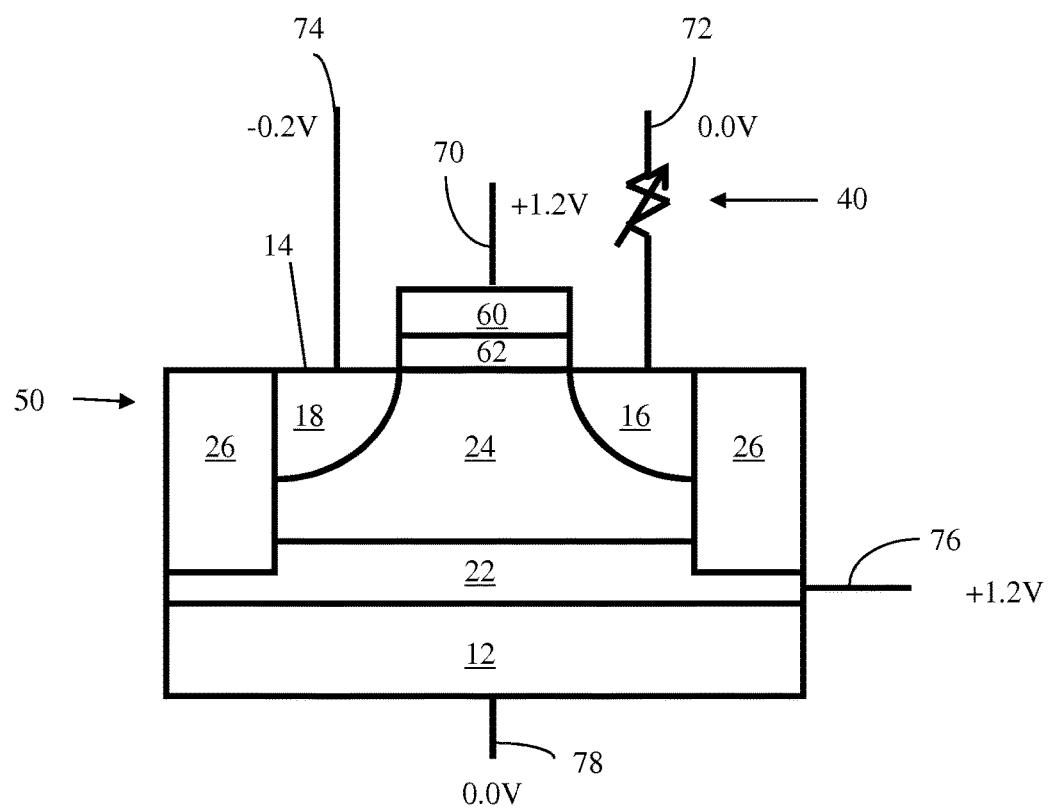
FIG. 13B illustrates exemplary bias conditions applied to the terminals of an exemplary selected memory cell from the array of FIG. 13A.

FIG. 13A is a schematic illustration showing bias conditions applied for a bit-selective write logic-0 operation performed on memory array 80 according to an embodiment of the present invention. FIG. 13B illustrates bias conditions applied to the terminals of an exemplary selected memory cell 50a from the array 80 of FIG. 13A, which can may be performed by applying a positive voltage to the selected WL terminal 70a, a negative voltage to the selected BL terminal 74a, zero voltage bias to the selected SL terminal 72a, zero or positive voltage bias to the BW terminal 76a, and zero voltage to the substrate terminal 78; while zero voltage is applied to the unselected WL terminals 70, zero voltage is applied to the unselected BL terminals 74, zero voltage bias is applied to the unselected SL terminals 72, zero or positive voltage is applied to the BW terminal 76, and zero voltage is applied to the substrate terminal 78. When the potential of gate 60 (connected to WL terminal 70) is increased from zero (or negative voltage) to a positive voltage, the floating body 24 potential will increase due to capacitive coupling. As a result of the floating body 24 potential increase and the negative voltage applied to the BL terminal 74, the p-n junction between floating body region 24 and bit line region 18 is forward-biased, evacuating holes from the floating body 24.

To reduce undesired write logic-0 disturb to other memory cells 50 in a memory array 80, the applied potential can be optimized as follows: if the floating body 24 potential of state logic-1 is referred to as $V_{FB1}$, then the voltage applied to the WL terminal 70a is configured to increase the floating body 24 potential by $V_{FB1}/2$ while $-V_{FB1}/2$ is applied to BL terminal 74a. Additionally, either ground or a slightly positive voltage may also be applied to the BL terminals 74 of unselected memory cells 50 that do not share the same BL terminal 74a as the selected memory cell 50a, while a negative voltage may also be applied to the WL terminals 70 of unselected memory cells 50 that do not share the same WL terminal 70a as the selected memory cell 50a.

As illustrated in FIGS. 13A and 13B, the following exemplary bias conditions may be applied to the selected memory cell 50a to perform a bit-selective write logic-0 operation: a potential of about −0.2 volts is applied to the selected BL terminal 74a, a potential of about +1.2 volts is applied to the selected WL terminal 70a, about 0.0 volts is applied to the selected SL terminal 72a, a potential of about +1.2 volts is applied to the BW terminal 76a, and about 0.0 volts is applied to the substrate terminal 78.

Figure 14:
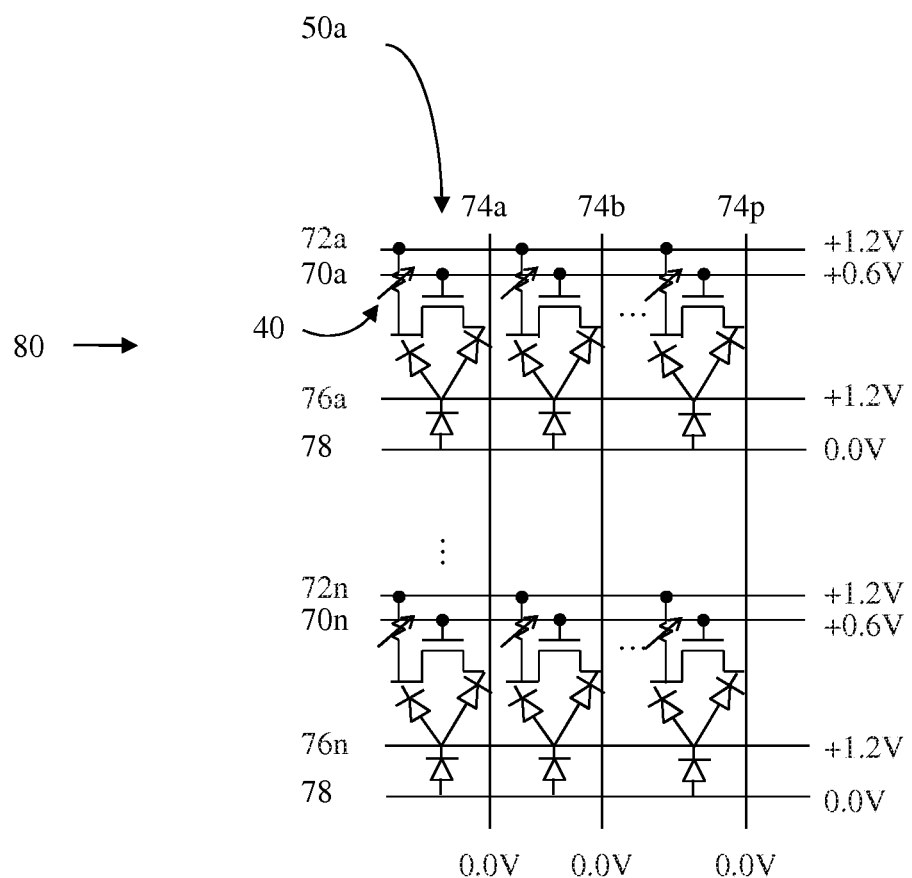
FIG. 14 is a schematic illustration showing exemplary bias conditions applied for a shadowing operation performed on a memory array according to an embodiment of the present invention.
Figure 15:
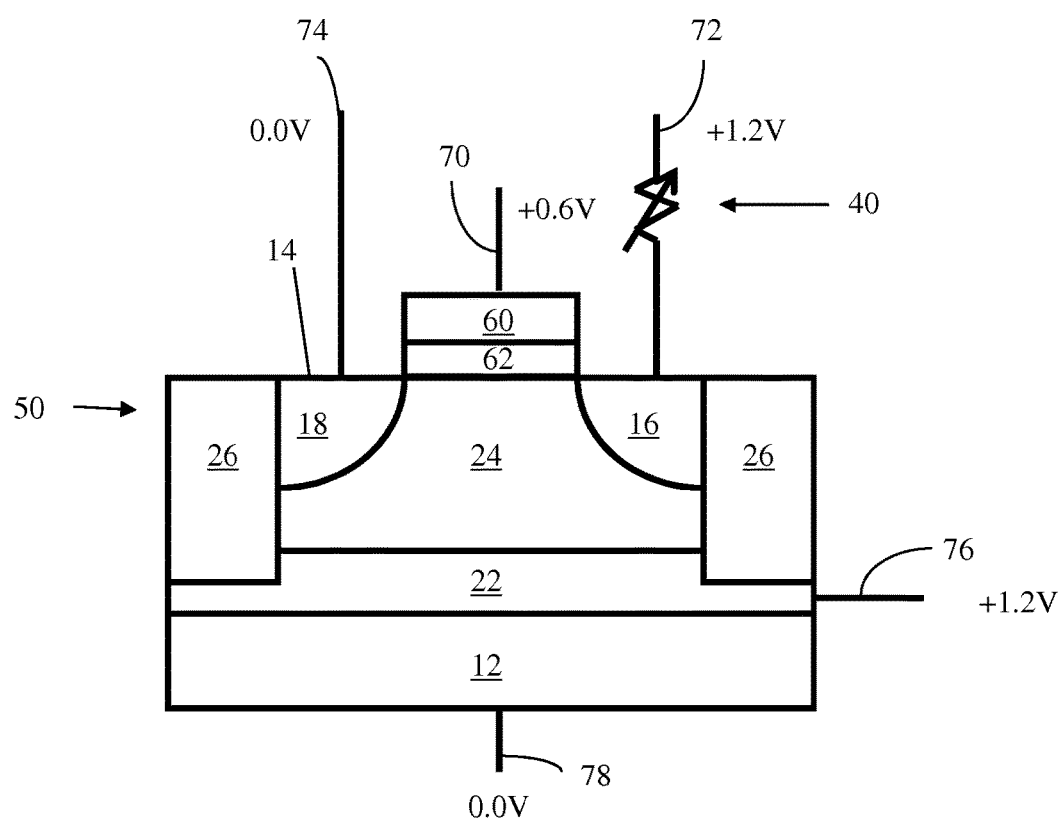
FIG. 15 illustrates exemplary bias conditions applied to the terminals of an exemplary selected memory cell from the array of FIG. 14.

When power down is detected, e.g., when a user turns off the power to cell 50, or the power is inadvertently interrupted, or for any other reason, power is at least temporarily discontinued to cell 50, data stored in the floating body region 24 is transferred to the resistance change memory 40. This operation is referred to as "shadowing" and is described with reference to FIGS. 14 and 15.

To perform a shadowing operation, a positive voltage is applied to the SL terminal 72, a positive voltage is applied to the WL terminal 70, zero voltage is applied to the BL terminal 74, zero or positive voltage is applied to the BW terminal 76, and zero voltage is applied to the substrate terminal 78. The positive voltage applied to the WL terminal 70 is between the threshold voltage of the memory cell 50 in a logic-1 state and the threshold voltage of the memory cell in a logic-0 state. The positive voltage applied to the SL terminal 72 generates an electric field sufficiently high enough to trigger an impact ionization mechanism to further increase the current flow through the memory cell 50.

When the memory cell 50 is in a logic-1 state, current will flow through the memory cell 50 from the SL terminal 72 to the BL terminal 74 and pass through resistance change memory element 46 from the top electrode 48 to the bottom electrode 44. The current flow through the memory element 46 is sufficient to switch the state of the resistance change memory 40 from a low resistivity state to a high resistivity state. Accordingly, the non-volatile resistance change memory 40 will be in a high resistivity state when the volatile memory of cell 50 is in a logic-1 state (i.e. floating body 24 is positively charged).

When the memory cell 50 is in a logic-0 state, no (or low) current will flow through the memory cell 50 because of the higher threshold voltage of the memory cell 50. Consequently, no (or low) current will flow through the resistance change memory element 46, and the resistance change memory 40 will remain in a low resistivity state. Accordingly, the non-volatile resistance change memory 40 will be in a low resistivity state when the volatile memory of cell 50 is in a logic-0 state (i.e. floating body region 24 is neutral).

In one particular non-limiting example of this embodiment, about +1.2 volts is applied to SL terminal 72, about +0.6 volts is applied to WL terminal 70, about 0.0 volts is applied to BL terminal 74, about +1.2 volts is applied to BW terminal 76, and about 0.0 volts is applied to substrate terminal 78.

Note that this process occurs non-algorithmically, as the state of the floating body 24 does not have to be read, interpreted, or otherwise measured to determine what state to write the non-volatile resistance change memory 40 to. Rather, the shadowing process occurs automatically, driven by electric potential differences. Accordingly, this process is orders of magnitude faster than one that requires algorithmic intervention. In addition, no control circuitry, such as a memory controller, is required between the volatile memory component and the non-volatile memory component, allowing for a close proximity between the floating body transistor 20 and the resistance change element 40, as shown in FIGS. 3A and 3B.

Alternatively, a shadowing operation using intrinsic bipolar transistor 30b as the selection device to govern the switching (or non-switching) of the resistance change element 40 by applying the following bias conditions: a positive voltage is applied to the SL terminal 72, zero voltage is applied to the BW terminal 76, and zero voltage is applied to the substrate terminal 78. Zero voltage can be applied to WL terminal 70 and BL terminal 74, or these terminals may be left floating.

When the memory cell 50 is in a logic-1 state, current will flow through the memory cell 50 from the SL terminal 72 to the BW terminal 76 and pass through resistance change memory element 46 from the top electrode 48 to the bottom electrode 44. The current flow through the memory element 46 is sufficient to switch the state of the resistance change memory 40 from a low resistivity state to a high resistivity state. Accordingly, the non-volatile resistance change memory 40 will be in a high resistivity state when the volatile memory of cell 50 is in a logic-1 state (i.e. floating body 24 is positively charged). When the memory cell 50 is in a logic-0 state, no (or low) current will flow through the memory cell 50 because the low potential of the floating body region 24 will turn off bipolar transistor 30b. Consequently, no (or low) current will flow through the resistance change memory element 46, and the resistance change memory 40 will remain in a low resistivity state. Accordingly, the non-volatile resistance change memory 40 will be in a low resistivity state when the volatile memory of cell 50 is in a logic-0 state (i.e. floating body region 24 is neutral).

In one particular non-limiting example of this embodiment, about +1.2 volts is applied to SL terminal 72, about 0.0 volts is applied to BW terminal 76, and about 0.0 volts is applied to substrate terminal 78, while WL terminal 70 and BL terminal 74 are left floating.

Figure 16:
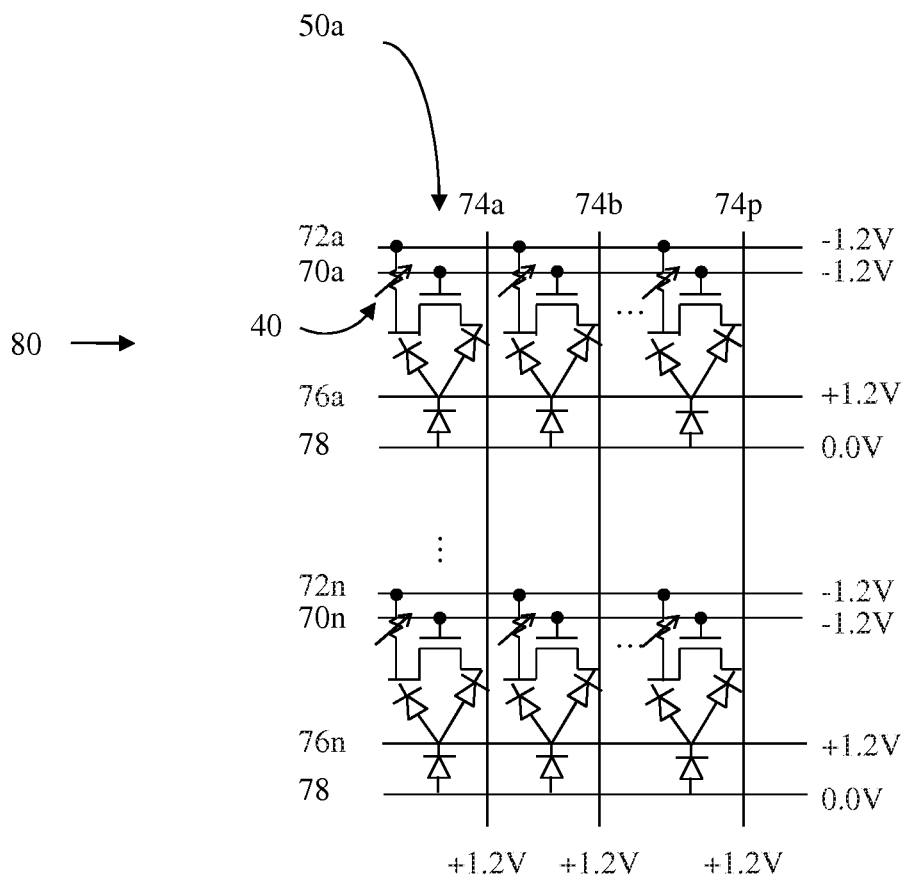
FIG. 16 is a schematic illustration showing exemplary bias conditions applied for a restore operation performed on a memory array according to an embodiment of the present invention.
Figure 17:
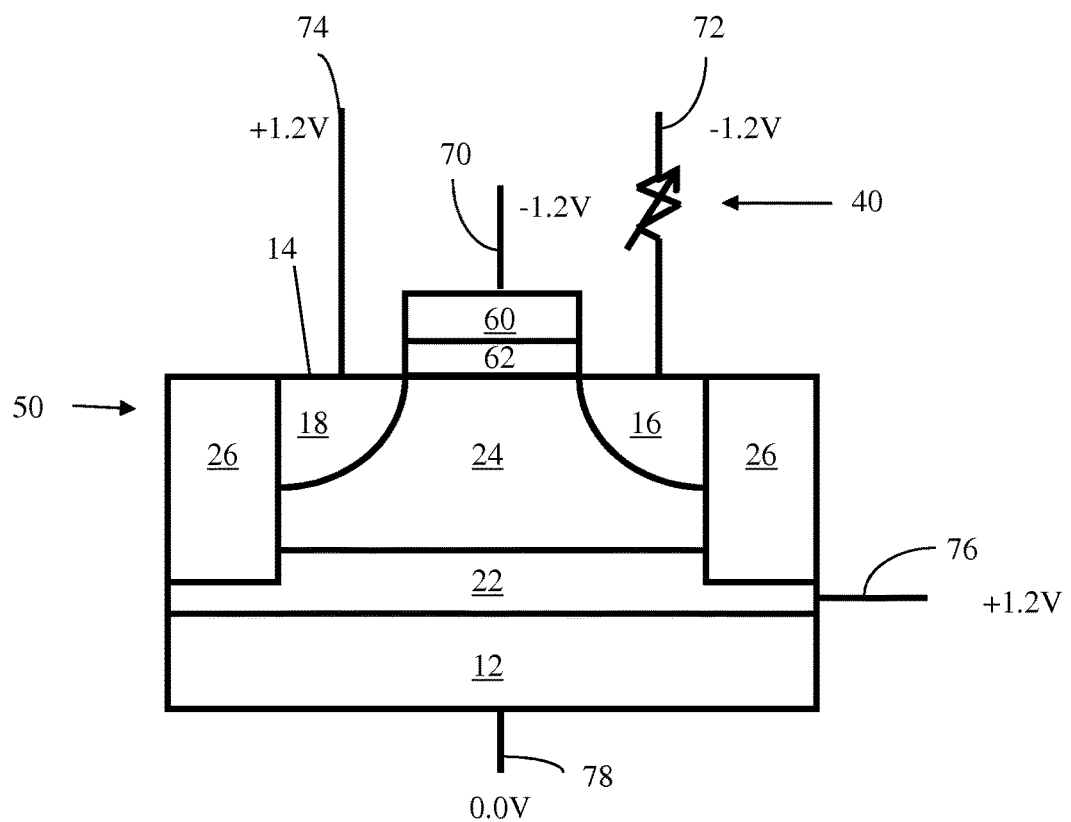
FIG. 17 illustrates exemplary bias conditions applied to the terminals of an exemplary selected memory cell from the array of FIG. 16.

When power is restored to cell 50, the state of the cell 50 as stored on the non-volatile resistance change memory 40 is restored into floating body region 24. The restore operation (data restoration from non-volatile memory to volatile memory) is described with reference to FIGS. 16 and 17. In one embodiment, to perform the restore operation, a negative voltage is applied to the WL terminal 70, a positive voltage is applied to the BL terminal 74, a negative voltage is applied to the SL terminal 72, zero or a positive voltage is applied to the BW terminal 76, and zero voltage is applied to the substrate terminal 78.

These conditions will result in band-to-band tunneling hole injection into the floating body 24. However, if the resistance change memory is in a low resistivity state, the negative voltage applied to the SL terminal 72 will evacuate holes in the floating body 24 because the p-n junction formed by the floating body 24 and the source line region 16 is forward-biased. Consequently, the volatile memory state of memory cell 50 will be restored to a logic-0 state upon completion of the restore operation, restoring the state that the memory cell 50 held prior to the shadowing operation.

If the resistance change memory 40 is in a high resistivity state, a larger voltage drop will develop across the resistance change memory 40 and no (or low) current flows through the resistance change memory 40, hence the holes accumulated in the floating body 24 will not be evacuated. As a result, the memory logic-1 state that the memory cell 50 held prior to the shadowing operation will be restored.

In one particular non-limiting example of this embodiment, about −1.2 volts is applied to the SL terminal 72, about +1.2 volts is applied to terminal 74, about −1.2 volts is applied to terminal 70, about +1.2 volts is applied to terminal 76, and about 0.0 volts is applied to the substrate terminal 78. However, these voltage levels may vary, while maintaining the relative relationships between the charges applied, as described above.

Note that this process occurs non-algorithmically, as the state of the non-volatile resistance change memory 40 does not have to be read, interpreted, or otherwise measured to determine what state to restore the floating body 24 to. Rather, the restoration process occurs automatically, driven by resistivity state differences. Accordingly, this process is orders of magnitude faster than one that requires algorithmic intervention. In addition, no control circuitry, such as a memory controller, is required between the volatile memory component and the non-volatile memory component, allowing for a close proximity between the floating body transistor 20 and the resistance change element 40, as shown in FIGS. 3A and 3B.

After restoring the memory cell(s) 50, the resistance change memory(ies) 40 is/are reset to a predetermined state, e.g., a low resistivity state, so that each resistance change memory 40 has a known state prior to performing another shadowing operation.

Figure 18:
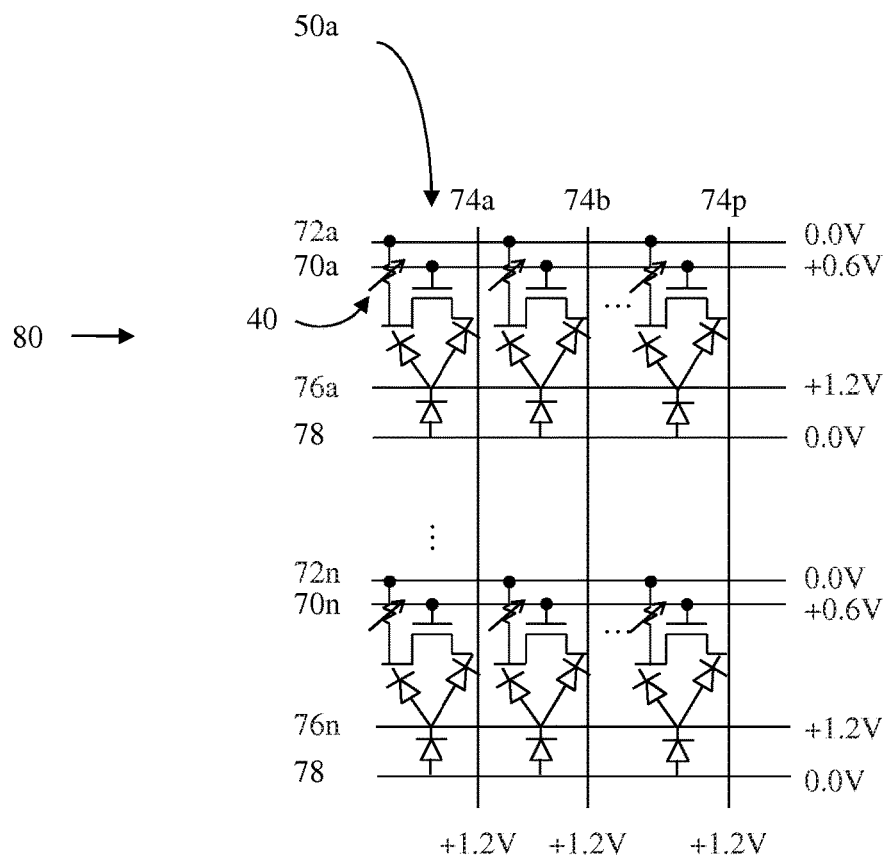
FIG. 18 is a schematic illustration showing exemplary bias conditions applied for a reset operation performed on a memory array according to an embodiment of the present invention.
Figure 19:
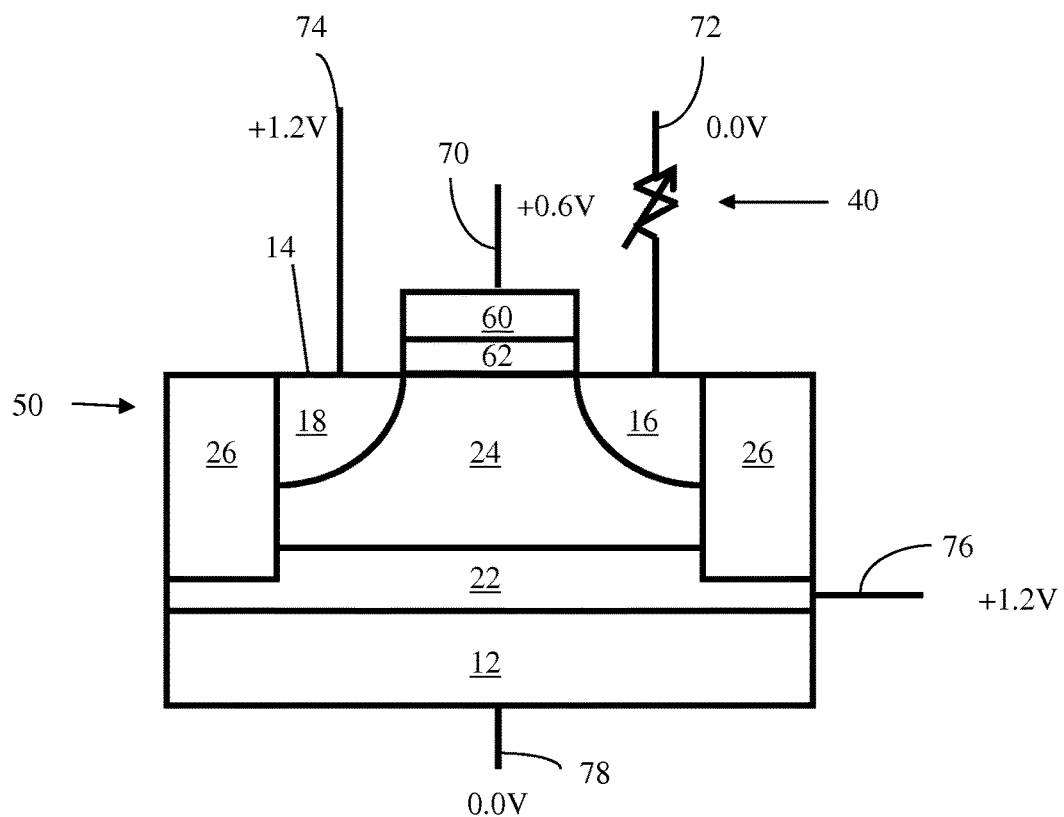
FIG. 19 illustrates exemplary bias conditions applied to the terminals of an exemplary selected memory cell from the array of FIG. 18.

FIGS. 18 and 19 illustrate a reset operation performed on a memory array 80 and a memory cell 50, respectively. To perform a reset operation, a positive voltage is applied to the BL terminal 74, a positive voltage is applied to the WL terminal 70, zero voltage is applied to the SL terminal 72, zero or positive voltage is applied to the BW terminal 76, and zero voltage is applied to the substrate terminal 78. The positive voltage applied to the WL terminal 70 is between the threshold voltage of the memory cell 50 in a logic-1 state and the threshold voltage of the memory cell in a logic-0 state. The positive voltage applied to the BL terminal 74 generates an electric field sufficiently high enough to trigger an impact ionization mechanism to further increase the current flow through the memory cell 50.

When the memory cell 50 is in a logic-1 state, current will flow through the memory cell 50 from the BL terminal 74 to the SL terminal 72 and pass through resistance change memory element 46 from the bottom electrode 44 to the top electrode 48. The current flow through the memory element 46 is sufficient to switch the state of the resistance change memory 40 from a high resistivity state to a low resistivity state. Accordingly, the non-volatile resistance change memory 40 will be in a low resistivity state when the volatile memory of cell 50 is in a logic-1 state (i.e. floating body 24 is positively charged). Note that the current flow (or voltage difference between the top electrode and bottom electrode of the resistance change memory 40) direction during the reset operation is the opposite of that during the shadowing operation. The floating body transistor 20 allows for current flow in both directions, depending on the mode of operations of the memory cell 50.

When the memory cell 50 is in a logic-0 state, no (or low) current will flow through the memory cell 50 because of the higher threshold voltage of the memory cell 50. Consequently, no (or low) current will flow through the resistance change memory element 46 and the resistance change memory 40 will remain in a low resistivity state. Accordingly, the non-volatile resistance change memory 40 will be in a low resistivity state when the volatile memory of cell 50 is in a logic-0 state (i.e. floating body region 24 is neutral).

In one particular non-limiting example of this embodiment, about 0.0 volts is applied to SL terminal 72, about +0.6 volts is applied to WL terminal 70, about +1.2 volts is applied to BL terminal 74, about +1.2 volts is applied to BW terminal 76, and about 0.0 volts is applied to substrate terminal 78.

Alternatively, a reset operation using intrinsic bipolar transistor 30b as the selection device to govern the switching (or non-switching) of the resistance change element 40 by applying the following bias conditions: a positive voltage is applied to the BW terminal 76, zero voltage is applied to the SL terminal 72, and zero voltage is applied to the substrate terminal 78. Zero voltage can be applied to WL terminal 70 and BL terminal 74, or these terminals may be left floating.

When the memory cell 50 is in a logic-1 state, current will flow through the memory cell 50 from the BW terminal 76 to the SL terminal 72 and pass through resistance change memory element 46 from the bottom electrode 44 to the top electrode 48. The current flow through the memory element 46 is sufficient to switch the state of the resistance change memory 40 from a high resistivity state to a low resistivity state. Accordingly, the non-volatile resistance change memory 40 will be in a low resistivity state when the volatile memory of cell 50 is in a logic-1 state (i.e. floating body 24 is positively charged). Note that the current flow (or voltage difference between the top electrode and bottom electrode of the resistance change memory 40) direction during the reset operation is the opposite of that during the shadowing operation. The bipolar transistor 30b allows for current flow in both directions, depending on the mode of operations of the memory cell 50.

When the memory cell 50 is in a logic-0 state, no (or low) current will flow from the BW terminal 76 to the SL terminal 72 because the low potential of the floating body region 24 will turn off bipolar transistor 30b. Consequently, no (or low) current will flow through the resistance change memory element 46 and the resistance change memory 40 will remain in a low resistivity state. Accordingly, the non-volatile resistance change memory 40 will be in a low resistivity state when the volatile memory of cell 50 is in a logic-0 state (i.e. floating body region 24 is neutral).

In one particular non-limiting example of this embodiment, about 0.0 volts is applied to SL terminal 72, about +1.2 volts is applied to BW terminal 76, and about 0.0 volts is applied to substrate terminal 78, while WL terminal 70 and BL terminal 74 are left floating.

Figure 20:
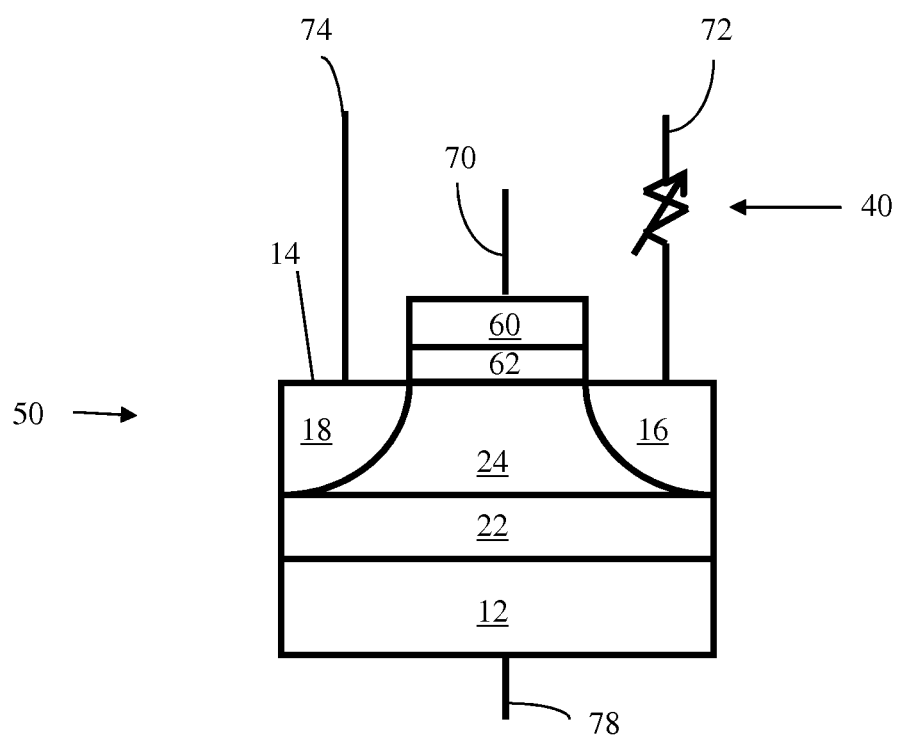
FIG. 20 is a cross-sectional, schematic illustration of a memory cell fabricated on a silicon-on-insulator (SOI) substrate according to another embodiment of the present invention.

Memory cell 50 may alternatively be fabricated on a silicon-on-insulator (SOI) substrate as illustrated in FIG. 20, where a buried insulator 22, an illustrative, non-exclusive example of which includes a buried oxide layer, bounds the floating body 24 at the bottom.

Figure 21A:
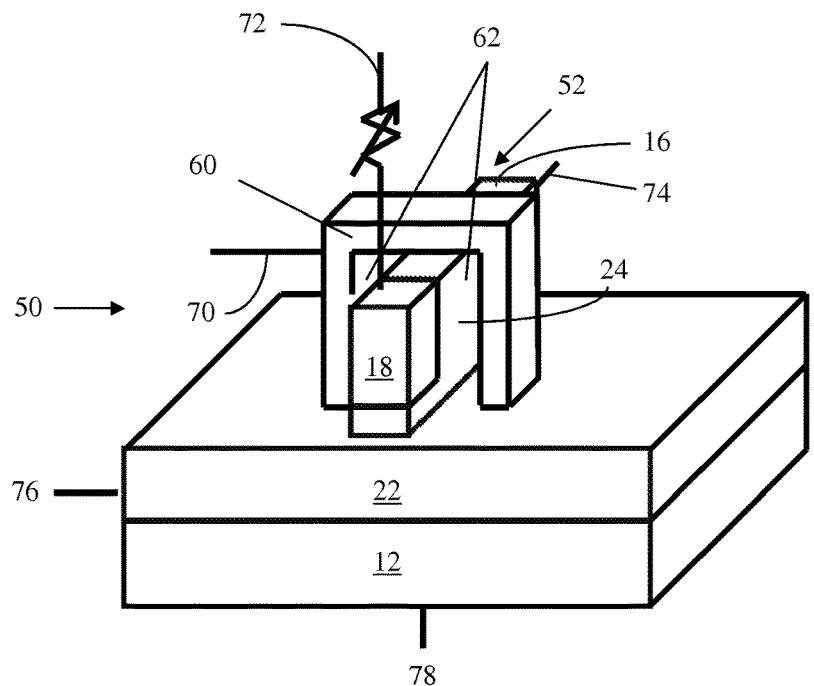
FIGS. 21A and 21B illustrate cross-sectional and top view schematic illustrations of a fin-type memory cell device according to another embodiment of the present invention, respectively.
Figure 21B:
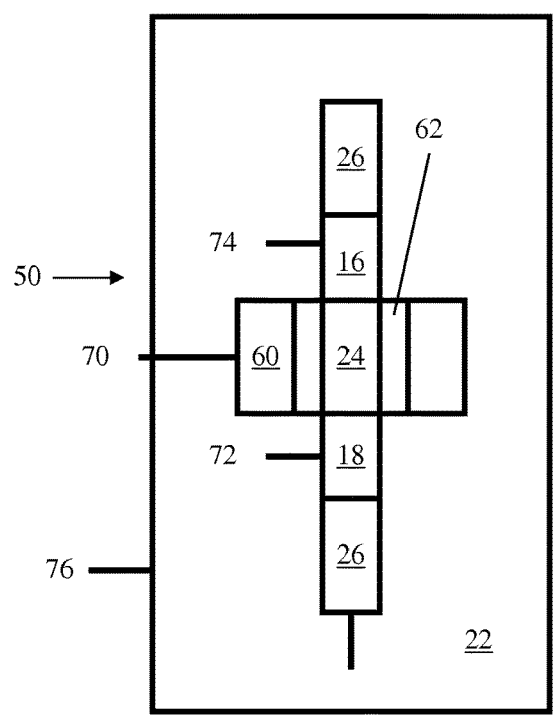

In addition, memory cell 50 may alternatively comprise a three-dimensional structure as shown in FIGS. 21A and 21B, where the memory cell 50 comprise a fin structure 52, extending substantially perpendicular to, and above the top surface of the substrate 12/buried insulator 22.

Figure 22:
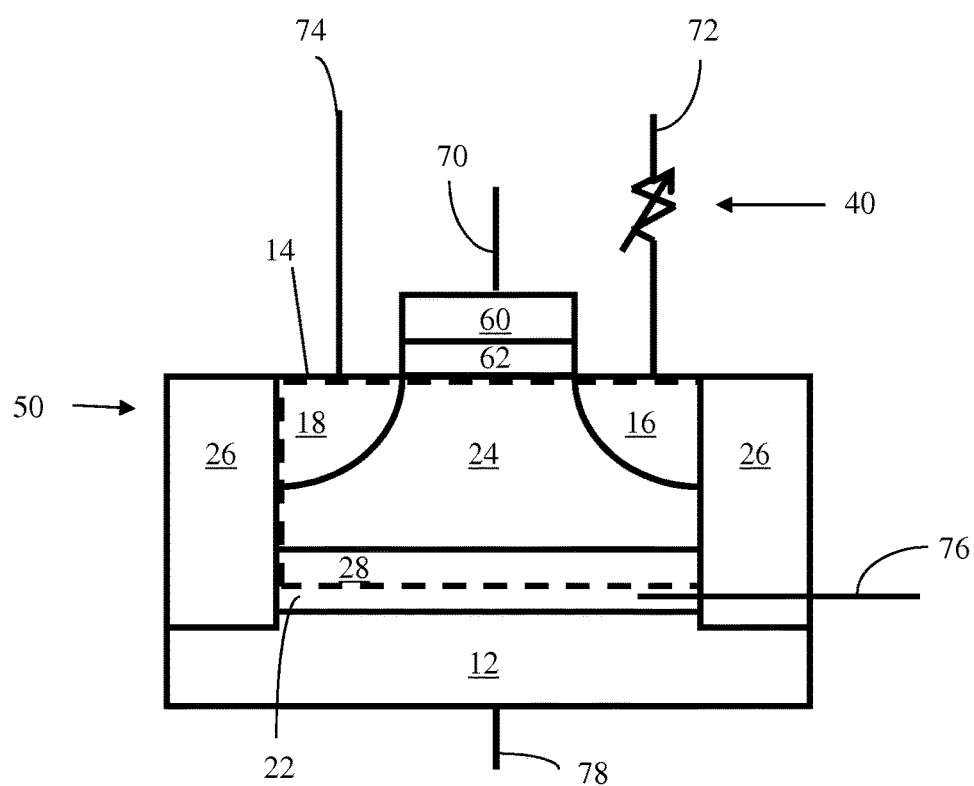
FIG. 22 is a cross-sectional, schematic illustration of a memory cell according to another embodiment of the present invention.

In another alternative embodiment, memory cell 50 may be insulated from neighboring memory cells 50 by an insulating layer 26 and a shallower insulating layer 28, as shown in FIG. 22, where the shallower insulating layer 28 is shown in dashed lines. The shallower insulating layer 28 insulates the floating body region 24, but allows the buried layer 22 to be continuous in the perpendicular direction of the cross-sectional view shown in FIG. 22. Since the buried layer 22 of memory cells 50 is continuous in one direction, but is insulated in the other perpendicular direction (by the insulating layer 26), buried layer 22 may be used in memory cell access selection and define a row (or column) direction. Memory cell 50 may then operate in volatile mode independent of the resistivity state of the resistance change memory 40. The volatile mode operation of memory cell 50 will be similar to the half-transistor floating body memory cell, defined by the gate 60, bit line region 18, buried well region 22, as described for example in U.S. application Ser. No. 12/897,538, "A Semiconductor Memory Device Having an Electrically Floating Body Transistor" ("Widjaja-4"), and in U.S. application Ser. No. 12/897,516, "A Semiconductor Memory Device Having an Electrically Floating Body Transistor" ("Widjaja-5"), both which are hereby incorporated herein, in their entireties, by reference thereto.

In another alternative embodiment, the initial state of the resistance change memory element 40 may be in a high resistivity state. In this embodiment, due to the a high resistance memory element 40 electrically connected to the SL terminal 72, the volatile operation of memory cell 50 may employ the silicon controlled rectifier (SCR) principle as described, for example, in Widjaja-2, or the half-transistor floating body memory cell described, for example, in Widjaja-4 and Widjaja-5. The volatile operation of memory cell 50 will utilize WL terminal 70, BL terminal 74, BW terminal 76, and substrate terminal 78.

To perform a shadowing operation, a positive voltage is applied to the BL terminal 74, a positive voltage is applied to the WL terminal 70, zero voltage is applied to the SL terminal 72, zero or positive voltage is applied to the BW terminal 76, and zero voltage is applied to the substrate terminal 78. The positive voltage applied to the WL terminal 70 is between the threshold voltage of the memory cell 50 in a logic-1 state and the threshold voltage of the memory cell in a logic-0 state. The positive voltage applied to the BL terminal 74 generates an electric field sufficiently high enough to trigger an impact ionization mechanism to further increase the current flow through the memory cell 50.

When the memory cell 50 is in a logic-1 state, current will flow through the memory cell 50 from the BL terminal 74 to the SL terminal 72 and pass through resistance change memory element 46 from the bottom electrode 44 to the top electrode 48. The current flow through the memory element 46 is sufficient to switch the state of the resistance change memory 40 from a high resistivity state to a low resistivity state. Accordingly, the non-volatile resistance change memory 40 will be in a low resistivity state when the volatile memory of cell 50 is in a logic-1 state (i.e. floating body 24 is positively charged).

When the memory cell 50 is in a logic-0 state, no (or low) current will flow through the memory cell 50 because of the higher threshold voltage of the memory cell 50. Consequently, no (or low) current will flow through the resistance change memory element 46 and the resistance change memory 40 will remain in a low resistivity state. Accordingly, the non-volatile resistance change memory 40 will remain in a high resistivity state when the volatile memory of cell 50 is in a logic-0 state (i.e. floating body region 24 is neutral).

In one particular non-limiting example of this embodiment, about 0.0 volts is applied to SL terminal 72, about +0.6 volts is applied to WL terminal 70, about +1.2 volts is applied to BL terminal 74, about +1.2 volts is applied to BW terminal 76, and about 0.0 volts is applied to substrate terminal 78.

Note that this process occurs non-algorithmically, as the state of the floating body 24 does not have to be read, interpreted, or otherwise measured to determine what state to write the non-volatile resistance change memory 40 to. Rather, the shadowing process occurs automatically, driven by electric potential differences. Accordingly, this process is orders of magnitude faster than one that requires algorithmic intervention. In addition, no control circuitry, such as a memory controller, is required between the volatile memory component and the non-volatile memory component, allowing for a close proximity between the floating body transistor 20 and the resistance change element 40, as shown in FIGS. 3A and 3B. A restore operation may be performed using a band-to-band tunneling operation by applying the following bias conditions: a negative voltage is applied to the WL terminal 70, a positive voltage is applied to the SL terminal 72, zero voltage is applied to the BL terminal 74, zero or positive voltage is applied to the BW terminal 76, and zero voltage is applied to the substrate terminal 78.

If resistance change memory element 40 is in a low resistivity state, these conditions will result in result in band-to-band tunneling hole injection into the floating body 24. However, if the resistance change memory is in a high resistivity state, the SL terminal 72 acts as an open circuit, and as a result, the electric field in the source line region 16 near the gate 60 is not sufficient to generate holes through band-to-band tunneling mechanism.

In one particular non-limiting example of this embodiment, about −1.2 volts is applied to the WL terminal 70, about +1.2 volts is applied to SL terminal 72, about 0.0 volts is applied to BL terminal 74, about +1.2 volts is applied to BW terminal 76, and about 0.0 volts is applied to substrate terminal 78.

Note that this process occurs non-algorithmically, as the state of the floating body 24 does not have to be read, interpreted, or otherwise measured to determine what state to write the non-volatile resistance change memory 40 to. Rather, the restore process occurs automatically, driven by electric potential differences. Accordingly, this process is orders of magnitude faster than one that requires algorithmic intervention. In addition, no control circuitry, such as a memory controller, is required between the volatile memory component and the non-volatile memory component, allowing for a close proximity between the floating body transistor 20 and the resistance change element 40, as shown in FIGS. 3A and 3B.

To perform a reset operation, a positive voltage is applied to the SL terminal 72, a positive voltage is applied to the WL terminal 70, zero voltage is applied to the BL terminal 74, zero or positive voltage is applied to the BW terminal 76, and zero voltage is applied to the substrate terminal 78. The positive voltage applied to the WL terminal 70 is between the threshold voltage of the memory cell 50 in a logic-1 state and the threshold voltage of the memory cell in a logic-0 state. The positive voltage applied to the SL terminal 72 generates an electric field sufficiently high enough to trigger an impact ionization mechanism to further increase the current flow through the memory cell 50.

When the memory cell 50 is in a logic-1 state, current will flow through the memory cell 50 from the SL terminal 72 to the BL terminal 74 and pass through resistance change memory element 46 from the top electrode 48 to the bottom electrode 44. The current flow through the memory element 46 is sufficient to switch the state of the resistance change memory 40 from a low resistivity state to a high resistivity state.

When the memory cell 50 is in a logic-0 state, no (or low) current will flow through the memory cell 50 because of the higher threshold voltage of the memory cell 50. Consequently, no (or low) current will flow through the resistance change memory element 46 and the resistance change memory 40 will remain in a high resistivity state. Accordingly, all the non-volatile resistance change memory 40 will be initialized to a high resistivity state.

In one particular non-limiting example of this embodiment, about +1.2 volts is applied to SL terminal 72, about +0.6 volts is applied to WL terminal 70, about 0.0 volts is applied to BL terminal 74, about +1.2 volts is applied to BW terminal 76, and about 0.0 volts is applied to substrate terminal 78.

Note that this process occurs non-algorithmically, as the state of the floating body 24 does not have to be read, interpreted, or otherwise measured to determine what state to write the non-volatile resistance change memory 40 to. Rather, the reset process occurs automatically, driven by electric potential differences. Accordingly, this process is orders of magnitude faster than one that requires algorithmic intervention. In addition, no control circuitry, such as a memory controller, is required between the volatile memory component and the non-volatile memory component, allowing for a close proximity between the floating body transistor 20 and the resistance change element 40, as shown in FIGS. 3A and 3B.

The integrated circuit device 90 may also comprise of a counter circuit 82, which may determine if a memory cell 50 (or a group of memory cells 50, the group may comprise of for example a row of memory cells 50 or a few rows of memory cells 50) is in volatile mode operation and has not been accessed for a certain period of time, for example, one second, although this predetermined time period may vary as a matter of design choice. Once the memory cell 50 is idle for greater than an elapsed time threshold (i.e., the predetermined time period), the memory cell 50 (or a group of memory cells 50) may be put into the non-volatile state through the shadowing operation. Since memory cell 50 does not require power to maintain its states, this operation thus results in a lower operating power of the integrated circuit device 90.

Figure 23:
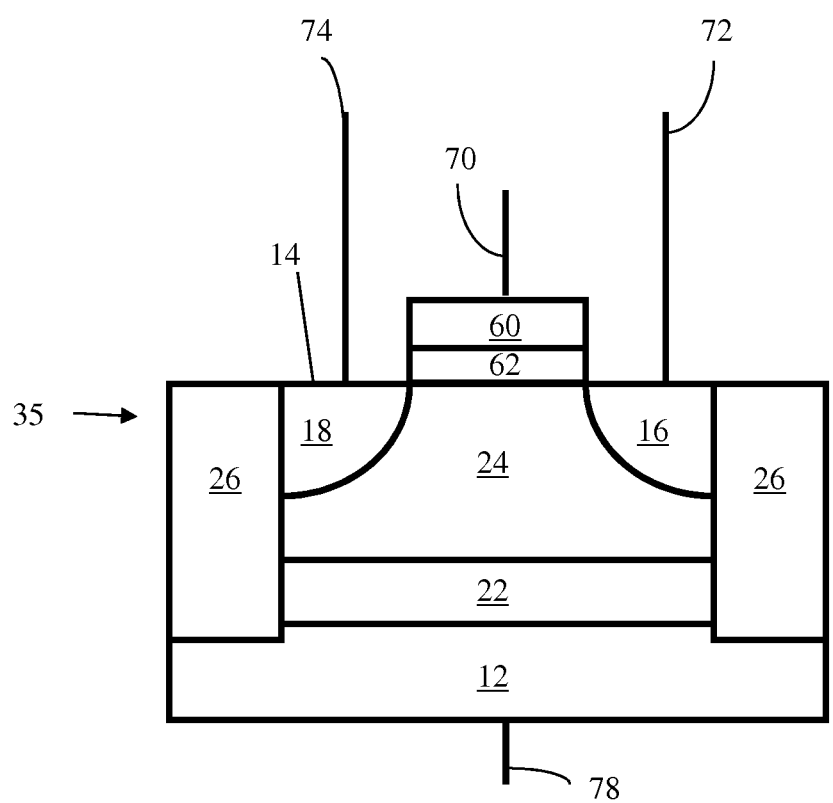
FIG. 23 is a cross-sectional view of a memory cell according to an embodiment of the present invention.

FIG. 23 shows an illustrative, non-exclusive example of an embodiment of memory cell 35. Cell 35 is formed in and/or on a substrate 12 of a first conductivity type, such as a p-type conductivity type, for example. Substrate 12 may include any suitable substrate, illustrative, non-exclusive examples of which include silicon, germanium, silicon germanium, gallium arsenide, carbon nanotubes, and/or other semiconductor materials. In some embodiments of the invention, substrate 12 may be the bulk material of the semiconductor wafer. In other embodiments, substrate 12 can may be a well of the first conductivity type embedded in either a well of the second conductivity type or, alternatively, in the bulk of the semiconductor wafer of the second conductivity type, such as n-type, for example, (not shown in the figures). To simplify the description, the substrate 12 will usually be drawn as the semiconductor bulk material as it is in FIG. 23.

Substrate 12 has a surface 14 and includes a buried layer 22 of a second conductivity type, such as n-type conductivity type. Buried layer region 22 may be formed using any suitable process and/or method performed on the material of substrate 12, illustrative, non-exclusive examples of which include ion implantation process and/or epitaxial growth. Buried layer region 22 is bounded on the side by insulating layer 26. Insulating layer 26 may be formed from any suitable insulating and/or dielectric materials, one illustrative, non-exclusive example of which includes silicon dioxide.

Memory cell 35 includes a first region 16 having a second conductivity type, such as n-type conductivity type, that is formed in substrate 12, and a second region 18 having a second conductivity type, that is formed in substrate 12 and spaced apart from the first region 16. First and second regions 16 and 18, respectively, are exposed at surface 14 and may be formed using any suitable method and/or process, illustrative, non-exclusive examples of which include ion implantation, solid state diffusion, and/or epitaxial growth.

Figure 25:
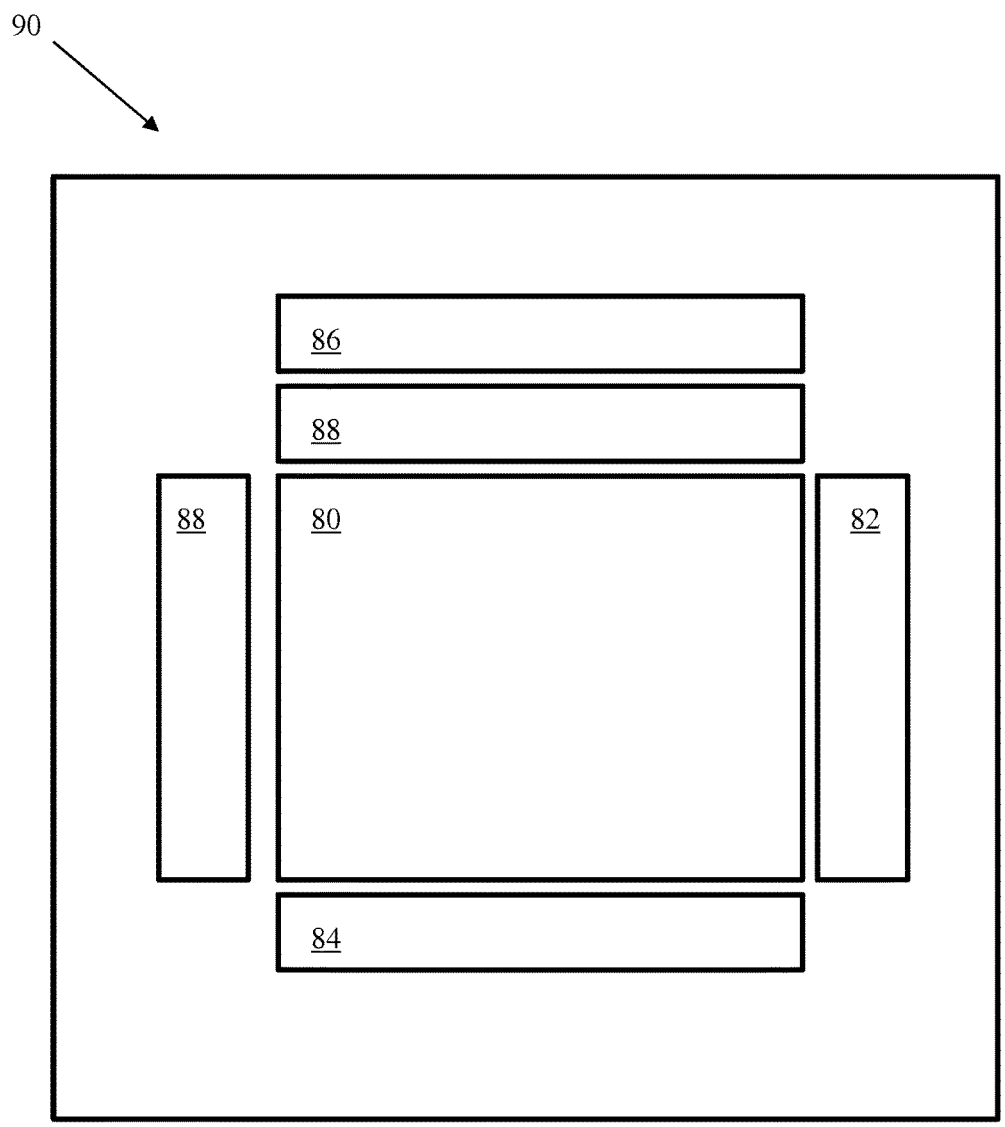
FIG. 25 illustrates an integrated circuit device comprising a memory array comprising of a plurality of memory cells shown in FIG. 23.

A floating body region 24 of the substrate 12 having a first conductivity type, such as p-type conductivity type, is bounded by surface 14, first and second regions 16 and 18, buried layer 22, and insulating layer 26. The floating body region 24 may be formed using any suitable method and/or process such as ion implantation, solid state diffusion, and/or epitaxial growth. Insulating layers 26 may insulate cell 35 from neighboring cells 35 when multiple cells 35 are joined in an array 80 to form a memory device 90 as illustrated in FIG. 25.

A gate 60 may be positioned in between regions 16 and 18, and above the surface 14. Gate 60 is insulated from surface 14 by an insulating layer 62. Insulating layer 62 may be formed from any suitable dielectric material, illustrative, non-exclusive examples of which include silicon oxide, high-K dielectric materials, tantalum peroxide, titanium oxide, zirconium oxide, hafnium oxide, and/or aluminum oxide. Gate 60 may be made from any suitable conductive material, illustrative, non-exclusive examples of which include a polysilicon material, a metal gate electrode, tungsten, tantalum, titanium and/or their nitrides.

Cell 35 further includes a word line (WL) terminal 70 electrically connected to gate 60, a source line (SL) terminal 72 electrically connected to region 16, a bit line (BL) terminal 74 electrically connected to region 18, and a substrate terminal 78 electrically connected to substrate 12. The floating body region 24 and buried layer region 22 are not connected to any terminals and may be considered floating.

As discussed in more detail herein, the conductivity types described above are exemplary conductivity types and other conductivity types and/or relative conductivity types are also within the scope of the present disclosure. As an illustrative, non-exclusive example, memory cell 35 may have and/or include a p-type conductivity type as the first conductivity type and n-type conductivity type as the second conductivity type.

Figure 24A:
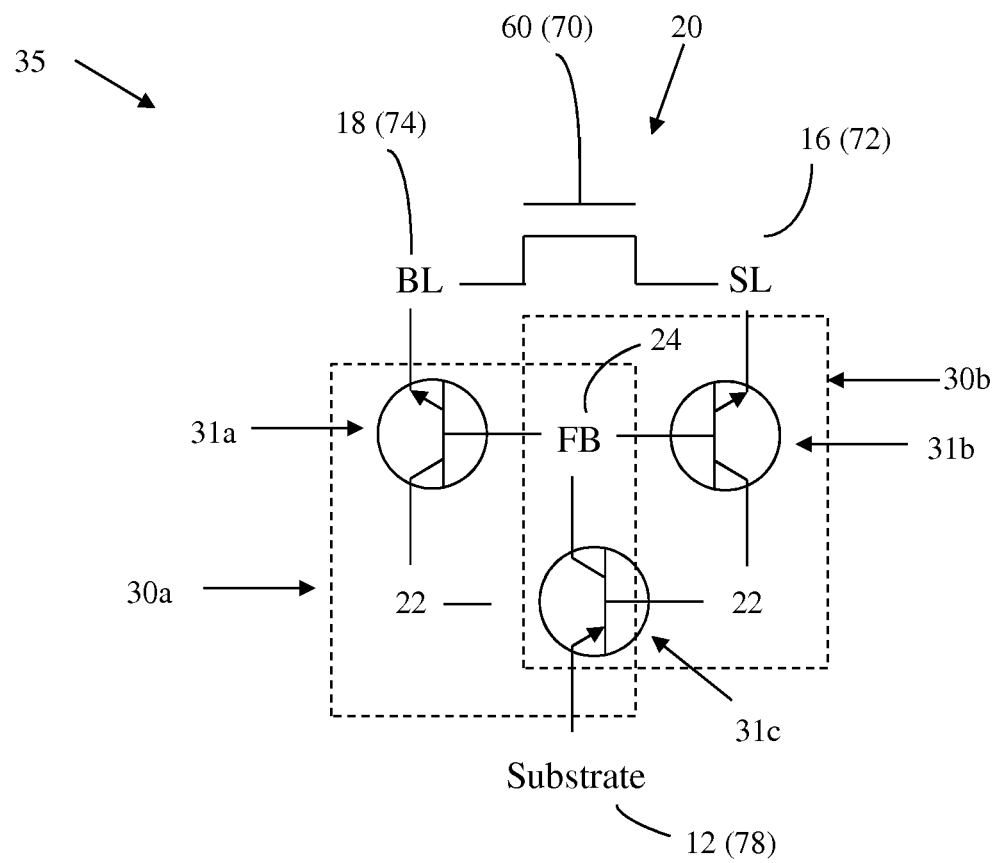
FIGS. 24A through 24C schematically illustrate an equivalent circuit representation of the memory cell shown in FIG. 23.

FIG. 24A illustrates an equivalent circuit representation of memory cell 35. Inherent in memory cell 35 are metal-oxide-semiconductor (MOS) transistor 20, formed by source line region 16, gate 60, bit line region 18, and floating body region 24, and silicon controlled rectifier (SCR) p-n-p-n devices 30a and 30b formed by substrate 12, buried well layer 22, floating body 24, and source line region 16 and bit line region 18, respectively. The SCR device 30a is formed by the interacting n-p-n bipolar device 31a (formed by source line region 16, floating body 24, and buried layer 22) and p-n-p bipolar device 31c (formed by floating body 24, buried layer 22, and substrate 12), while the SCR device 30b is formed by the interacting n-p-n bipolar device 31b (formed by bit line region 18, floating body 24, and buried layer 22) and p-n-p bipolar device 31c.

Figure 24B:
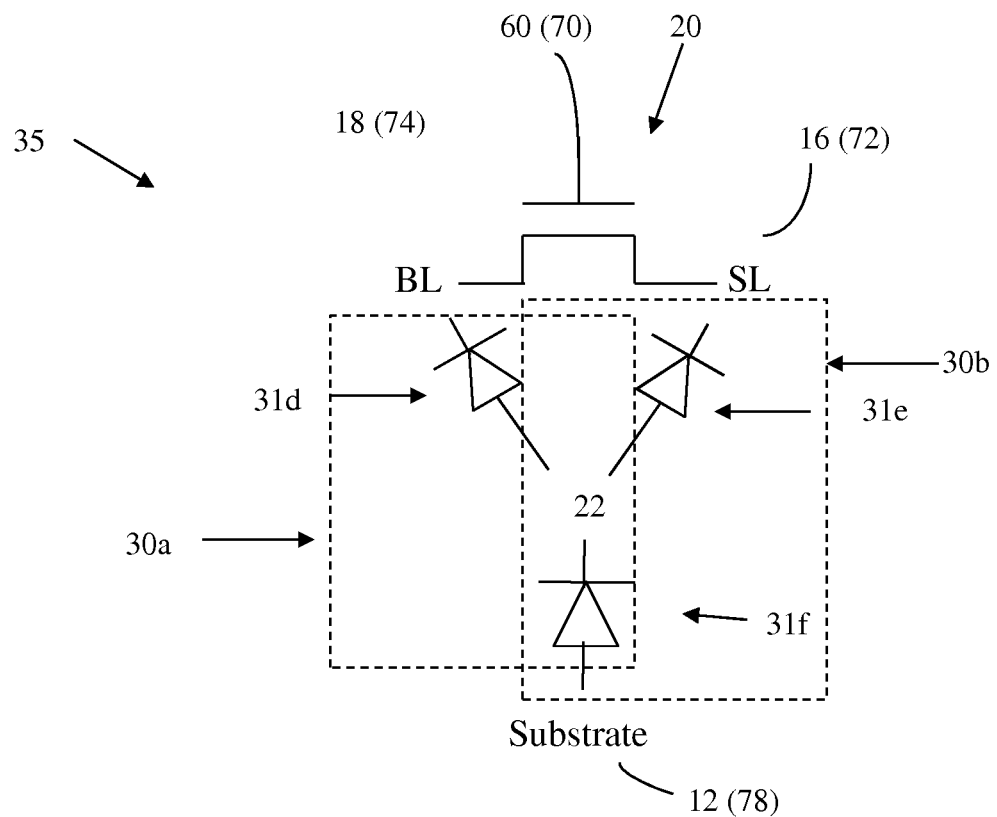

FIG. 24B also illustrates another equivalent circuit representation of memory cell 35, where the SCR device 30a and 30b are illustrated as back-to-back p-n diodes. The SCR device 30a is formed by the p-n diodes 31d (formed by floating body 24 and source line region 16) and 31f (formed by substrate 12 and buried well 22), while the SCR device 30a is formed by the p-n diodes 31e (formed by floating body 24 and bit line region 18) and 31f.

Figure 24C:
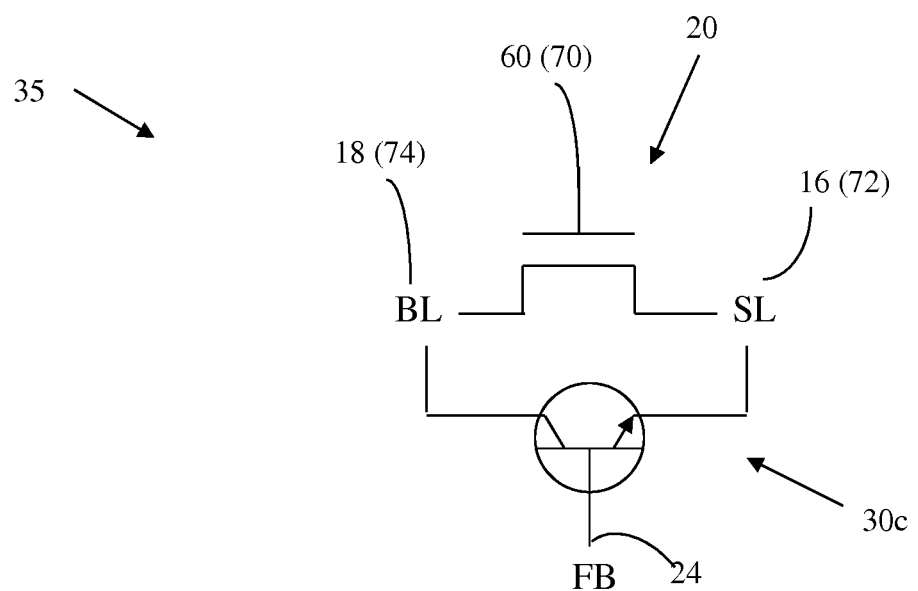

Also inherent in memory device 35 is bipolar device 30c, formed by source line region 16, floating body 24, and bit line region 18. For drawings clarity, bipolar device 30c is shown separately in FIG. 24C.

In memory cell 35, the current may flow in either direction, from the bit line region 18 (connected to the BL terminal 74) to the source line region 16 (connected to the SL terminal 72), or vice versa. The MOS transistor 20 may also be asymmetric, as described for example in U.S. application Ser. No. 13/244,899 "Asymmetric Semiconductor Memory Device Having Electrically Floating Body Transistor" ("Widjaja-3"), which is hereby incorporated herein, in its entirety, by reference thereto. An asymmetric cell may conduct different amounts of current, depending on the direction of the current flow.

Figure 26A:
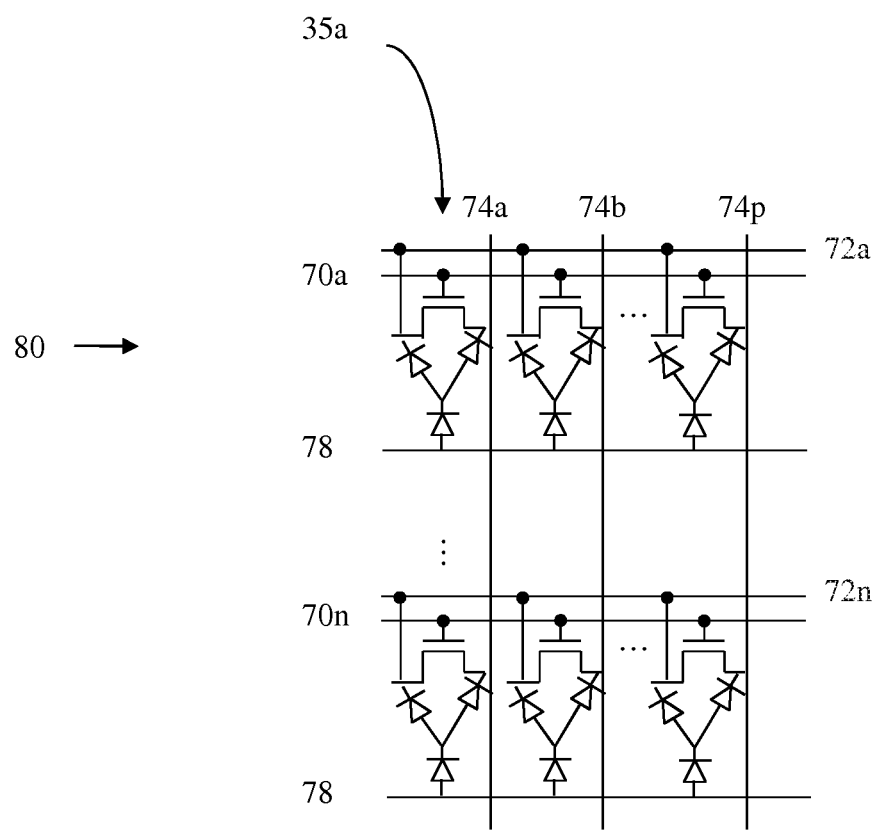
FIGS. 26A and 26B schematically illustrate multiple cells of the type shown in FIGS. 24A-24C joined to make a memory array.
Figure 26B:
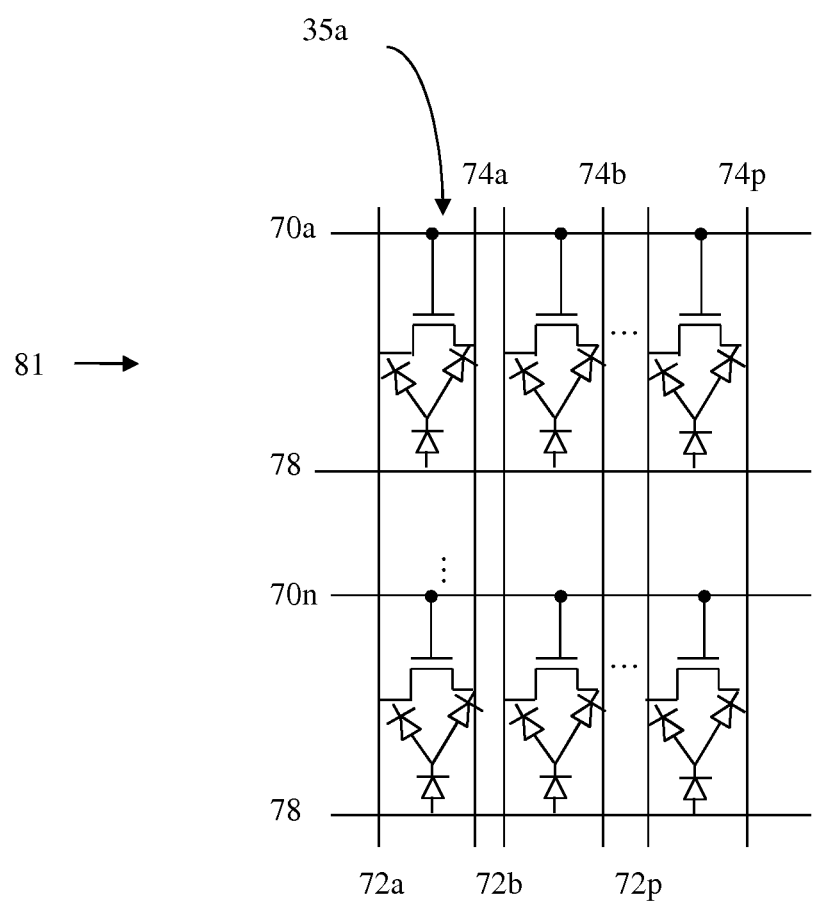

FIG. 25 illustrates an integrated circuit device 90, which may comprise of memory array 80 formed by plurality of memory cells 35 arranged in rows and columns, and periphery circuitry, illustrative, non-exclusive examples of which include reference cell 82, read circuitry 84, write circuitry 86, and address decoder 88. The memory array 80 may include at least 16 memory cells 35, or up to and including 1 terabit of memory cells 35. The integrated circuit device 90 may be a memory device or an integrated circuit device comprising of embedded memory, illustrative, non-exclusive examples of which include microprocessors, networking, communication, and field-programmable logic devices. FIGS. 26A and 26B illustrate examples of memory arrays 80 and 81 formed by a plurality of memory cells 35. The memory array 81 shown in FIG. 26B comprises of links of a plurality of memory cells 35 connected in parallel, for example as described in U.S. application Ser. No. 12/897,528 "Compact Semiconductor Memory Device Having Reduced Number of Contacts, Methods of Operating and Methods of Making" ("Widjaja-6"), which is hereby incorporated herein, in its entirety, by reference thereto. For simplicity, only memory array 80 will be shown from hereon.

Figure 27:
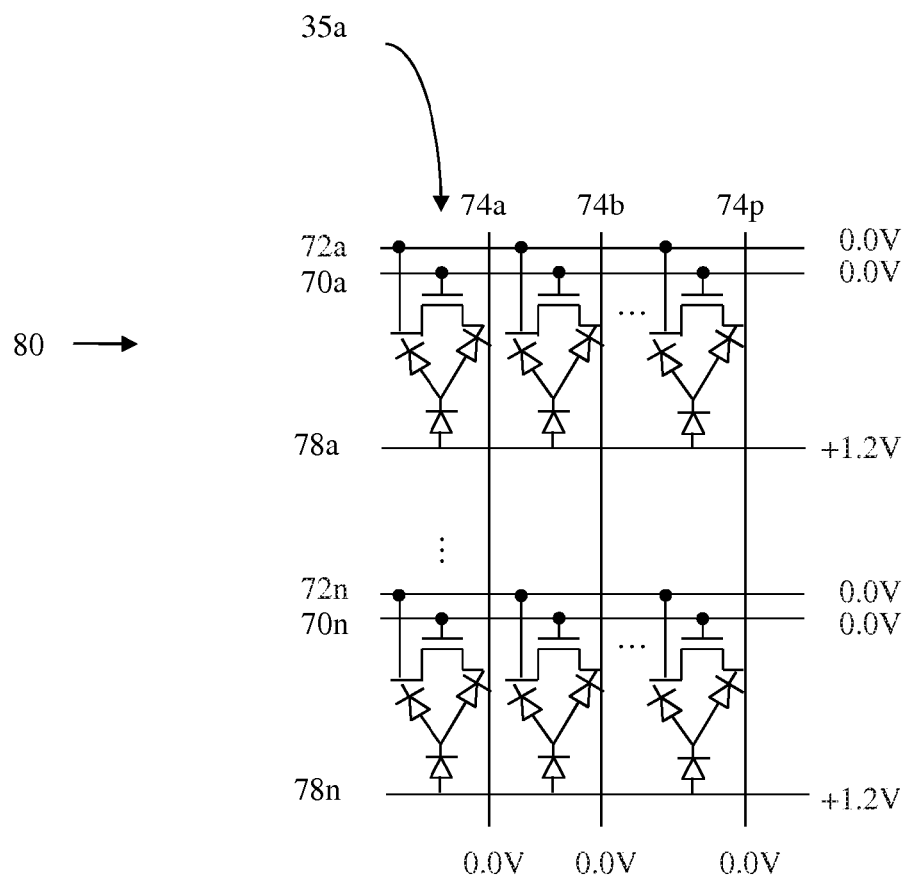
FIG. 27 schematically illustrates performance of a holding operation on a memory array according to an embodiment of the present invention.
Figure 28:
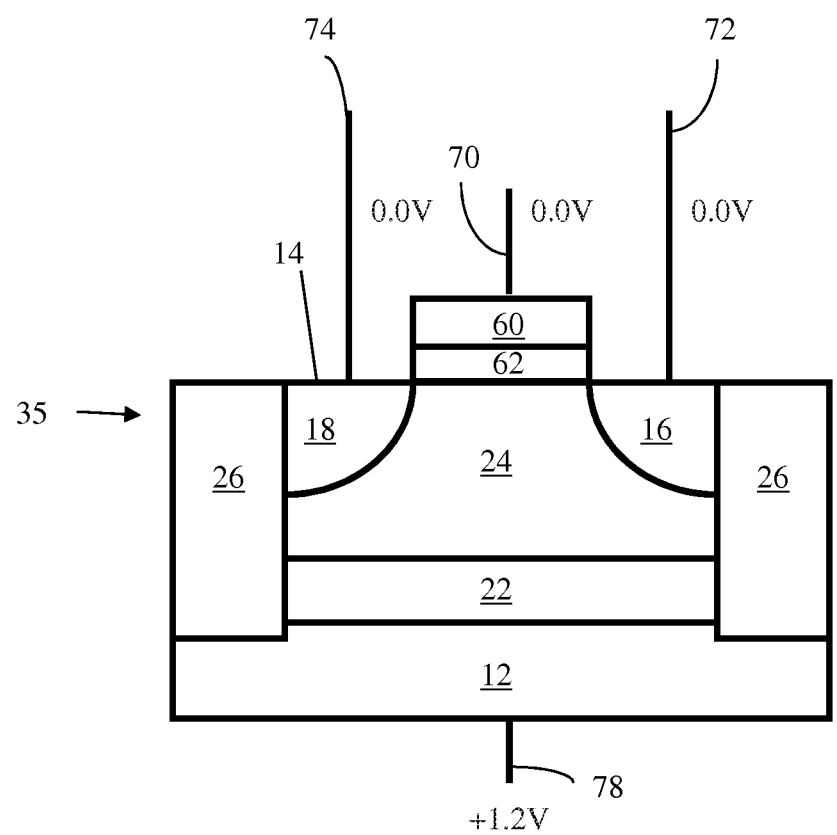
FIG. 28 illustrates exemplary bias conditions applied on the terminals of a memory cell of the array of FIG. 27.

Several operations may be performed on memory cell 35 during, such as holding, read, write logic-1, and write logic-0 operations. FIG. 27 schematically illustrates performance of a holding operation on memory array 80, while FIG. 28 shows the bias applied on the terminals of a memory cell 35 during the holding operation, according to an exemplary, non-limiting embodiment. The holding operation is performed by applying a positive back bias to the substrate terminal 78, and zero or negative bias on the WL terminal 70, zero voltage to BL terminal 74 and SL terminal 72. The positive back bias applied to the substrate region 12 connected to the substrate terminal 78 will maintain the state of the memory cell 35 that it is connected to.

If cell 35 is in logic-1 having holes in the floating body region 24, the SCR devices 30a or 30b formed by substrate 12, buried layer 22, floating body region 24, and source line region 16 or bit line region 18 will be turned on, thereby maintaining logic-1 state. Memory cells in logic-0 state will remain turned off since the potential of the floating body region 24 is not high enough for the SCR device 30a or 30b to conduct. Accordingly these cells maintain the logic-0 data. In this manner, a memory array 80 comprising of a plurality of memory cells 35 may be maintained by applying a positive bias to the substrate terminal 78.

In one embodiment the bias conditions for the holding operation on memory cell 35 are: 0 volts is applied to WL terminal 70, 0 volts is applied to BL terminal 74, 0 volts is applied to SL terminal 72, a positive voltage, for example, +1.2 volts is applied to the substrate terminal 78. In other embodiments, different voltages may be applied to the various terminals of memory cell 35 and the exemplary voltages described are not limiting.

Figure 29:
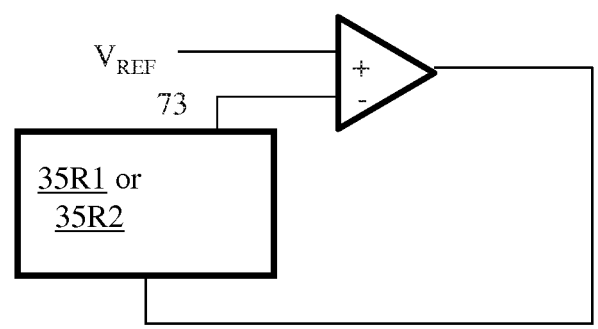
FIG. 29 illustrates an algorithm that can be employed to refresh the data stored in floating body memory cells in parallel, according to an embodiment of the present invention.

In another embodiment, a memory array 80 comprising of a plurality of memory cells 35 may be refreshed by periodically applying a positive voltage pulse through the substrate terminal 78. An example of a refresh scheme is shown in FIG. 29. A reference cell 35R1 or 35R2, shown in FIGS. 30 and 31, respectively, provides an electrical contact to the floating body region 24, for example through the sense line terminal 73. As a result, the floating body 24 potential of a reference cell 35R1 or 35R2 may be compared with a reference value $V_{REF}$. If the potential of the reference cell 35R1 or 35R2 is less than the reference value $V_{REF}$, a positive pulse is applied to the substrate terminal 78 to refresh the state of the memory cells 35. If the state of the reference cell 35R1 or 35R2 is greater than the reference value $V_{REF}$, zero voltage is applied to the substrate terminal 78.

Figure 30:
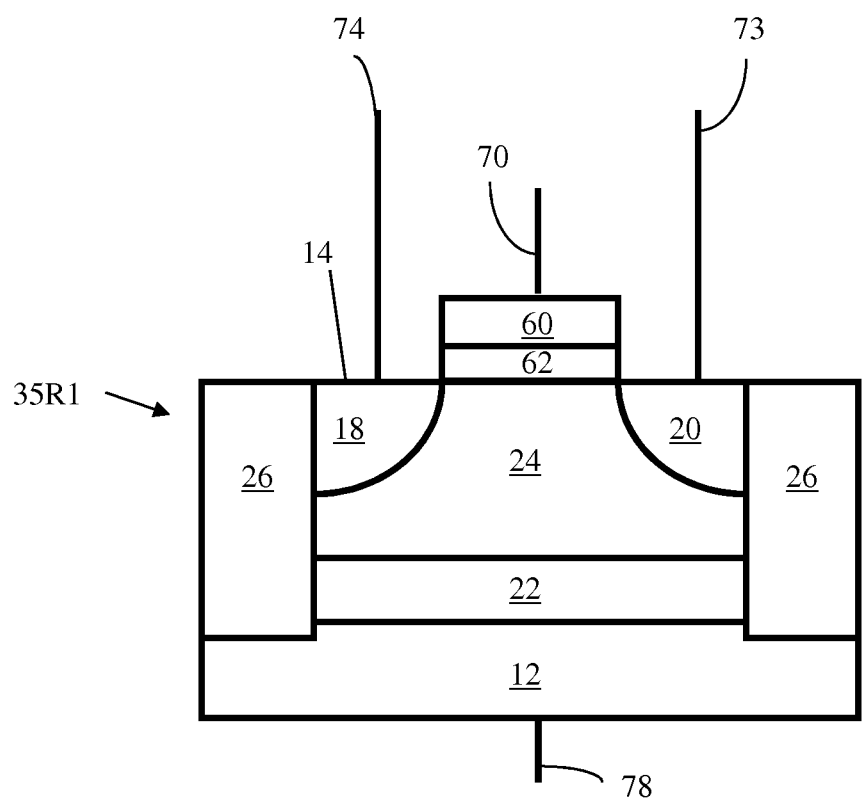
FIG. 30 is a schematic, cross-sectional illustration of a memory cell which can be used as a reference cell in sensing the state of a floating body memory cell according to an embodiment of the present invention.

FIG. 30 schematically illustrates a reference cell 35R1. A sense line region 20 of a first conductivity type, such as p-type, for example is also provided in floating body region 24 and is exposed at surface 14. Sense line region 20 may be formed using any suitable method and/or process, illustrative, non-exclusive examples of which include ion implantation, solid state diffusion, and/or epitaxial growth. The sense line region 20 has the same conductivity type as the floating body region 24, and the sense line region 20 may be more heavily doped than the floating body region 24. The sense line region 20 allows for an electrical connection to the floating body region 24. The sense line region 20 is shown connected to a sense line terminal 73.

Figure 31:
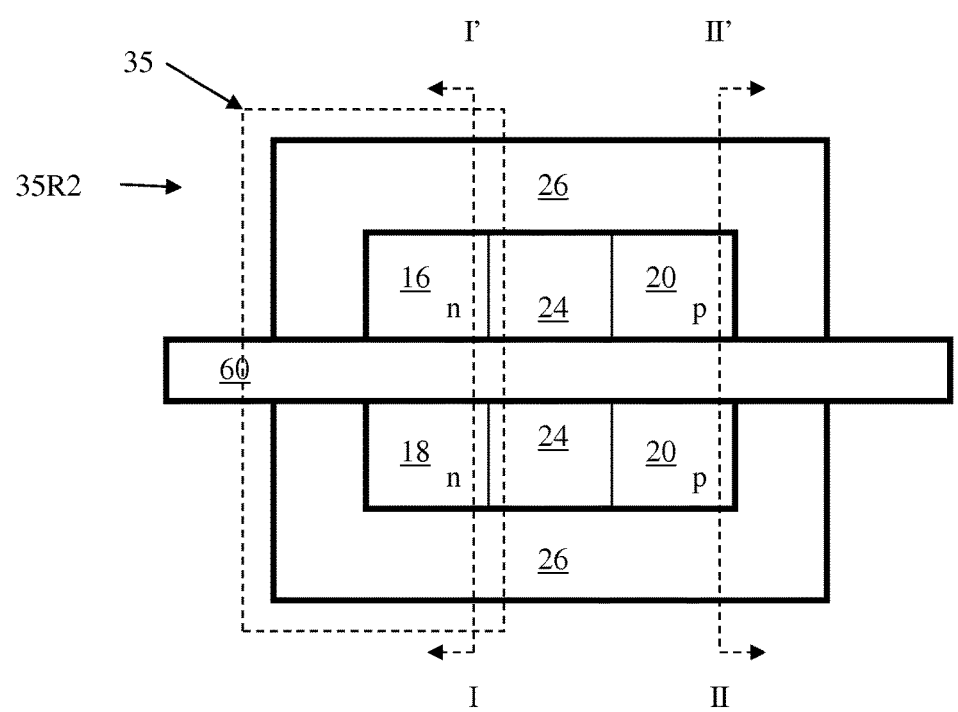
FIG. 31 is a schematic illustration of a top view of a memory cell which can be used as a reference cell in sensing the state of a floating body memory cell according to another embodiment of the present invention.
Figure 32A:
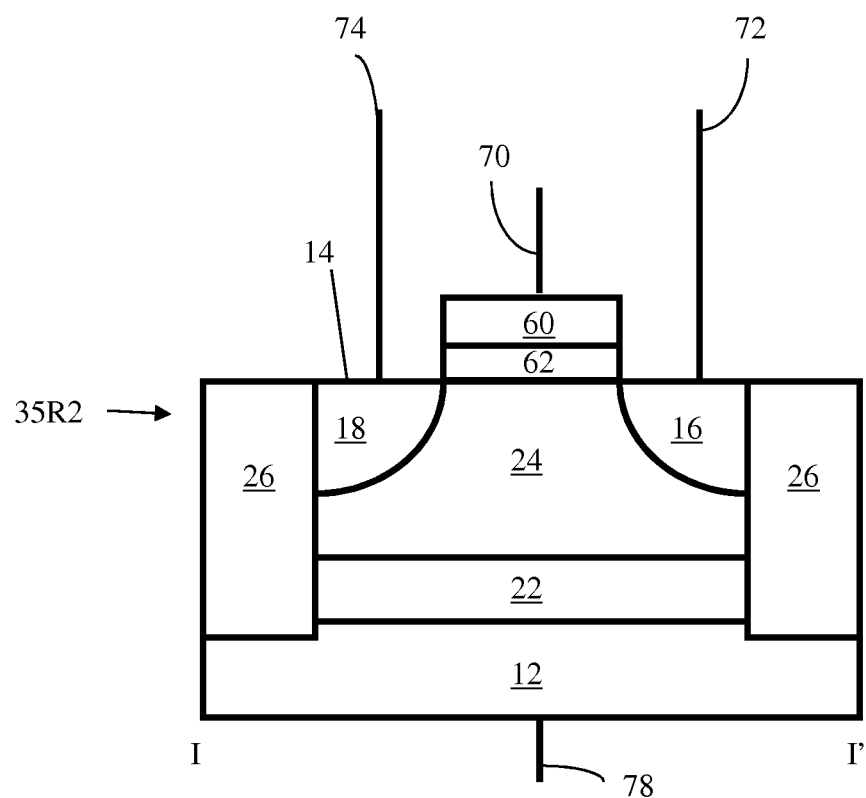
FIGS. 32A and 32B are schematic, cross-sectional illustrations of the cell of FIG. 9 taken along the I-I' and II-II' cut lines of FIG. 31, respectively.
Figure 32B:
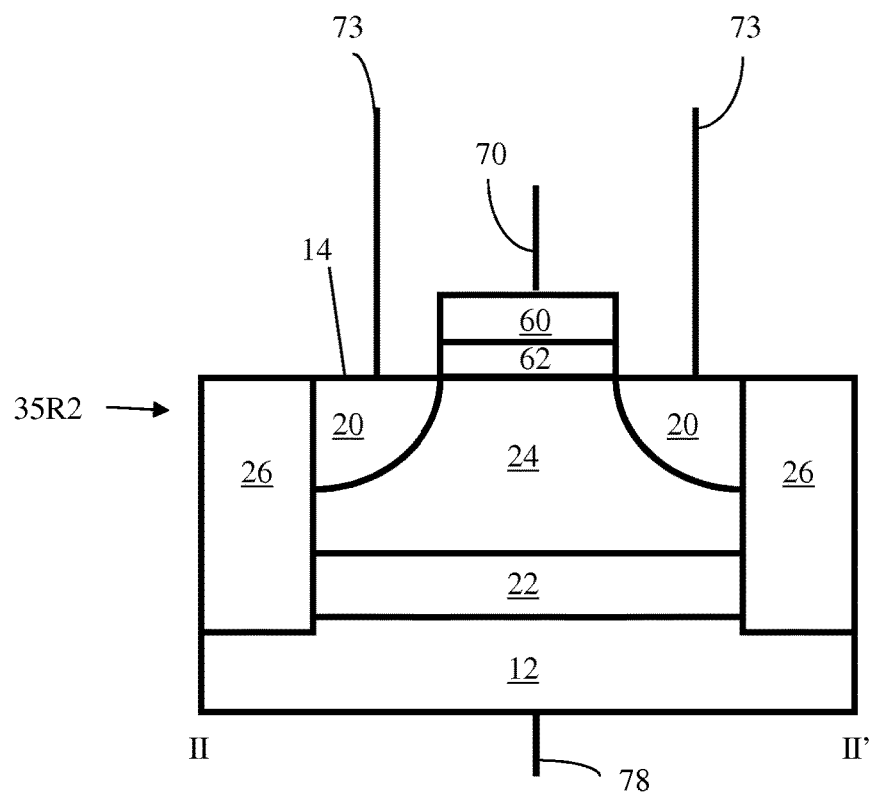

FIG. 31 schematically illustrates a schematic top view reference cell 35R2 according to another embodiment of the present invention. Reference cell 35R2 may be subdivided to include a region comprising of memory cell 35, as indicated by the region enclosed by dashed lines in FIG. 31. The reference cell 35R2 also comprise of a sense region 20, which is located adjacent to the memory cell 35. FIGS. 32A and 32B are schematic, cross-section illustrations of reference cell 35R2 along the I-I' and II-II' cut lines of FIG. 31, respectively.

The amount of charge stored in the floating body 24 can be sensed by monitoring the cell current of the memory cell 35. If the memory cell is in a logic-1 state having holes in the floating body region 24, then the memory cell 35 will have a lower threshold voltage (gate voltage where the transistor is turned on), and consequently a higher cell current, compared to when the floating body memory cell 35 is in logic-0 state having no holes in the floating body region 24.

Figure 33:
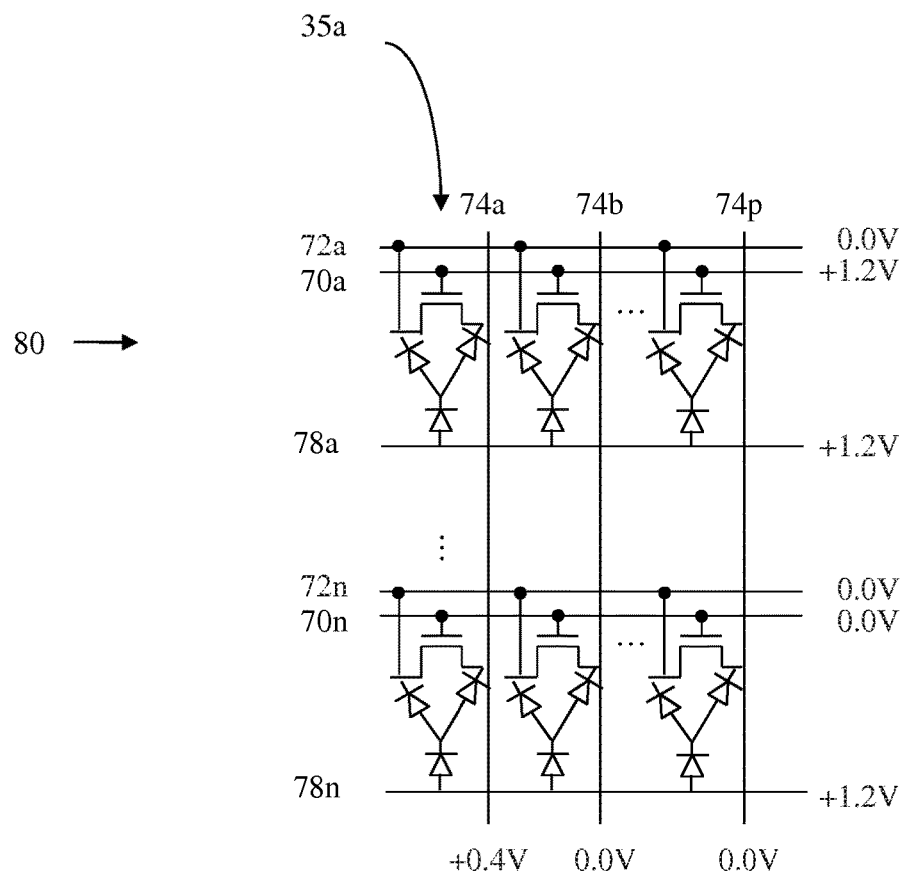
FIG. 33 is a schematic view of a memory array showing exemplary bias conditions for performing a read operation on the memory array, according to an embodiment of the present invention.
Figure 34:
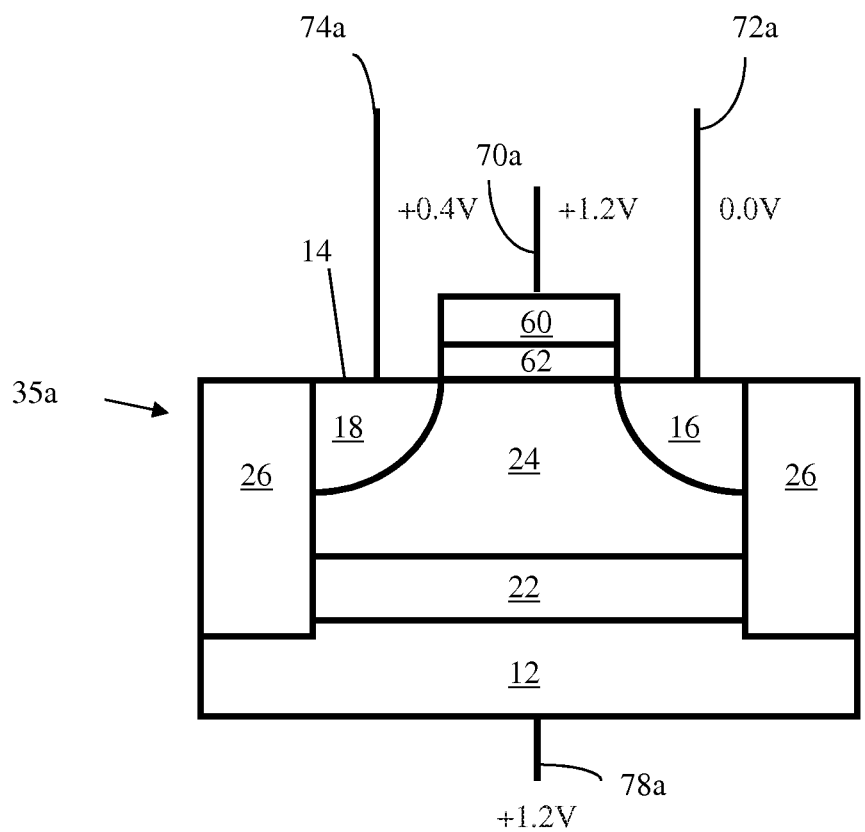
FIG. 34 shows exemplary bias conditions applied to a selected memory cell during the read operation noted with regard to the array in FIG. 33.

FIG. 33 is a schematic view of a memory array 80 showing exemplary bias conditions for performing a read operation on the memory array 80, according to an embodiment of the present invention. FIG. 34 shows exemplary bias conditions applied to a selected memory cell 35a during the read operation noted with regard to array 80 in FIG. 33. The read operation is performed by applying the following bias conditions: a positive bias to the WL terminal 70a, a positive bias to the BL terminal 74a, zero bias to the SL terminal 72a, and zero or positive bias to the substrate terminal 78a. All unselected WL terminals 70b (not shown) to 70n have zero volts applied, all unselected BL terminals 74b through 74p have zero volts applied, all unselected SL terminals 72b (not shown) through 72n have zero volts applied, while zero or a positive bias is applied to the unselected substrate terminals 78b (not shown) through 78n.

In one embodiment the bias conditions for the read operation for memory cell 35 are: +1.2 volts is applied to WL terminal 70, +0.4 volts is applied to BL terminal 74, 0.0 volts is applied to SL terminal 72, and 0.0 volts or +1.2 volts is applied to the substrate terminal 78. In other embodiments, different voltages may be applied to the various terminals of memory cell 35 and the exemplary voltages described are not limiting. The positive voltage applied to BL terminal 74 may be less than the positive voltage applied to WL terminal 70, in which the difference in the threshold voltage of the memory cell 35 is employed to represent the state of the memory cell 35. The positive voltage applied to BL terminal 74 may also be greater than or equal to the positive voltage applied to WL terminal 70 and generates an electric field sufficiently high enough to trigger the bipolar read mechanism.

A sensing circuit typically connected to BL terminal 74 can be used to determine the data state of the memory cell 35. Any sensing scheme known in the art can be used in conjunction with memory cell 35. For example, the sensing schemes disclosed in Ohsawa-1, Ohsawa-2, and/or Widjaja-3 are incorporated by reference herein in their entireties.

Figure 35:
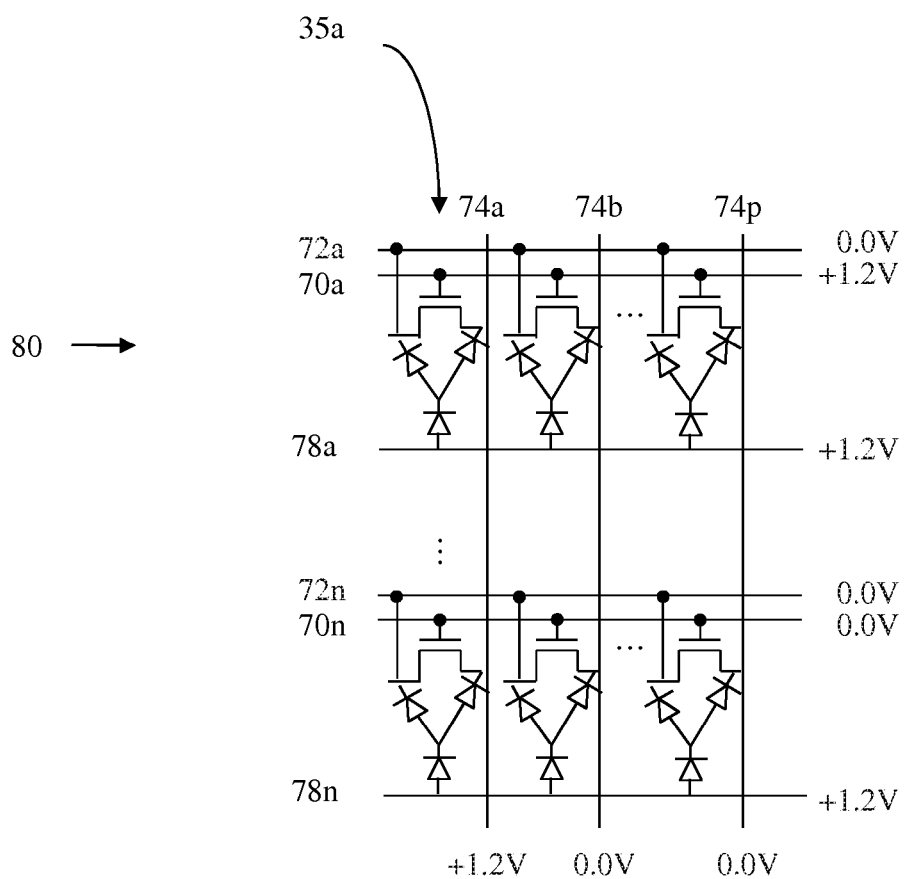
FIG. 35 is a schematic illustration of a memory cell array showing exemplary bias conditions for a write logic-1 operation on the memory array through an impact ionization mechanism, according to an embodiment of the present invention.
Figure 36:
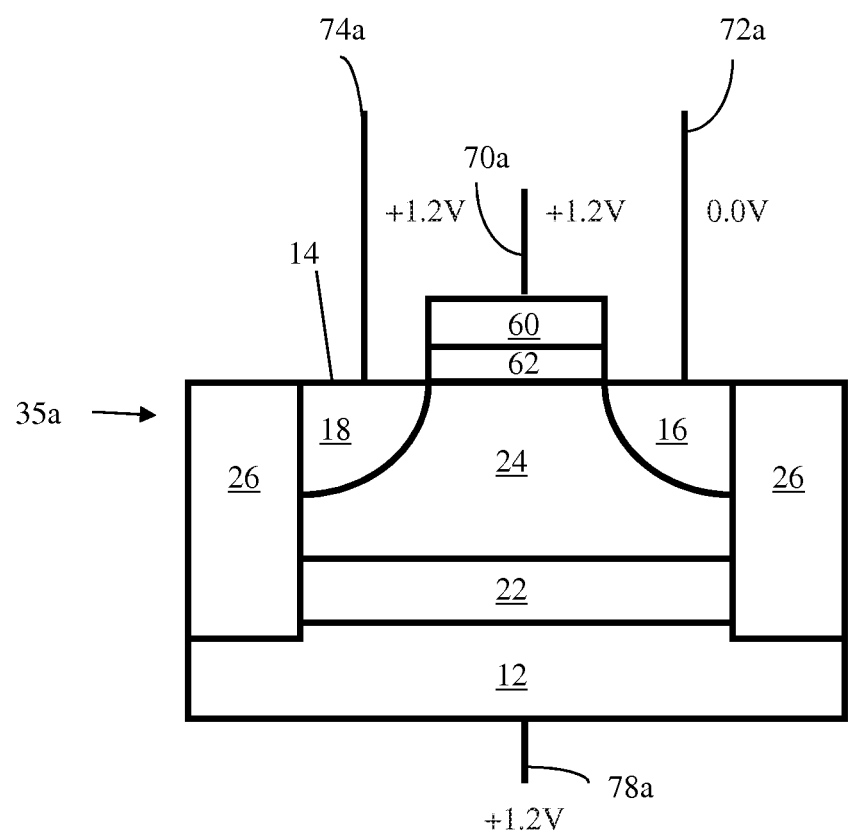
FIG. 36 illustrates exemplary bias conditions on an exemplary selected memory cell from the array of FIG. 35.

FIG. 35 is a schematic illustration of a memory cell array showing exemplary bias conditions for a write logic-1 operation on the memory array 80 through an impact ionization mechanism, according to an embodiment of the present invention. FIG. 36 illustrates the bias conditions on an exemplary selected memory cell 35a, according to the embodiment of FIG. 35, where the following bias conditions are applied: a positive voltage is applied to the selected WL terminal 70, a positive voltage is applied to the selected BL terminal 74, zero voltage is applied to the selected SL terminal 72, and zero or positive voltage is applied to the substrate terminal 78. This positive voltage applied to the selected BL terminal 74a is greater than or equal to the positive voltage applied to the selected WL terminal 70a and generates an electric field sufficiently high enough to trigger an impact ionization mechanism.

In one particular non-limiting embodiment, about +1.2 volts is applied to the selected WL terminal 70, about +1.2 volts is applied to the selected BL terminal 74, about 0.0 volts is applied to SL terminal 72, and about 0.0 volts or +1.2 volts is applied to substrate terminal 78; while about 0.0 volts is applied to the unselected WL terminals 70, unselected BL terminals 74, unselected SL terminals, and 0.0 volts or +1.2 volts is applied to the unselected substrate terminal 78. These voltage levels are exemplary only and may vary from embodiment to embodiment. Thus the exemplary embodiments, features, bias levels, etc., described are not limiting.

The positive bias applied to the selected BL terminal 74a will result in a depletion region around the bit line region 18. This effect is sometimes referred to as drain induced barrier lowering (DIBL). As a result, carriers (e.g. electrons) will flow through the selected memory cell 35a from the SL terminal 72a to the BL terminal 74a. Electrons will be accelerated in the pinch-off region (defined as the region near the surface 14 where the channel concentration is equal to the bulk doping concentration) of the MOS device 20, creating hot carriers (electron and hole pairs) in the vicinity of the bit line region 18. The generated holes will then flow into the floating body 24, putting the cell 35a to the logic-1 state.

Figure 37:
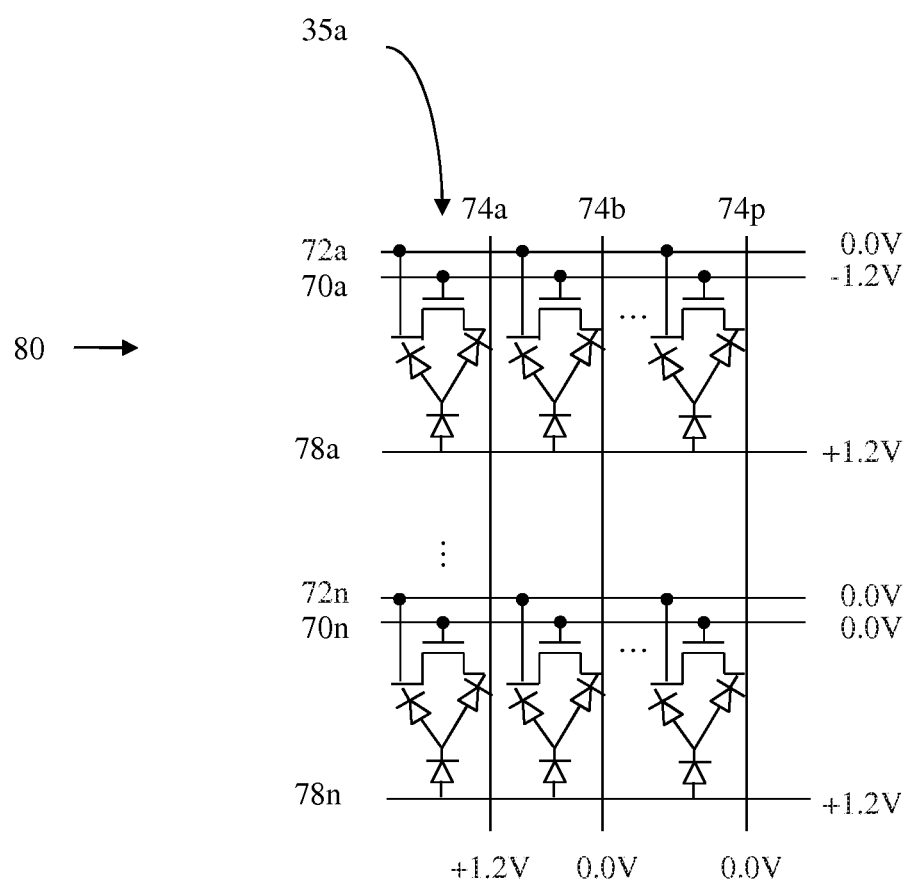
FIG. 37 is a schematic illustration of a memory cell array showing exemplary bias conditions for a write logic-1 operation on the memory array through a band-to-band tunneling mechanism, according to an embodiment of the present invention.
Figure 38:
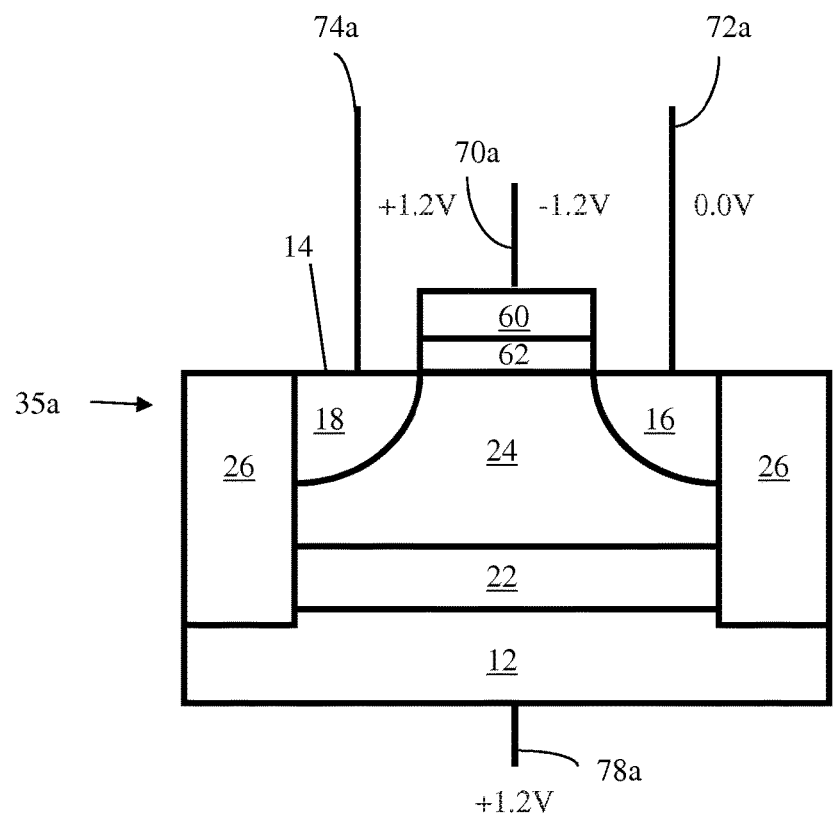
FIG. 38 illustrates exemplary bias conditions on an exemplary selected memory cell from the array of FIG. 37.

FIG. 37 is a schematic illustration showing bias conditions for a write logic-1 operation using a band-to-band tunneling mechanism performed on memory array 80 according to an embodiment of the present invention. FIG. 38 is a schematic view showing the bias conditions on an exemplary selected memory cell 35a in the embodiment of array 80 shown in FIG. 37. A write logic-1 operation using a band-to-band tunneling mechanism can be performed by applying the following bias conditions: a negative voltage is applied to the selected WL terminal 70a, a positive voltage is applied to the selected BL terminal 74a, zero voltage is applied to the selected SL terminal 72a, and zero or positive voltage is applied to the substrate terminal 78a.

In one particular non-limiting embodiment, about −1.2 volts is applied to the selected WL terminal 70a, about +1.2 volts is applied to the selected BL terminal 74a, about 0.0 volts is applied to SL terminal 72a, about 0.0 volts or +1.2 volts is applied to substrate terminal 78a; while about 0.0 volts is applied to the unselected WL terminals 70, unselected BL terminals 74, unselected SL terminals, and 0.0 volts or +1.2 volts is applied to substrate terminal 78. These voltage levels are exemplary only may vary from embodiment to embodiment. Thus the exemplary embodiments, features, bias levels, etc., described are not limiting.

The negative charge on the gate 60 (connected to WL terminal 70) and the positive voltage on bit line region 18 (connected to BL terminal 74) create a strong electric field (for example, about $10^6$ V/cm in silicon, as described in "Physics of Semiconductor Devices", Sze S. M. and Ng K. K. ("Sze"), p. 104, hereby incorporated herein, by reference thereto) between the bit line region 18 and the floating body region 24 in the proximity of gate 60. This bends the energy band sharply upward near the gate and bit line junction overlap region, causing electrons to tunnel from the valence band to the conduction band, leaving holes in the valence band. The electrons which tunnel across the energy band become the drain leakage current, while the holes are injected into floating body region 24 and become the hole charge that creates the logic-1 state.

Figure 39:
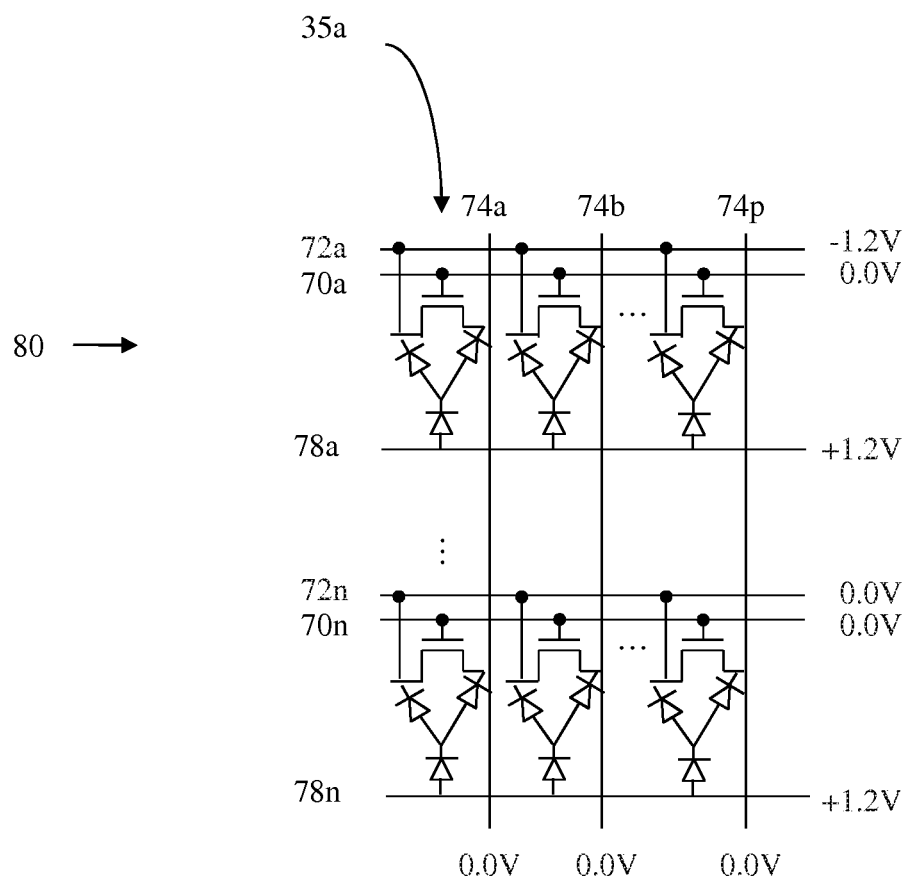
FIG. 39 is a schematic illustration showing exemplary bias conditions for a write logic-0 operation performed on a memory array according to an embodiment of the present invention.
Figure 40:
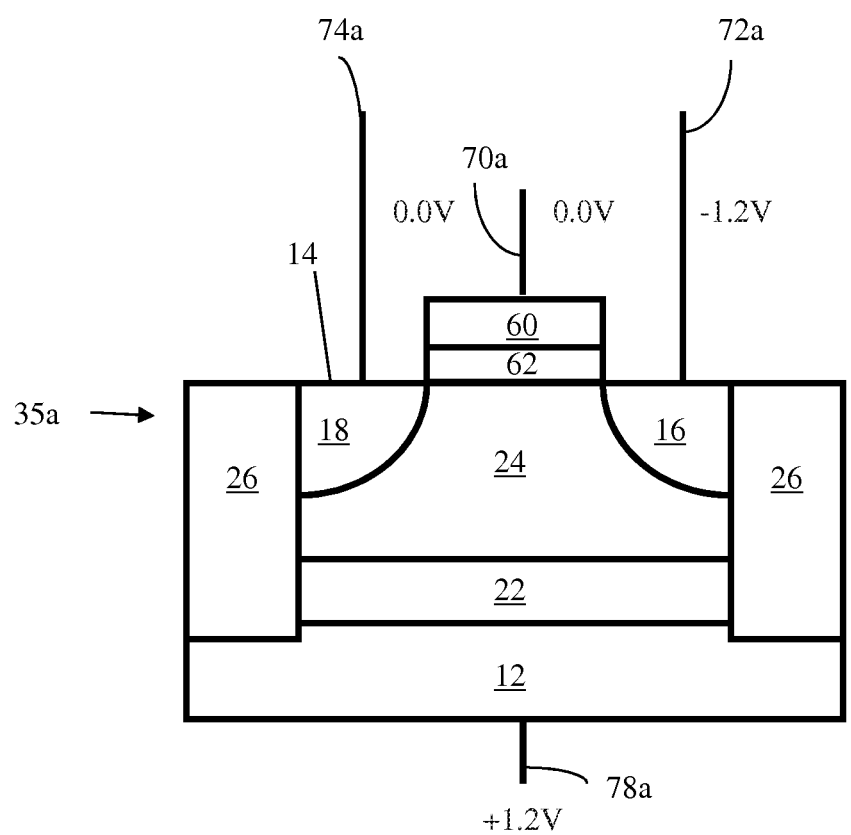
FIG. 40 is a schematic illustration of exemplary bias conditions applied to an exemplary selected memory cell from the memory array of FIG. 39.

FIG. 39 is a schematic illustration showing bias conditions for a write logic-0 operation performed on memory array 80 according to an embodiment of the present invention. FIG. 40 is a schematic illustration of bias conditions applied to an exemplary selected memory cell 35a from the memory array 80 of FIG. 39. A write logic-0 operation can be performed by applying a negative voltage bias to the selected SL terminal 72a, a zero voltage bias to the WL terminal 70a, zero voltage bias to the BL terminal 74a, zero or positive voltage bias to the substrate terminal 78a; while zero voltage is applied to the unselected SL terminals 72, zero voltage bias is applied to the unselected WL terminals 70, zero or positive bias is applied to the substrate 78. Under these conditions, the p-n junction between floating body 24 and source line region 16 of the selected cell 35 is forward-biased, evacuating holes from the floating body 24. All memory cells 35 sharing the same selected SL terminal 72a will be written to simultaneously. To write arbitrary binary data to different memory cells 35, a write logic-0 operation is first performed on all the memory cells to be written, followed by one or more write logic-1 operations on the memory cells that must be written to logic-1.

In one particular non-limiting embodiment, about −1.2 volts is applied to selected SL terminal 72a, about 0.0 volts is applied to WL terminal 70a, about 0.0 volts is applied to BL terminal 74a, about 0.0 volts or +1.2 volts is applied to substrate terminal 78a, while zero voltage is applied to the unselected SL terminals 72, zero voltage bias is applied to the unselected WL terminals 70, zero or positive bias is applied to the substrate 78. These voltage levels are exemplary only and may vary from embodiment to embodiment. Thus the exemplary embodiments, features, bias levels, etc., described are not limiting.

Figure 41:
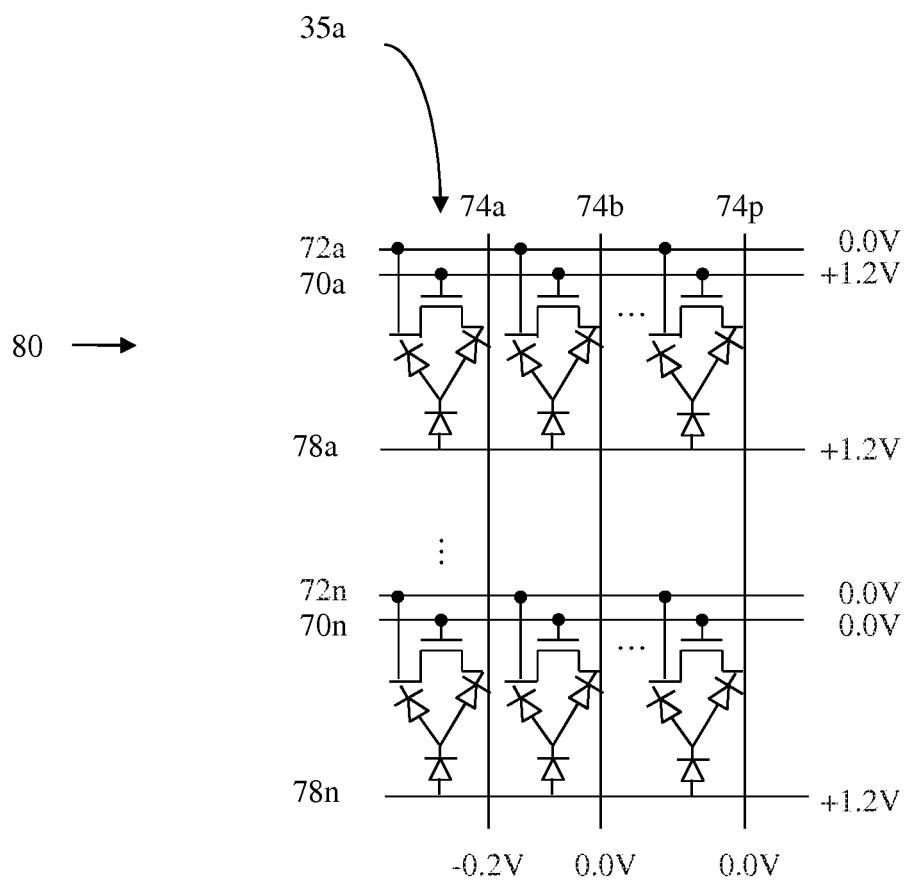
FIG. 41 is a schematic illustration showing exemplary bias conditions applied for a bit-selective write logic-0 operation performed on a memory array according to an embodiment of the present invention.
Figure 42:
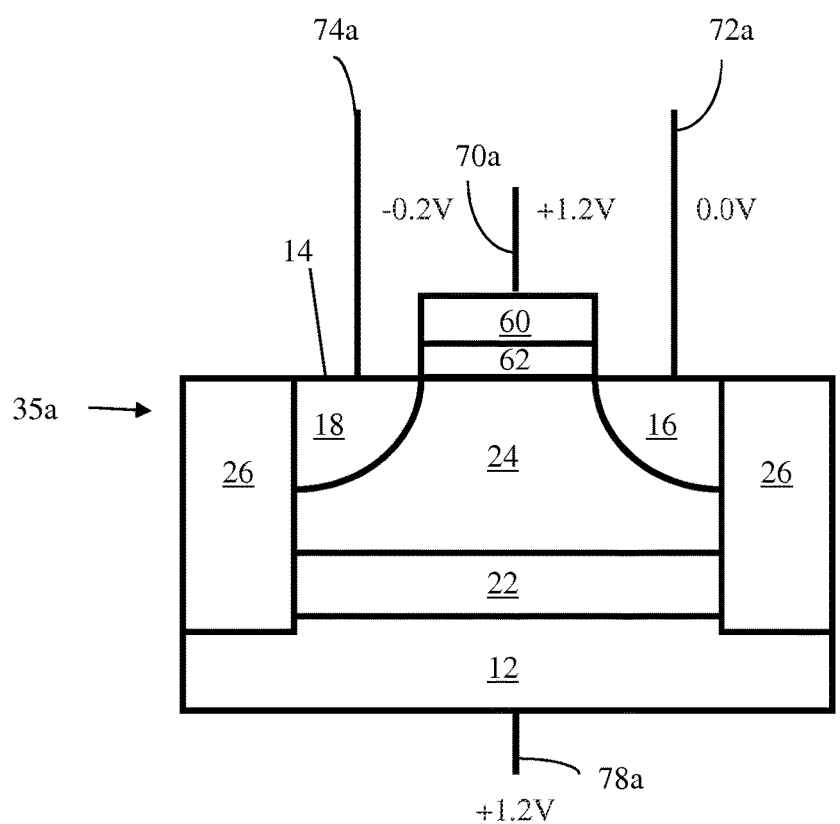
FIG. 42 illustrates exemplary bias conditions applied to the terminals of an exemplary selected memory cell from the array of FIG. 41.

FIG. 41 is a schematic illustration showing bias conditions applied for a bit-selective write logic-0 operation performed on memory array 80 according to an embodiment of the present invention. FIG. 42 illustrates bias conditions applied to the terminals of an exemplary selected memory cell 35a from the array 80 of FIG. 41, which can may be performed by applying a positive voltage to the selected WL terminal 70a, a negative voltage to the selected BL terminal 74a, zero voltage bias to the selected SL terminal 72a, zero or positive voltage bias to the substrate terminal 78a; while zero voltage is applied to the unselected WL terminals 70, zero voltage is applied to the unselected BL terminals 74, zero voltage bias is applied to the unselected SL terminals 72, zero or positive voltage is applied to the substrate terminal 78. When the potential of gate 60 (connected to WL terminal 70) is increased from zero (or negative voltage) to a positive voltage, the floating body 24 potential will increase due to capacitive coupling. As a result of the floating body 24 potential increase and the negative voltage applied to the BL terminal 74a, the p-n junction between floating body region 24 and bit line region 18 is forward-biased, evacuating holes from the floating body 24.

To reduce undesired write logic-0 disturb to other memory cells 35 in a memory array 80, the applied potential can be optimized as follows: if the floating body 24 potential of state logic-1 is referred to as $V_{FB1}$, then the voltage applied to the WL terminal 70a is configured to increase the floating body 24 potential by $V_{FB1}/2$ while $-V_{FB1}/2$ is applied to BL terminal 74a. Additionally, either ground or a slightly positive voltage may also be applied to the BL terminals 74 of unselected memory cells 35 that do not share the same BL terminal 74a as the selected memory cell 35a, while a negative voltage may also be applied to the WL terminals 70 of unselected memory cells 35 that do not share the same WL terminal 70a as the selected memory cell 35a.

As illustrated in FIGS. 41 and 42, the following exemplary bias conditions may be applied to the selected memory cell 35a to perform a bit-selective write logic-0 operation: a potential of about −0.2 volts is applied to the selected BL terminal 74a, a potential of about +1.2 volts is applied to the selected WL terminal 70a, about 0.0 volts is applied to the selected SL terminal 72a, and a potential of about 0.0 volts or +1.2 volts is applied to the substrate terminal 78a.

Figure 43:
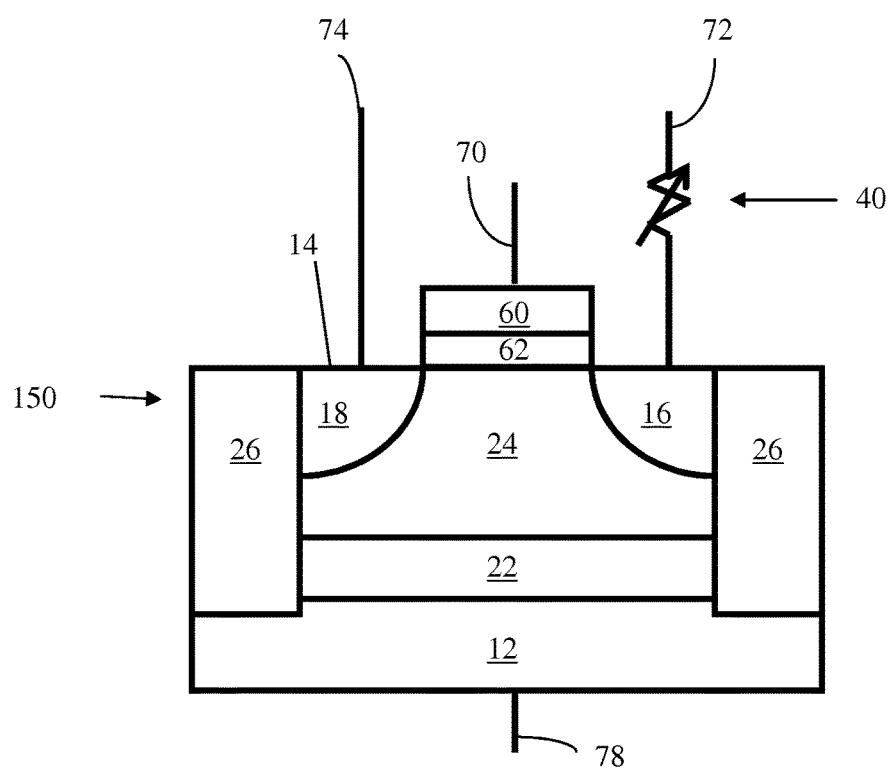
FIG. 43 is a cross-sectional view of an embodiment of the memory cell of the present invention.

FIG. 43 shows an illustrative, non-exclusive example of an embodiment of memory cell 150. Cell 150 is formed in and/or on a substrate 12 of a first conductivity type, such as a p-type conductivity type, for example. Substrate 12 may include any suitable substrate, illustrative, non-exclusive examples of which include silicon, germanium, silicon germanium, gallium arsenide, carbon nanotubes, and/or other semiconductor materials.

Substrate 12 has a surface 14 and includes a buried layer 22 of a second conductivity type, such as n-type conductivity type. Buried layer region 22 may be formed using any suitable process and/or method performed on the material of substrate 12, illustrative, non-exclusive examples of which include ion implantation processing and/or epitaxial growth processing. Buried layer region 22 is bounded on the side by insulating layer 26. Insulating layer 26 may be formed from any suitable insulating and/or dielectric materials, one illustrative, non-exclusive example of which includes silicon dioxide.

Memory cell 150 includes a first region 16 having a second conductivity type, such as n-type conductivity type, that is formed in substrate 12, and a second region 18 having a second conductivity type, that is formed in substrate 12 and spaced apart from the first region 16. First and second regions 16 and 18, respectively, are exposed at surface 14 and may be formed using any suitable method and/or process, illustrative, non-exclusive examples of which include ion implantation, solid state diffusion, and/or epitaxial growth processes.

Figure 46A:
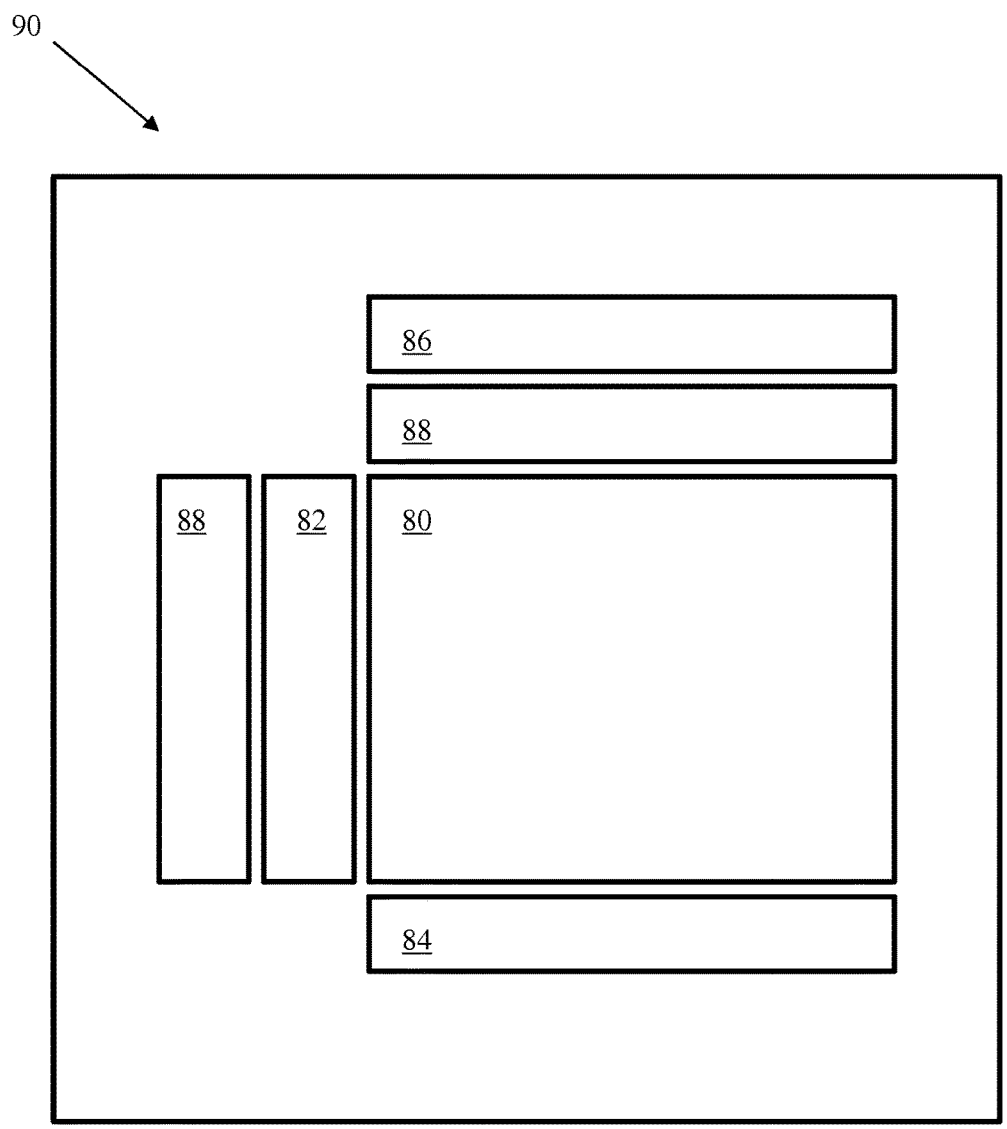
FIG. 46A illustrates an integrated circuit device comprising a memory array comprising of a plurality of memory cells shown in FIG. 43.

A floating body region 24 of the substrate 12 having a first conductivity type, such as p-type conductivity type, is bounded by surface 14, first and second regions 16 and 18, buried layer 22, and insulating layer 26. The floating body region 24 may be formed using any suitable method and/or process such as ion implantation, solid state diffusion, and/or epitaxial growth. Insulating layer 26 may be formed from any suitable insulating and/or dielectric materials, one illustrative, non-exclusive example of which includes silicon dioxide. Insulating layers 26 may insulate cell 150 from neighboring cells 150 when multiple cells 150 are joined in an array 80 to form a memory device 90, an example of which is illustrated in FIG. 46A.

A gate 60 may be positioned in between regions 16 and 18, and above the surface 14. Gate 60 is insulated from surface 14 by an insulating layer 62. Insulating layer 62 may be formed from any suitable dielectric material, illustrative, non-exclusive examples of which include silicon oxide, high-K dielectric materials, tantalum peroxide, titanium oxide, zirconium oxide, hafnium oxide, and/or aluminum oxide. Gate 60 may be made from any suitable conductive material, illustrative, non-exclusive examples of which include a polysilicon material, a metal gate electrode, tungsten, tantalum, titanium and/or their nitrides.

A resistive change memory element 40 is positioned above one of the regions having second conductivity type. The resistive change memory element is shown as a variable resistor in FIG. 43, and may be formed by phase change memory element or unipolar or bipolar resistive memory element, such as transition metal oxides materials. The switching of the resistivity state of a bipolar resistive memory element depends on the polarity of the potential difference or current flow across the bipolar resistive memory element, while the switching of a unipolar resistive memory element does not, for example as described in "Resistive non-volatile memory devices (Invited Paper)", R. Waser, pp. 1925-1928, Microelectronic Engineering, vol. 86, 2009, which is hereby incorporated herein, in its entirety, by reference thereto. The resistive change memory element 40 is shown to be electrically connected to the source line region 16 in FIG. 43. Alternatively, resistive change memory element 40 may be connected to the bit line region 18. The resistive change memory element 40 is electrically connected to the floating body transistor 20—which comprises of the first region 16, the floating body region 24, the second region 18, and the gate electrode 60—(see also the schematic view of the memory cell 150 in FIG. 45), and the separation distance between the volatile memory (i.e. the floating body transistor 20) and the non-volatile memory (i.e. the resistive change memory element 40) can be small, for example from about 90 nm to about 1 µm, more preferably from about 90 nm to about 500 nm, even more preferably from about 90 nm to about 100 nm if the resistive change element 40 is located between the surface 14 and the bottom-most (or first) metal layer for a 28-nm technology, or less than 1 um if the resistive change element 40 is located below the fourth metal layer for a 28-nm technology process, or less than 10 um, depending on for example which metal layer the addressable line (e.g. source line 72) is implemented at as well as the process technology node, depending on, for example, which metal layer the addressable line (e.g. source line 72) is implemented at.

Cell 150 further includes a word line (WL) terminal 70 electrically connected to gate 60, a source line (SL) terminal 72 electrically connected to region 16, a bit line (BL) terminal 74 electrically connected to region 18, and a substrate terminal 78 electrically connected to substrate 12. Alternatively, the SL terminal 72 may be electrically connected to region 18 and BL terminal 74 may be electrically connected to region 16. The floating body region 24 and buried layer region 22 are not connected to any terminals and may be considered floating.

As discussed in more detail herein, the conductivity types described above are exemplary conductivity types and other conductivity types and/or relative conductivity types are also within the scope of the present disclosure. As an illustrative, non-exclusive example, memory cell 150 may have and/or include a p-type conductivity type as the first conductivity type and n-type conductivity type as the second conductivity type.

Figure 44A:
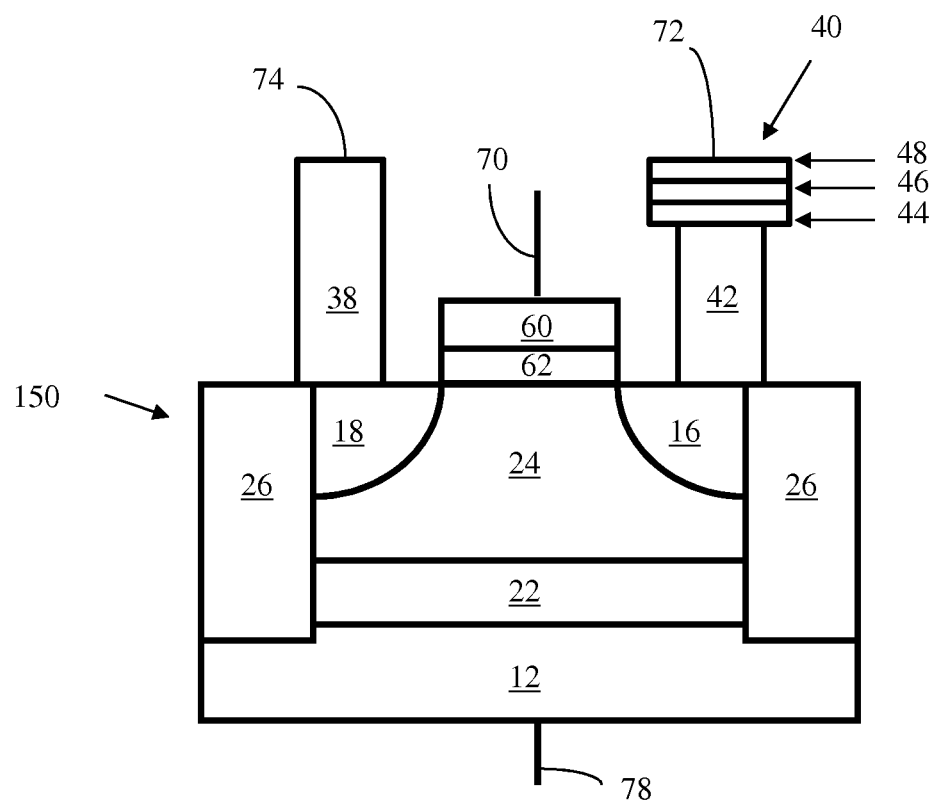
FIG. 44A is another cross-sectional view of a memory cell of the present invention showing an embodiment of the non-volatile memory element.

A non-limiting embodiment of the memory cell is shown in FIG. 44A. The resistive change memory element 40 may comprise of an electrode 44 and a phase change memory material 46, which is connected to the second conductivity region 16 through a conductive element 42, for example in the form of a conductive plug. The resistive change memory element may be connected to an addressable line through a conductive material 48. The conductive element 42 may be composed of conductive materials, illustrative, non-exclusive examples of which include tungsten or silicided silicon materials. Electrode 44 may be formed of conductive materials, illustrative, non-exclusive examples of which include titanium nitride, titanium aluminum nitride, titanium silicon nitride, and/or platinum. Resistive change material 46 is a material that may exhibit multiple resistivity values. For the case of phase change memory elements, the resistivity depends on the crystalline phase of the material, while for the metal oxide materials, the resistivity typically depends on the presence or absence of conductive filaments. A crystalline phase of a phase change type resistive change material exhibits a low resistivity (e.g., ~1 k$\Omega$) state and an amorphous phase of that material exhibits a high resistivity state (e.g., >100 k$\Omega$). Examples of phase change material include alloys containing elements from Column VI of the periodic table, such as GeSbTe alloys. Examples of metal-insulator-metal resistance change materials include a variety of oxides such as $Nb_2O_5$, $Al_2O_3$, $Ta_2O_5$, $TiO_2$, and NiO and perovskite metal oxides, such as $SrZrO_3$, $(Pr,Ca)MnO_3$ and $SrTiO_3$:Cr. Electrode 48 may be formed of conductive materials, illustrative, non-exclusive examples of which include titanium nitride, titanium aluminum nitride, titanium silicon nitride, platinum, aluminum or copper, or layers of thereof.

Figure 44B:
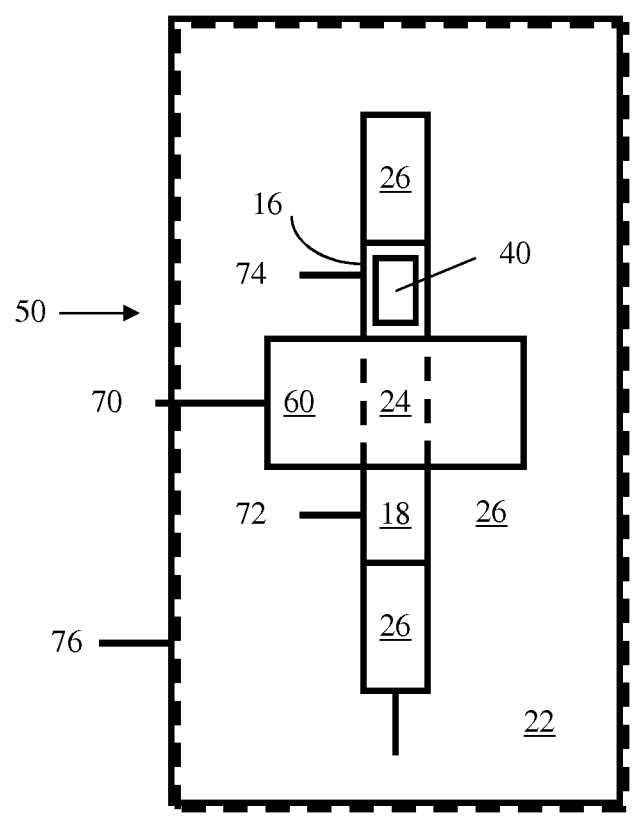
FIG. 44B is a top view of a memory cell according to an embodiment of the present invention.

FIG. 44B illustrates an exemplary top view of memory cell 150. From a top view perspective, the memory cell 150 looks similar to a single transistor. This is because each memory cell 150 includes a respective volatile memory portion and a respective nonvolatile memory portion within a "single transistor" memory cell 150.

Figure 45:
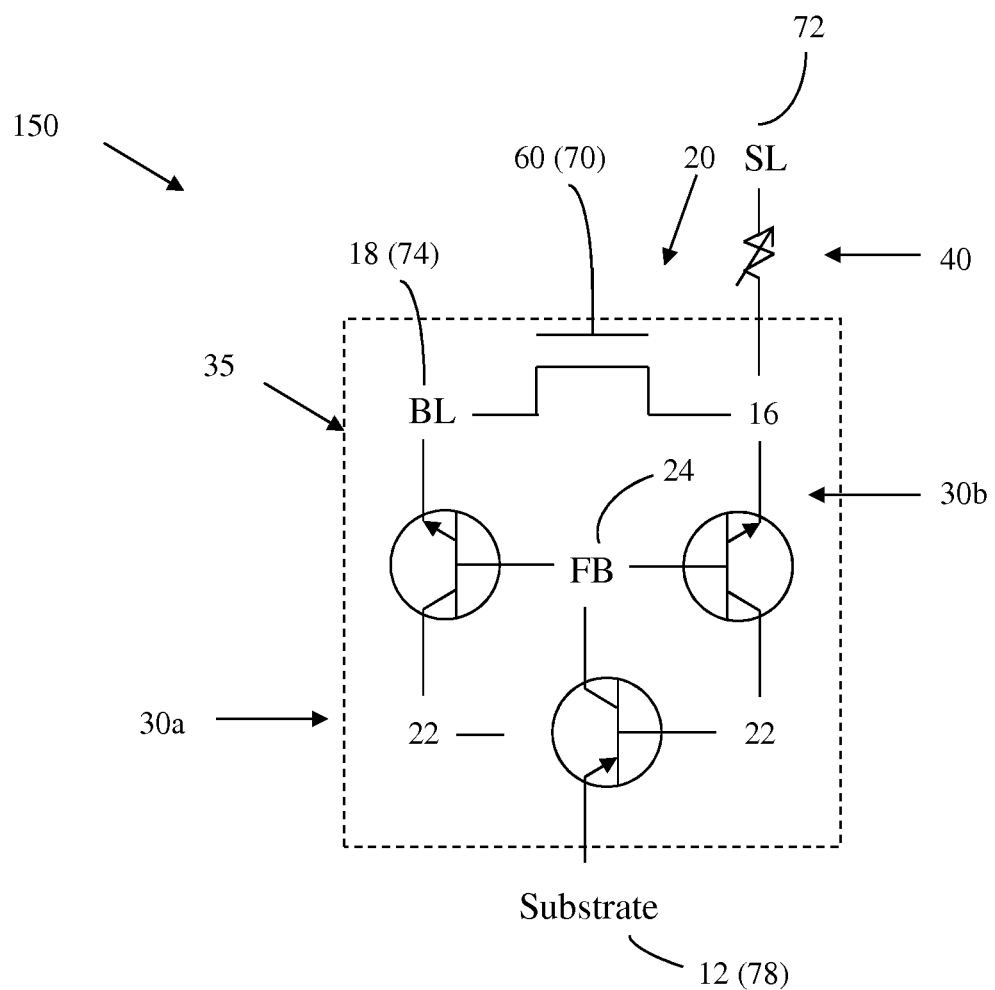
FIG. 45 schematically illustrates an equivalent circuit representation of the memory cell shown in FIG. 43.

FIG. 45 illustrates an equivalent circuit representation of memory cell 150. Memory cell 150 comprises of memory cell 35 along with the resistive change memory element 40.

FIG. 46A illustrates an integrated circuit device 90, which may comprise of memory array 80 formed by plurality of memory cells 150 arranged in rows and columns, and periphery circuitry, illustrative, non-exclusive examples of which include counter 82, read circuitry 84, write circuitry 86, and address decoders 88. The memory array 80 may include at least 16 memory cells 150, or up to and including 1 terabit of memory cells 150. The integrated circuit device 90 may be a memory device or an integrated circuit device comprising of embedded memory, illustrative, non-exclusive examples of which include microprocessors, networking, communication, and field-programmable logic devices. The integrated circuit device 90 may also comprise of circuitry to determine if memory array 80 (or a segment of memory array 80, for example when the segment includes at least 0.1% of the memory cells) has been idle for a period of time, which may trigger a shadowing operation to conserve power consumption of the memory array 80 and subsequently the integrated circuit device 90. The integrated circuit device 90 may also comprise of a timer circuitry to ascertain that the elapsed idle time is greater than an elapsed time threshold, for example thirty seconds.

Figure 46B:
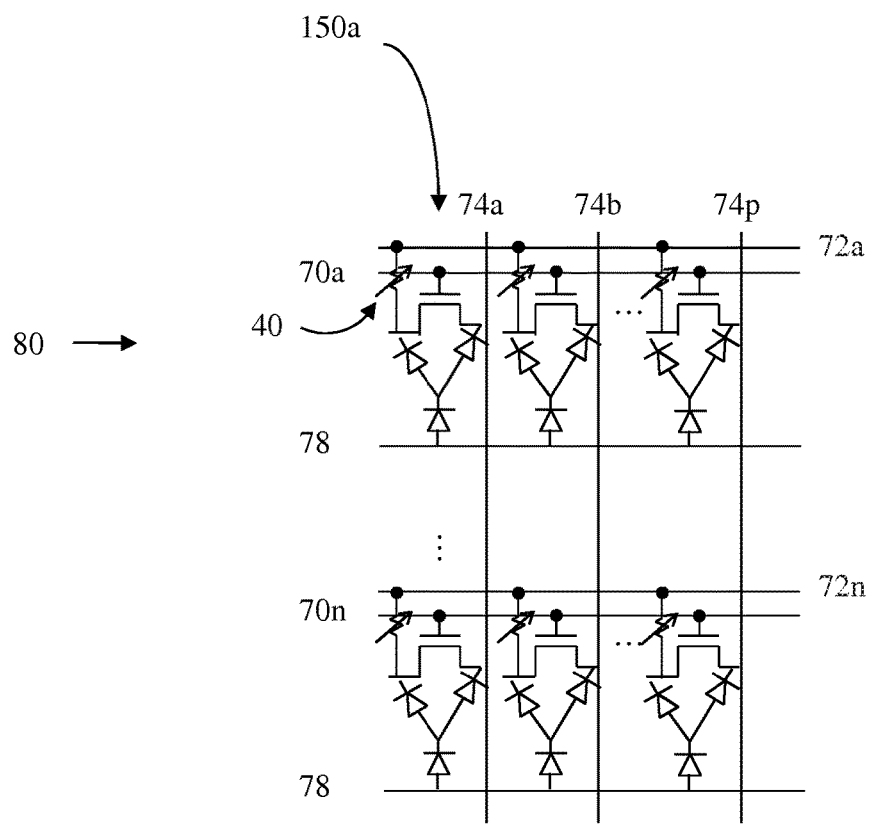
FIGS. 46B and 46C schematically illustrate multiple cells of the type shown in FIG. 43 joined to make a memory array.
Figure 46C:
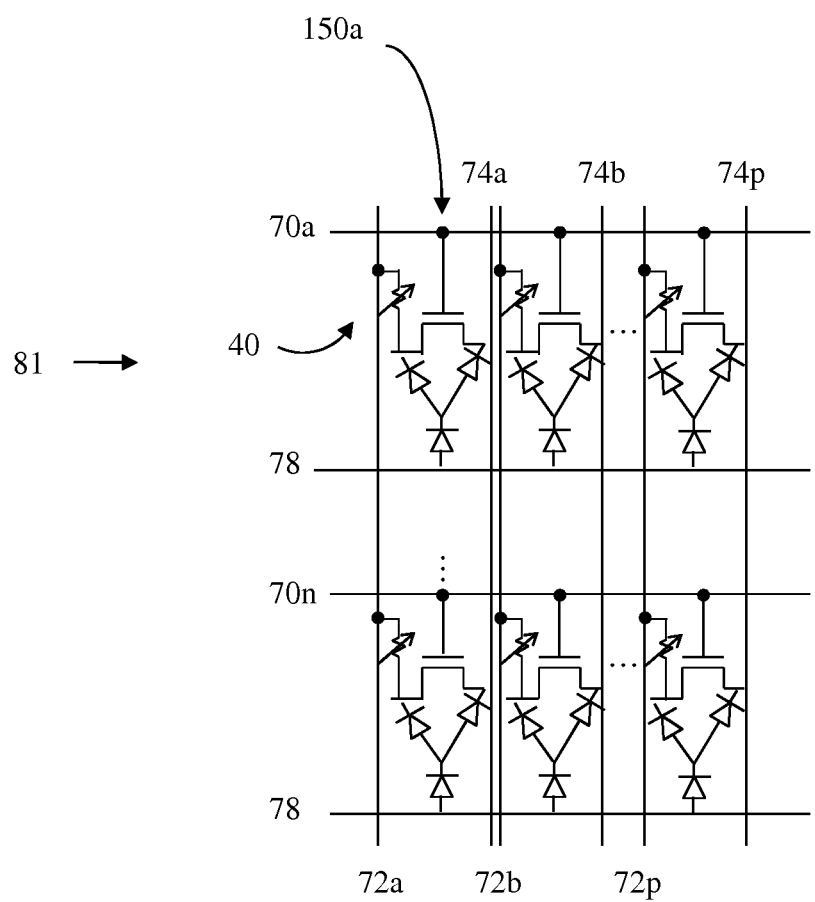

FIGS. 46B and 46C illustrate examples of memory arrays 80 and 81 formed by a plurality of memory cells 150. The memory array 81 shown in FIG. 46C comprises of links of a plurality memory cells 150 connected in parallel, for example as described in U.S. application Ser. No. 12/897, 528 "Compact Semiconductor Memory Device Having Reduced Number of Contacts, Methods of Operating and Methods of Making" ("Widjaja-6"), which is hereby incorporated herein, in its entirety, by reference thereto. For simplicity, only memory array 80 will be shown from hereon.

Memory cell 150 has both volatile and non-volatile functionality similar to memory cell 50. A flowchart 100 describing the operation of memory cell 150 is shown in FIG. 1.

When power is applied to memory cell 150, memory cell 150 stores its states in floating body region 24 and may operate like a capacitorless memory cell 35. In one embodiment, the non-volatile memory element is initialized to have a low resistivity state.

Several operations may be performed on memory cell 150 during the volatile operation, such as holding, read, write logic-1, and write logic-0 operations, following the principles of the operation of memory cell 35.

Figure 47:
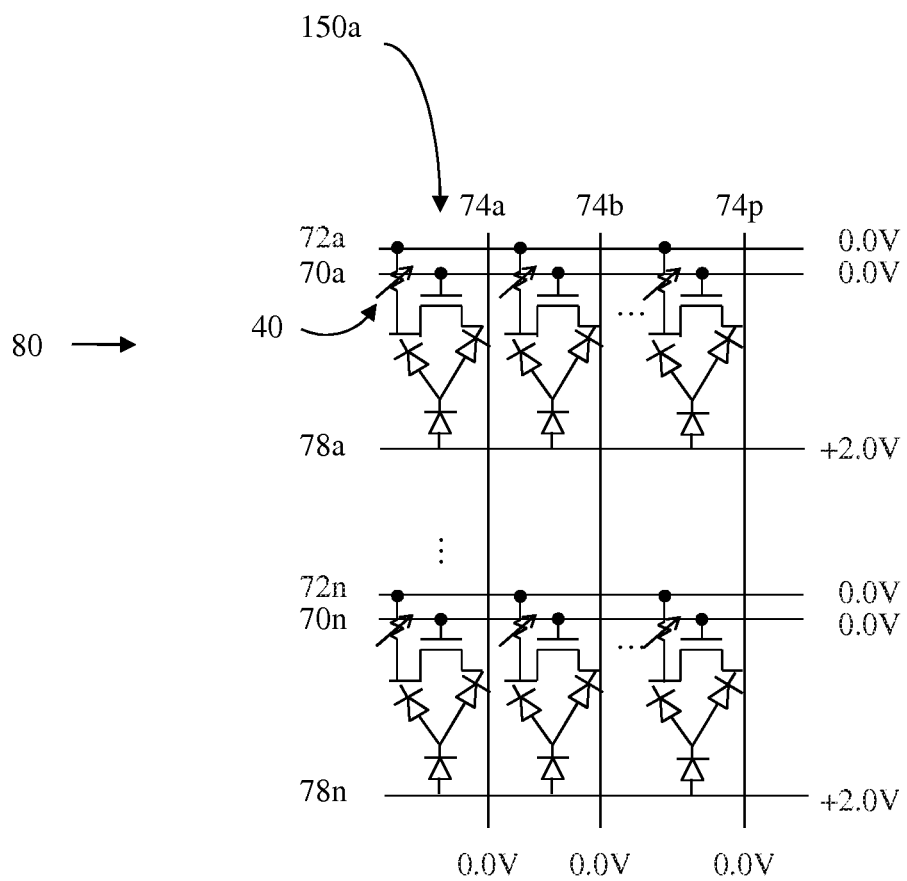
FIG. 47 is a schematic illustration showing exemplary bias conditions applied for a shadowing operation performed on a memory array according to an embodiment of the present invention.
Figure 48:
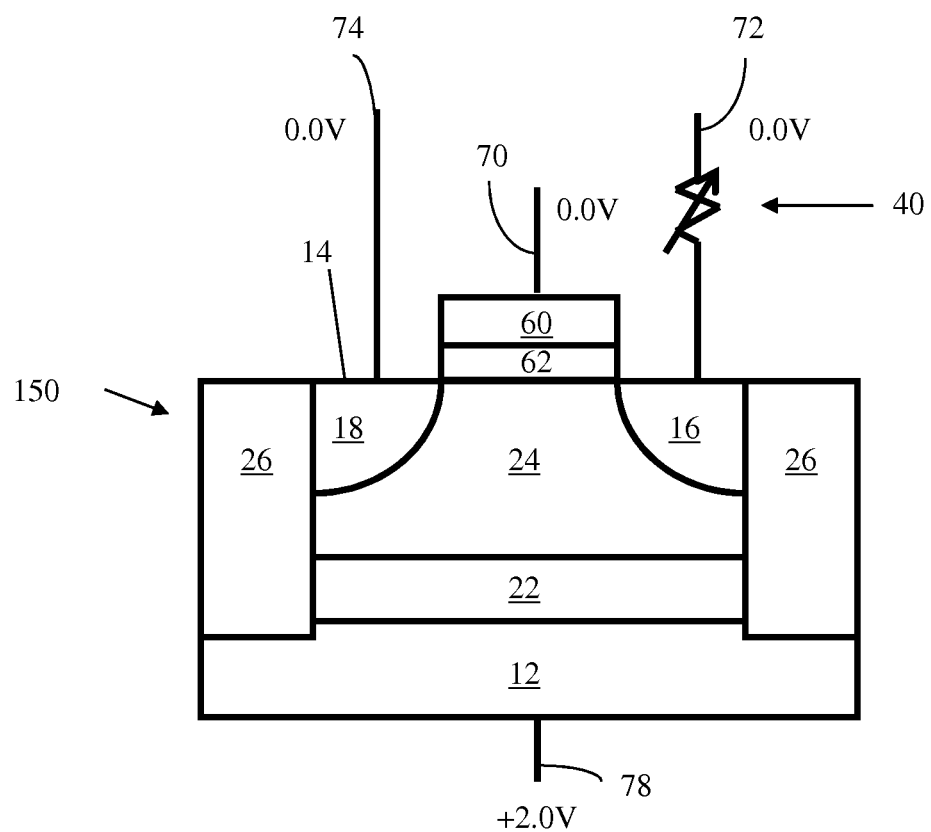
FIG. 48 illustrates exemplary bias conditions applied to the terminals of an exemplary selected memory cell from the array of FIG. 47.

When power down is detected, e.g., when a user turns off the power to cell 150, or the power is inadvertently interrupted, or for any other reason, power is at least temporarily discontinued to cell 150, data stored in the floating body region 24 is transferred to the resistance change memory 40. This operation is referred to as "shadowing" and is described with reference to FIGS. 47 and 48.

To perform a shadowing operation, a positive voltage is applied to the substrate terminal 78, zero voltage is applied to the SL terminal 72, zero voltage is applied to the BL terminal 74, and zero voltage is applied to the WL terminal 70. The positive voltage applied to the substrate terminal 78 during shadowing operation is greater than the positive voltage applied to the substrate terminal 78 during holding operation. When the memory cell 150 is in a volatile logic-1 state (i.e. having a positively charged floating body 24), the SCR device 30b will be turned on. The positive voltage applied to the substrate terminal 78 is controlled such that the electrical current flowing through the resistance change memory 40 is sufficient to change the resistivity of the materials from a low resistivity state to a high resistivity state. For phase change materials, the crystalline state changes from a crystalline phase to an amorphous phase, while in metal oxide systems, this may involve the rupture of conductive filaments. Accordingly, the non-volatile resistance change material element 40 will be in a high resistivity state when the volatile memory of cell 150 is in a logic-1 state.

When the floating body 24 is neutral or only slightly positive (for example, when the potential of the floating body region is less than 0.3V), the SCR device 30b will be turned off. Therefore, no (or low) electrical current flows through the resistance change memory element 40 and it will retain its low resistivity state. Accordingly, the non-volatile resistance change memory element 40 will be in a low resistivity state when the volatile memory of cell 150 is in a logic-0 state.

In one particular non-limiting example of this embodiment, about +2.0 volts is applied to the substrate terminal 78, about 0.0 volts is applied to the WL terminal 70, BL terminal 74, and SL terminal 72 so that about 700 µA current flows between substrate terminal 78 and SL terminal 72.

Note that this process occurs non-algorithmically, as the state of the floating body 24 does not have to be read, interpreted, or otherwise measured to determine what state to write the non-volatile resistance change memory 40 to. Rather, the shadowing process occurs automatically, driven by electric potential differences. Accordingly, this process is orders of magnitude faster than one that requires algorithmic intervention. In addition, no control circuitry, such as a memory controller, is required between the volatile memory component and the non-volatile memory component, allowing for a close proximity between the floating body transistor 20 and the resistance change element 40, as shown in FIGS. 43 and 44A.

Figure 49:
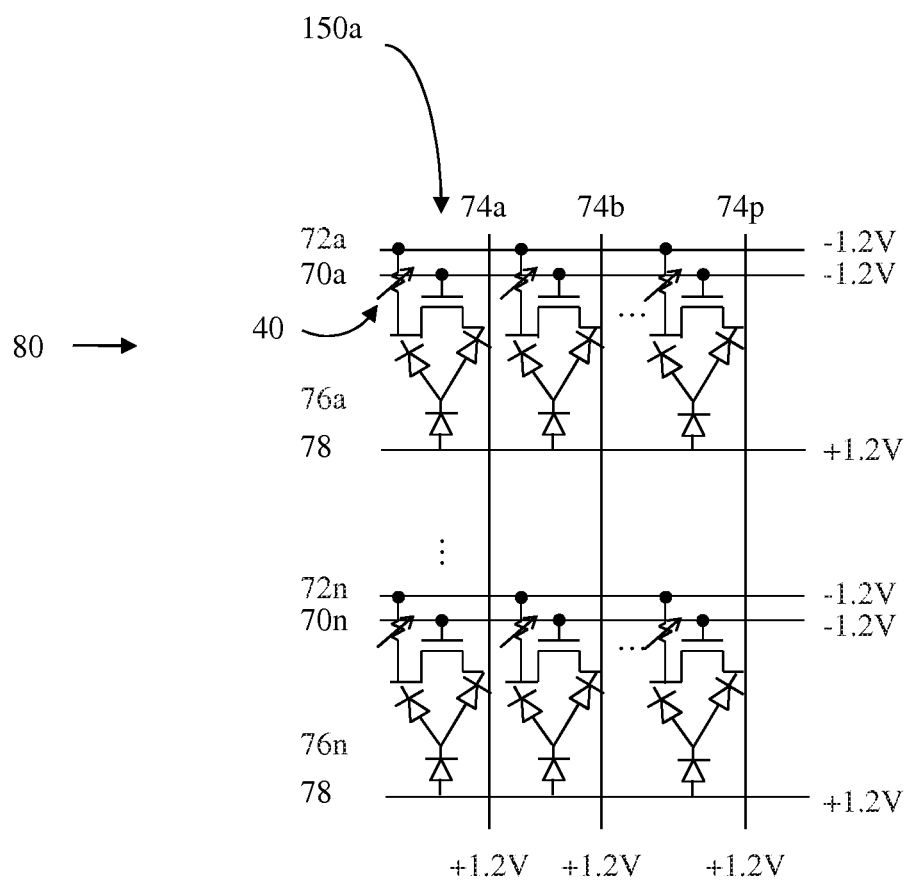
FIG. 49 is a schematic illustration showing exemplary bias conditions applied for a restore operation performed on a memory array according to an embodiment of the present invention.
Figure 50:
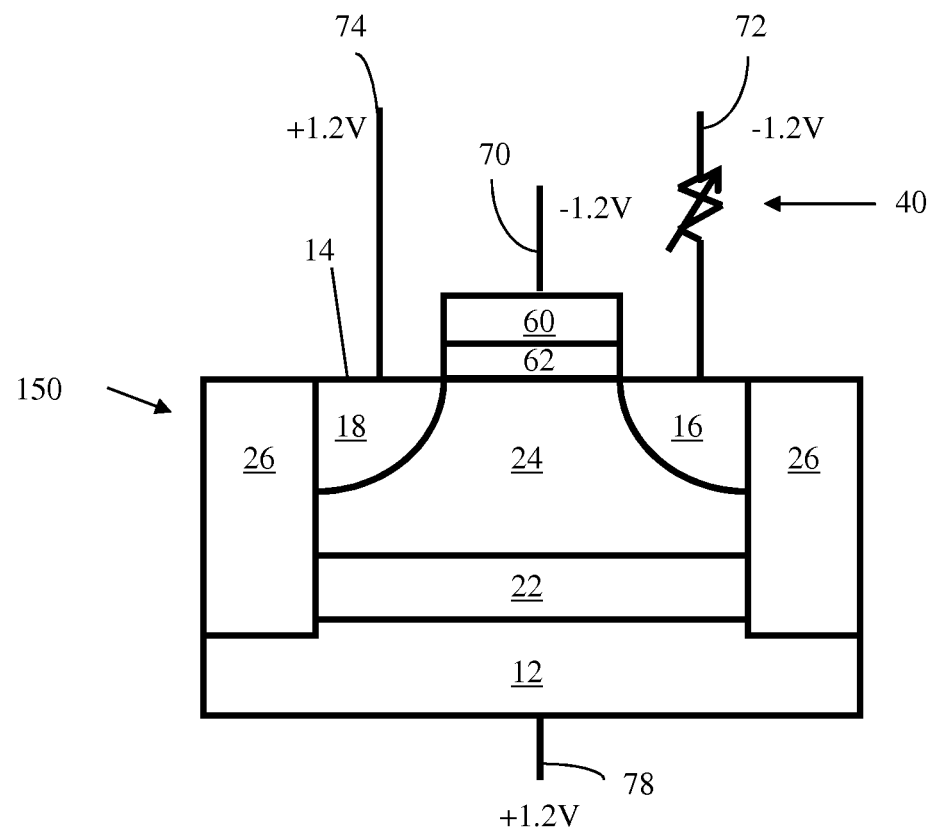
FIG. 50 illustrates exemplary bias conditions applied to the terminals of an exemplary selected memory cell from the array of FIG. 49.

When power is restored to cell 150, the state of the cell 150 as stored on the non-volatile resistance change memory 40 is restored into floating body region 24. The restore operation (data restoration from non-volatile memory to volatile memory) is described with reference to FIGS. 49 and 50. In one embodiment, to perform the restore operation, a negative voltage is applied to the WL terminal 70, a positive voltage is applied to the BL terminal 74, a negative voltage is applied to the SL terminal 72, and zero or a positive voltage is applied to the substrate terminal 78.

These conditions will result in band-to-band tunneling hole injection into the floating body 24. However, if the resistance change memory is in a low resistivity state, the negative voltage applied to the SL terminal 72 will evacuate holes in the floating body 24 because the p-n junction formed by the floating body 24 and the source line region 16 is forward-biased. Consequently, the volatile memory state of memory cell 150 will be restored to a logic-0 state upon completion of the restore operation, restoring the state that the memory cell 150 held prior to the shadowing operation.

If the resistance change memory 40 is in a high resistivity state, a larger voltage drop will develop across the resistance change memory 40 and no (or low) current flows through the resistance change memory 40, hence the holes accumulated in the floating body 24 will not be evacuated. As a result, the memory logic-1 state that the memory cell 150 held prior to the shadowing operation will be restored.

In one particular non-limiting example of this embodiment, about −1.2 volts is applied to the SL terminal 72, about +1.2 volts is applied to BL terminal 74, about −1.2 volts is applied to WL terminal 70, about 0.0 volts or +1.2 volts is applied to the substrate terminal 78. However, these voltage levels may vary, while maintaining the relative relationships between the charges applied, as described above.

Note that this process occurs non-algorithmically, as the state of the non-volatile resistance change memory 40 does not have to be read, interpreted, or otherwise measured to determine what state to restore the floating body 24 to. Rather, the restoration process occurs automatically, driven by resistivity state differences. Accordingly, this process is orders of magnitude faster than one that requires algorithmic intervention. In addition, no control circuitry, such as a memory controller, is required between the volatile memory component and the non-volatile memory component, allowing for a close proximity between the floating body transistor 20 and the resistance change element 40, as shown in FIGS. 43 and 44A.

After restoring the memory cell(s) 150, the resistance change memory(ies) 40 is/are reset to a predetermined state, e.g., a low resistivity state, so that each resistance change memory 40 has a known state prior to performing another shadowing operation.

Figure 51:
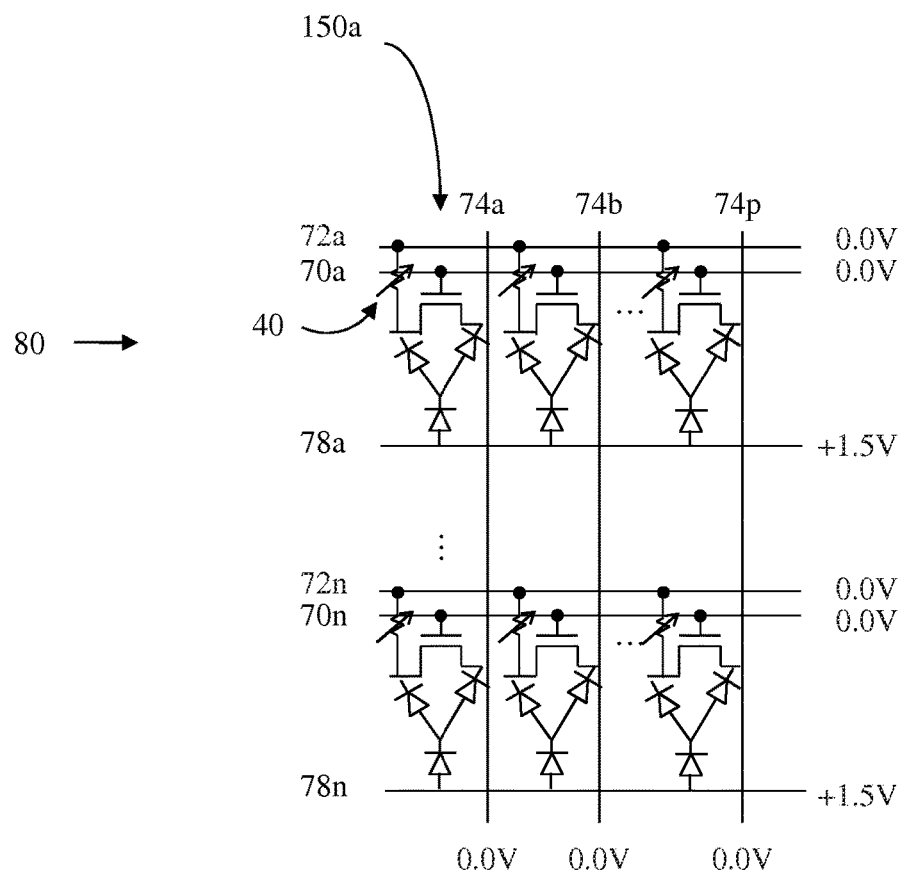
FIG. 51 is a schematic illustration showing exemplary bias conditions applied for a reset operation performed on a memory array according to an embodiment of the present invention.
Figure 52:
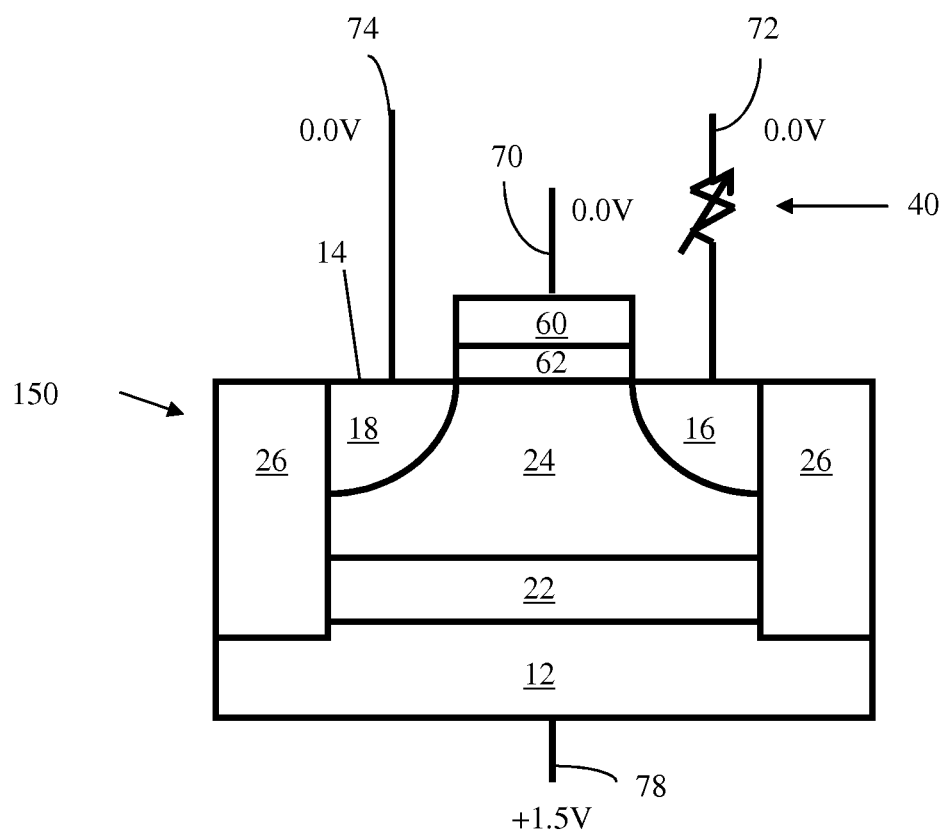
FIG. 52 illustrates exemplary bias conditions applied to the terminals of an exemplary selected memory cell from the array of FIG. 51.

FIGS. 51 and 52 illustrate a reset operation performed on a memory array 80 and a memory cell 150, respectively. To perform a reset operation, a positive voltage is applied to the substrate terminal 78, zero voltage is applied to the SL terminal 72, zero voltage is applied to the BL terminal 74, and zero voltage is applied to the WL terminal 70. The positive voltage applied to the substrate terminal 78 during reset operation is greater than the positive voltage applied to the substrate terminal 78 during holding operation and the resulting current that flows from the substrate terminal 78 to the SL terminal 72 may be less than the current flowing during shadowing operation. When the memory cell 150 is in a volatile logic-1 state (i.e. having a positively charged floating body 24), the SCR device 30b will be turned on. The positive voltage applied to the substrate terminal 78 is controlled such that the electrical current flowing through the resistance change memory 40 is sufficient to change the resistivity of the materials from a high resistivity state to a low resistivity state. For phase change materials, the crystalline state changes from an amorphous phase to a crystalline phase, while in metal oxide systems, this may involve the formation of conductive filaments. Accordingly, the non-volatile resistance change material element 40 will be in a low resistivity state when the volatile memory of cell 150 is in a logic-1 state.

When the floating body 24 is neutral or only slightly positive (for example, when the potential of the floating body region is less than 0.3V), the SCR device 30b will be turned off. Therefore, no (or low) electrical current flows through the resistance change memory element 40 and it will retain its low resistivity state. Accordingly, the non-volatile resistance change memory element 40 will be in a low resistivity state when the volatile memory of cell 150 is in a logic-0 state.

In one particular non-limiting example of this embodiment, about +1.5 volts is applied to the substrate terminal 78, about 0.0 volts is applied to the WL terminal 70, BL terminal 74, and SL terminal 72 so that about 400 µA current flows between substrate terminal 78 and SL terminal 72.

Figure 53:
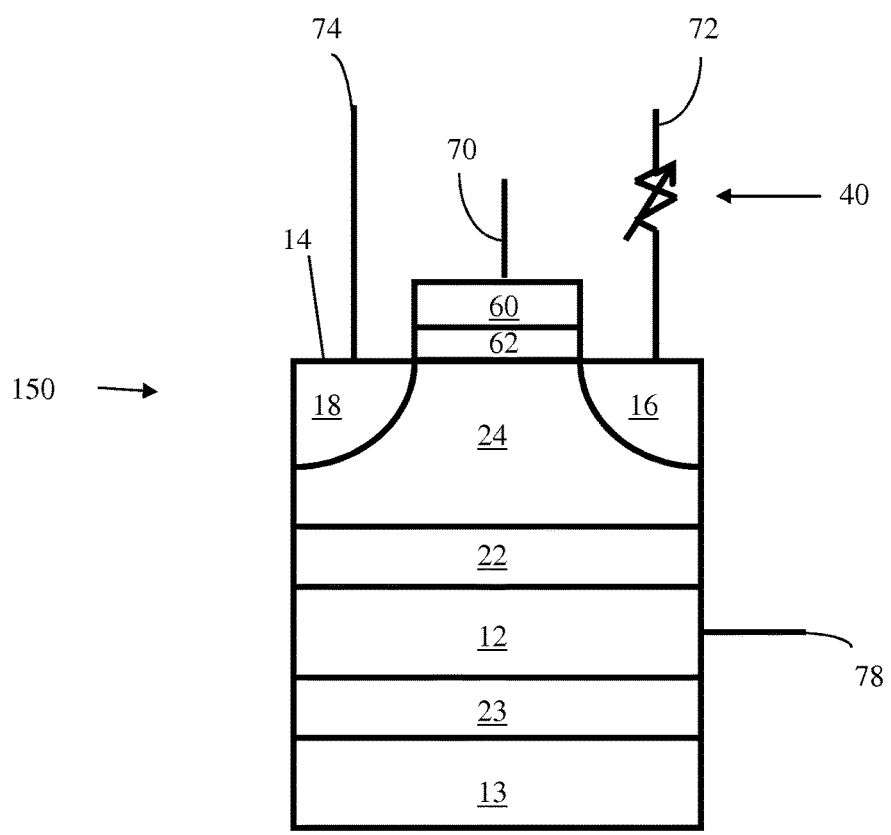
FIG. 53 is a cross-sectional, schematic illustration of a memory cell fabricated on a silicon-on-insulator (SOI) substrate according to another embodiment of the present invention.

Memory cell 150 may alternatively be fabricated on a silicon-on-insulator (SOI) substrate 13 as illustrated in FIG. 53, where a buried insulator 23, an illustrative, non-exclusive example of which includes a buried oxide layer, bounds the substrate 12 at the bottom.

Figure 54A:
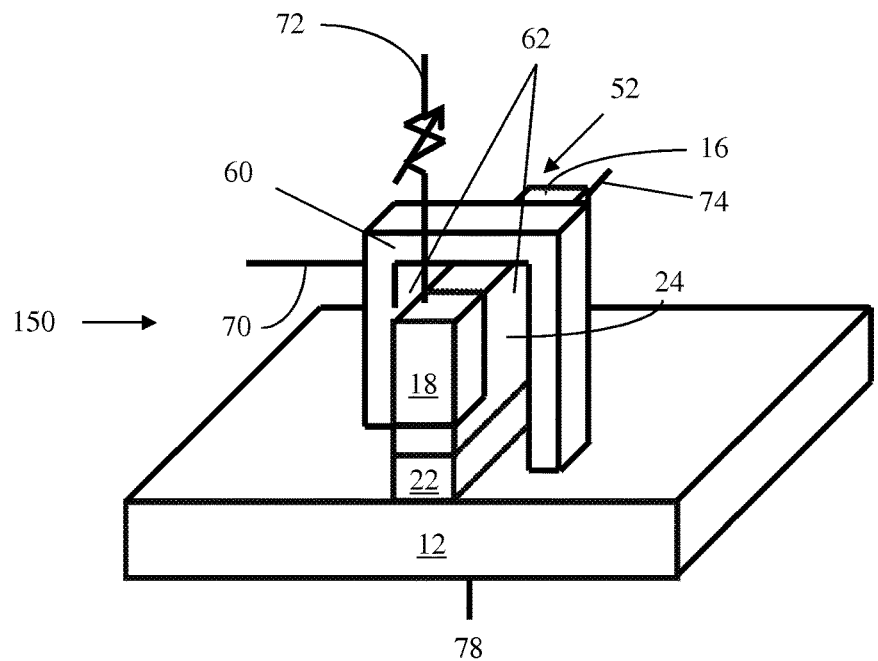
FIGS. 54A and 54B illustrate cross-sectional and top view schematic illustrations of a fin-type memory cell device according to another embodiment of the present invention, respectively.
Figure 54B:
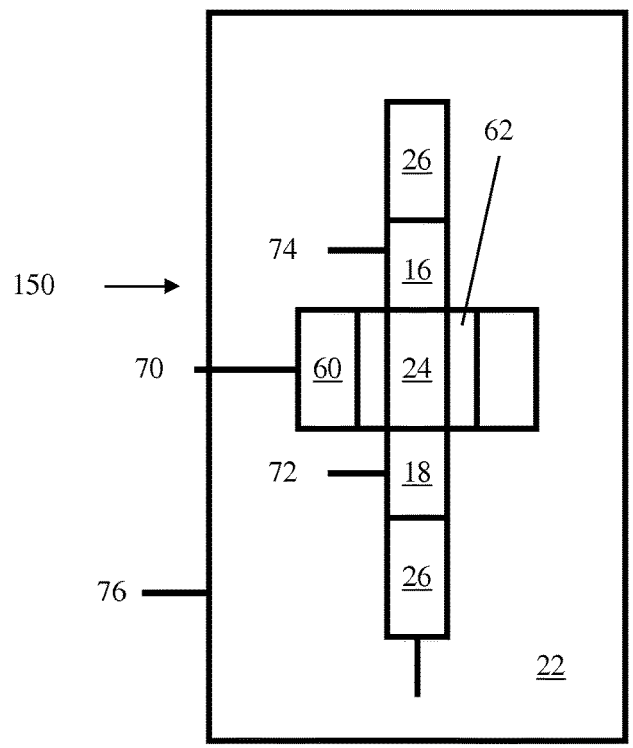

In addition, memory cell 150 may alternatively comprise a three-dimensional structure as shown in FIGS. 54A and 54B, where the memory cell 150 comprise a fin structure 52, extending substantially perpendicular to, and above the top surface of the substrate 12/buried insulator 23.

Figure 55:
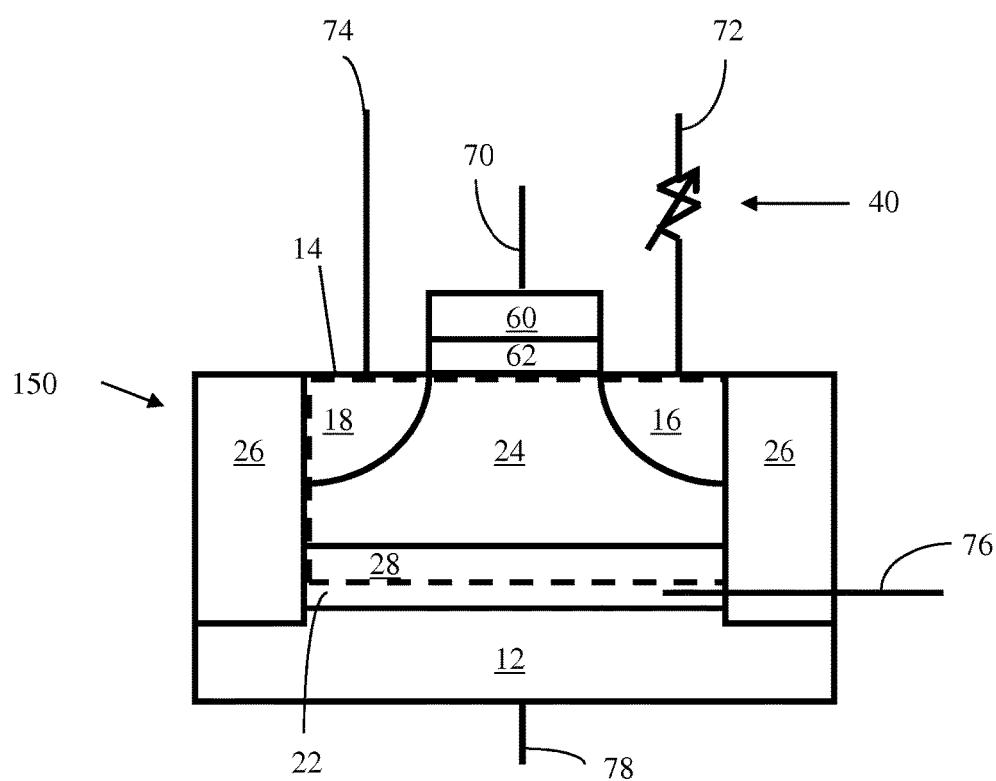
FIG. 55 is a cross-sectional, schematic illustration of a memory cell according to another embodiment of the present invention.

In another alternative embodiment, memory cell 150 may be insulated from neighboring memory cells 150 by an insulating layer 26 and a shallower insulating layer 28, as shown in FIG. 55, where the shallower insulating layer 28 is shown in dashed lines. The shallower insulating layer 28 insulates the floating body region 24, but allows the buried layer 22 to be continuous in the perpendicular direction of the cross-sectional view shown in FIG. 55. Since the buried layer 22 of memory cells 150 is continuous in one direction, but is insulated in the other perpendicular direction (by the insulating layer 26), buried layer 22 may be connected to a terminal or an addressable line and used in memory cell access selection and define a row (or column) direction. Memory cell 150 may then operate in volatile mode independent of the resistivity state of the resistance change memory 40. The volatile mode operation of memory cell 150 will be similar to the half-transistor floating body memory cell, defined by the gate 60, bit line region 18, buried well region 22, as described for example in U.S. application Ser. No. 12/897,538, "A Semiconductor Memory Device Having an Electrically Floating Body Transistor" ("Widjaja-4"), and in U.S. application Ser. No. 12/897,516, "A Semiconductor Memory Device Having an Electrically Floating Body Transistor" ("Widjaja-5), both of which are hereby incorporated herein, in their entireties, by reference thereto.

In another alternative embodiment, the initial state of the resistance change memory element 40 may be in a high resistivity state. In this embodiment, due to the a high resistance memory element 40 electrically connected to the SL terminal 72, the volatile operation of memory cell 150 may employ the silicon controlled rectifier (SCR) principle as described, for example, in Widjaja-2. The volatile operation of memory cell 150 will utilize WL terminal 70, BL terminal 74, and substrate terminal 78. Alternatively, the volatile mode operation of memory cell 150 will be similar to the half-transistor floating body memory cell, defined by the gate 60, bit line region 18, buried well region 22, as described for example in U.S. application Ser. No. 12/897,538, "A Semiconductor Memory Device Having an Electrically Floating Body Transistor" ("Widjaja-4"), and in U.S. application Ser. No. 12/897,516, "A Semiconductor Memory Device Having an Electrically Floating Body Transistor" ("Widjaja-5), which are hereby incorporated herein, in their entireties, by reference thereto.

To perform a shadowing operation, a positive voltage is applied to the substrate terminal 78, zero voltage is applied to the SL terminal 72, zero voltage is applied to the BL terminal 74, and zero voltage is applied to the WL terminal 70. The positive voltage applied to the substrate terminal 78 during a shadowing operation is greater than the positive voltage applied to the substrate terminal 78 during a holding operation. When the memory cell 150 is in a volatile logic-1 state (i.e. having a positively charged floating body 24), the SCR device 30b will be turned on. The positive voltage applied to the substrate terminal 78 is controlled such that the electrical current flowing through the resistance change memory 40 is sufficient to change the resistivity of the materials from a high resistivity state to a low resistivity state. For phase change materials, the crystalline state changes from an amorphous phase to a crystalline phase, while in metal oxide systems, this may involve the formation of conductive filaments. Accordingly, the non-volatile resistance change material element 40 will be in a low resistivity state when the volatile memory of cell 150 is in a logic-1 state.

When the floating body 24 is neutral or only slightly positive (for example, when the potential of the floating body region is less than 0.3V), the SCR device 30b will be turned off. Therefore, no (or low) electrical current flows through the resistance change memory element 40 and it will retain its high resistivity state. Accordingly, the non-volatile resistance change memory element 40 will be in a high resistivity state when the volatile memory of cell 150 is in a logic-0 state.

In one particular non-limiting example of this embodiment, about +1.5 volts is applied to the substrate terminal 78, about 0.0 volts is applied to the WL terminal 70, BL terminal 74, and SL terminal 72 so that about 400 µA current flows between substrate terminal 78 and SL terminal 72.

Note that this process occurs non-algorithmically, as the state of the floating body 24 does not have to be read, interpreted, or otherwise measured to determine what state to write the non-volatile resistance change memory 40 to. Rather, the shadowing process occurs automatically, driven by electrical potential differences. Accordingly, this process is orders of magnitude faster than one that requires algorithmic intervention.

A restore operation may be performed using a band-to-band tunneling operation by applying the following bias condition: a negative voltage is applied to the WL terminal 70, a positive voltage is applied to the SL terminal 72, zero voltage is applied to the BL terminal 74, zero or positive voltage is applied to the substrate terminal 78.

If resistance change memory element 40 is in a low resistivity state, these conditions will result in result in band-to-band tunneling hole injection into the floating body 24. However, if the resistance change memory is in a high resistivity state, the SL terminal 72 may act as an open circuit, and as a result, the electric field in the source line region 16 near the gate 60 is not sufficient to generate holes through band-to-band tunneling mechanism.

In one particular non-limiting example of this embodiment, about −1.2 volts is applied to the WL terminal 70, about +1.2 volts is applied to SL terminal 72, about 0.0 volts is applied to BL terminal 74, about 0.0 volts or +1.2 volts is applied to substrate terminal 78.

Note that this process occurs non-algorithmically, as the state of the floating body 24 does not have to be read, interpreted, or otherwise measured to determine what state to write the non-volatile resistance change memory 40 to. Rather, the restore process occurs automatically, driven by electrical potential differences. Accordingly, this process is orders of magnitude faster than one that requires algorithmic intervention.

To perform a reset operation, a positive voltage is applied to the substrate terminal 78, zero voltage is applied to the SL terminal 72, zero voltage is applied to the BL terminal 74, and zero voltage is applied to the WL terminal 70. The positive voltage applied to the substrate terminal 78 during reset operation is greater than the positive voltage applied to the substrate terminal 78 during holding a operation and the resulting current that flows from the substrate terminal 78 to the SL terminal 72 may be greater than the current flowing during a shadowing operation. When the memory cell 150 is in a volatile logic-1 state (i.e. having a positively charged floating body 24), the SCR device 30b will be turned on. The positive voltage applied to the substrate terminal 78 is controlled such that the electrical current flowing through the resistance change memory 40 is sufficient to change the resistivity of the materials from a low resistivity state to a high resistivity state. For phase change materials, the crystalline state changes from a crystalline phase to an amorphous phase, while in metal oxide systems, this may involve the rupture of conductive filaments. Accordingly, the non-volatile resistance change material element 40 will be in a high resistivity state when the volatile memory of cell 150 is in a logic-1 state.

When the floating body 24 is neutral or only slightly positive (for example, when the potential of the floating body region is less than 0.3V), the SCR device 30b will be turned off. Therefore, no electric current flows through the resistance change memory element 40 and it will retain its high resistivity state. Accordingly, the non-volatile resistance change memory element 40 will be in a high resistivity state when the volatile memory of cell 150 is in a logic-0 state.

In one particular non-limiting example of this embodiment, about +2.0 volts is applied to the substrate terminal 78, about 0.0 volts is applied to the WL terminal 70, BL terminal 74, and SL terminal 72 so that about 700 µA current flows between substrate terminal 78 and SL terminal 72.

Note that this process occurs non-algorithmically, as the state of the floating body 24 does not have to be read, interpreted, or otherwise measured to determine what state to write the non-volatile resistance change memory 40 to. Rather, the shadowing process occurs automatically, driven by electrical potential differences. Accordingly, this process is orders of magnitude faster than one that requires algorithmic intervention.

The integrated circuit device 90 may also comprise of a counter circuit 82, which may determine if a memory cell 150 (or a group of memory cells 150, the group may comprise of for example a row of memory cells 150 or a few rows of memory cells 150) is in volatile mode operation and has not been accessed for a certain period of time, for example, one second, although another predetermined time period may be used alternatively. Once the memory cell 150 is idle for greater than an elapsed time threshold (i.e., predetermined time period), the memory cell 150 (or a group of memory cells 150) may be put into the non-volatile state through the shadowing operation. Since memory cell 150 does not require power to maintain its states, this operation may allow for a lower operating power of the integrated circuit device 90.

Memory cells 50 and 150 can also be configured to store only volatile data or only non-volatile data (where the non-volatile data is not determined by the state of the volatile memory) in addition to having both volatile and non-volatile functionality as has been described. Thus, memory array 80 or 81 may comprise segments of memory cells 50 or 150 configured to store only volatile data and segments of memory cells 50 or 150 configured to store only non-volatile data, for example as described in "Resistive-Memory Embedded Unified RAM (R-URAM)", S. Kim et al., pp. 2670-2674, IEEE Transactions on Electron Devices, vol. 56, no. 11, December 2009, which is hereby incorporated herein, in its entirety, by reference thereto, where a unipolar resistive memory element $Al_2O_3$ is connected to the gate of a capacitorless DRAM. In embodiments where segments of memory cells 50 or 150 configured to store only volatile data or only non-volatile data, array 80 or 81 may or may not further include one or more segments of memory cells configured to store volatile memory and non-volatile memory in a manner as described.

From the foregoing it can be seen that with the present invention, a semiconductor memory with both volatile and non-volatile functionality is achieved. While the foregoing written description of the invention enables one of ordinary skill to make and use what is considered presently to be the best mode thereof, those of ordinary skill will understand and appreciate the existence of variations, combinations, and That which is claimed is:

1. A semiconductor memory array comprising:
a plurality of memory cells arranged in a matrix of rows and columns, wherein at least two of said memory cells each include:
a floating body region;
a non-volatile memory comprising a bipolar resistive change element;
wherein said floating body region is configured to be charged to a level indicative of a state of the memory cell based on resistivity of said bipolar resistive change element, upon restoration of power to said memory cell;
wherein said array is configured to perform a restore operation on said at least two of said memory cells in parallel.

2. The semiconductor memory array of claim 1, wherein said memory cell functions as volatile memory upon said restoration of power to said memory cell.

3. The semiconductor memory array of claim 1, wherein said floating body region is configured to a predetermined state prior to being charged based on resistivity of said bipolar resistive change element.

4. The semiconductor memory array of claim 1, wherein said bipolar resistive change element is configured to a predetermined resistivity after said floating body region is charged to a level based on resistivity of said bipolar resistive change element.

5. The semiconductor memory array of claim 1, further comprising a first region in electrical contact with said floating body region and a second region spaced apart from said first region and in electrical contact with said floating body region.

6. The semiconductor memory array of claim 1, wherein said bipolar resistive change element comprises a material selected from at least one of: transition metal oxide materials, ferroelectric materials and ferromagnetic materials.

7. The semiconductor memory array of claim 1, wherein said bipolar resistive change element is electrically connected to said floating body region and a distance between said bipolar resistive change element and said bipolar device, when electrically connected, is in the range from about 90 nm to 1 µm.

8. The semiconductor memory array of claim 1, further comprising an addressable line electrically connected to said bipolar resistive change element.

9. The semiconductor memory array of claim 8, wherein said bipolar resistive change element further comprises a conductive material element interconnecting said addressable line and said bipolar resistive change material.

10. The semiconductor memory array of claim 1 comprising a three-dimensional structure comprising a fin structure comprising said floating body region, extending substantially perpendicular to, and above a top surface of a substrate.

11. An integrated circuit comprising:
a plurality of memory cells arranged in a matrix of rows and columns, wherein at least two of said memory cells each include:
a floating body region;
a non-volatile memory comprising a bipolar resistive change element;
wherein said floating body region is configured to be charged to a level indicative of a state of the memory cell based on resistivity of said bipolar resistive change element, upon restoration of power to said memory cell; and
a circuit configured to perform a restore operation on said at least two of said memory cells in parallel.

12. The integrated circuit of claim 11, wherein said memory cell functions as volatile memory upon said restoration of power to said memory cell.

13. The integrated circuit of claim 11, wherein said floating body region is configured to a predetermined state prior to being charged based on resistivity of said bipolar resistive change element.

14. The integrated circuit of claim 11, wherein said bipolar resistive change element is configured to a predetermined resistivity after said floating body region is charged to a level based on resistivity of said bipolar resistive change element.

15. The integrated circuit of claim 11, further comprising a first region in electrical contact with said floating body region and a second region spaced apart from said first region and in electrical contact with said floating body region.

16. The integrated circuit of claim 11, wherein said bipolar resistive change element comprises a material selected from at least one of: transition metal oxide materials, ferroelectric materials and ferromagnetic materials.

17. The integrated circuit of claim 11, wherein said bipolar resistive change element is electrically connected to said floating body region and a distance between said bipolar resistive change element and said bipolar device, when electrically connected, is in the range from about 90 nm to 1 µm.

18. The integrated circuit of claim 11, further comprising an addressable line electrically connected to said bipolar resistive change element.

19. The integrated circuit of claim 18, wherein said bipolar resistive change element further comprises a conductive material element interconnecting said addressable line and said bipolar resistive change material.

20. The integrated circuit of claim 11 comprising a three-dimensional structure comprising a fin structure comprising said floating body region, extending substantially perpendicular to, and above a top surface of a substrate.

* * * * *